US012653067B2

(12) United States Patent
Surthi

(10) Patent No.: US 12,653,067 B2
(45) Date of Patent: Jun. 9, 2026

(54) MEMORY ARRAY STRUCTURES

(71) Applicant: MICRON TECHNOLOGY, INC., Boise, ID (US)

(72) Inventor: Shyam Surthi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 825 days.

(21) Appl. No.: 17/961,025

(22) Filed: Oct. 6, 2022

(65) Prior Publication Data

US 2024/0071966 A1    Feb. 29, 2024

Related U.S. Application Data

(60) Provisional application No. 63/402,488, filed on Aug. 31, 2022.

(51) Int. Cl.
H10W 90/00    (2026.01)
H10W 80/00    (2026.01)

(52) U.S. Cl.
CPC .......... H10W 90/00 (2026.01); H10W 80/312 (2026.01); H10W 80/327 (2026.01); H10W 90/792 (2026.01)

(58) Field of Classification Search
CPC ........... H01L 21/7682; H01L 21/76837; H01L 21/76897; H01L 2224/08145; H01L 2224/80895; H01L 2224/80896; H01L 24/08; H01L 24/80; H01L 25/0657; H01L 25/18; H01L 25/50; H01L 2924/1431; H01L 2924/14511; H10B 43/10; H10B 43/27
See application file for complete search history.

(56) References Cited

U.S. PATENT DOCUMENTS

| | | | | |
|---|---|---|---|---|
| 8,530,874 B1 * | 9/2013 | Varesi | ............... | H10N 70/8413 |
| | | | | 438/102 |
| 11,437,521 B2 * | 9/2022 | Sills | .................... | H10D 30/6755 |
| 11,437,571 B2 * | 9/2022 | Kim | ........................ | H10B 63/84 |
| 11,456,208 B2 * | 9/2022 | Gupta | .................... | H10B 43/27 |
| 12,080,356 B2 * | 9/2024 | Fukuzumi | .............. | G11C 16/26 |
| 2013/0015421 A1 * | 1/2013 | Sim | .................... | H10N 70/8828 |
| | | | | 257/E47.001 |
| 2015/0123280 A1 * | 5/2015 | Surthi | ................. | H01L 23/5222 |
| | | | | 438/533 |
| 2018/0205017 A1 * | 7/2018 | Bruce | .................... | H10B 63/84 |
| 2019/0385681 A1 * | 12/2019 | Yun | ........................ | G11C 16/16 |
| 2021/0398996 A1 | 12/2021 | Parekh | | |
| 2022/0051930 A1 * | 2/2022 | Gupta | .............. | H01L 21/76816 |
| 2022/0180938 A1 * | 6/2022 | Fukuzumi | .............. | H10B 41/27 |
| 2022/0383960 A1 * | 12/2022 | Fukuzumi | .............. | G11C 16/26 |
| 2023/0106571 A1 * | 4/2023 | Shen | ........................ | G11C 8/14 |
| | | | | 257/314 |

* cited by examiner

*Primary Examiner* — Telly D Green
(74) *Attorney, Agent, or Firm* — Dicke, Billig & Czaja, PLLC

(57) ABSTRACT

Memory array structures might include a first data line selectively connected to a first plurality of memory cells, a second data line selectively connected to a second plurality of memory cells, a solid first dielectric extending between a first portion of the first data line and a first portion of the second data line, a second dielectric containing a void extending between a second portion of the first data line and a second portion of the second data line, and a top contact overlying and in contact with the first portion of the first data line.

22 Claims, 41 Drawing Sheets

396

382

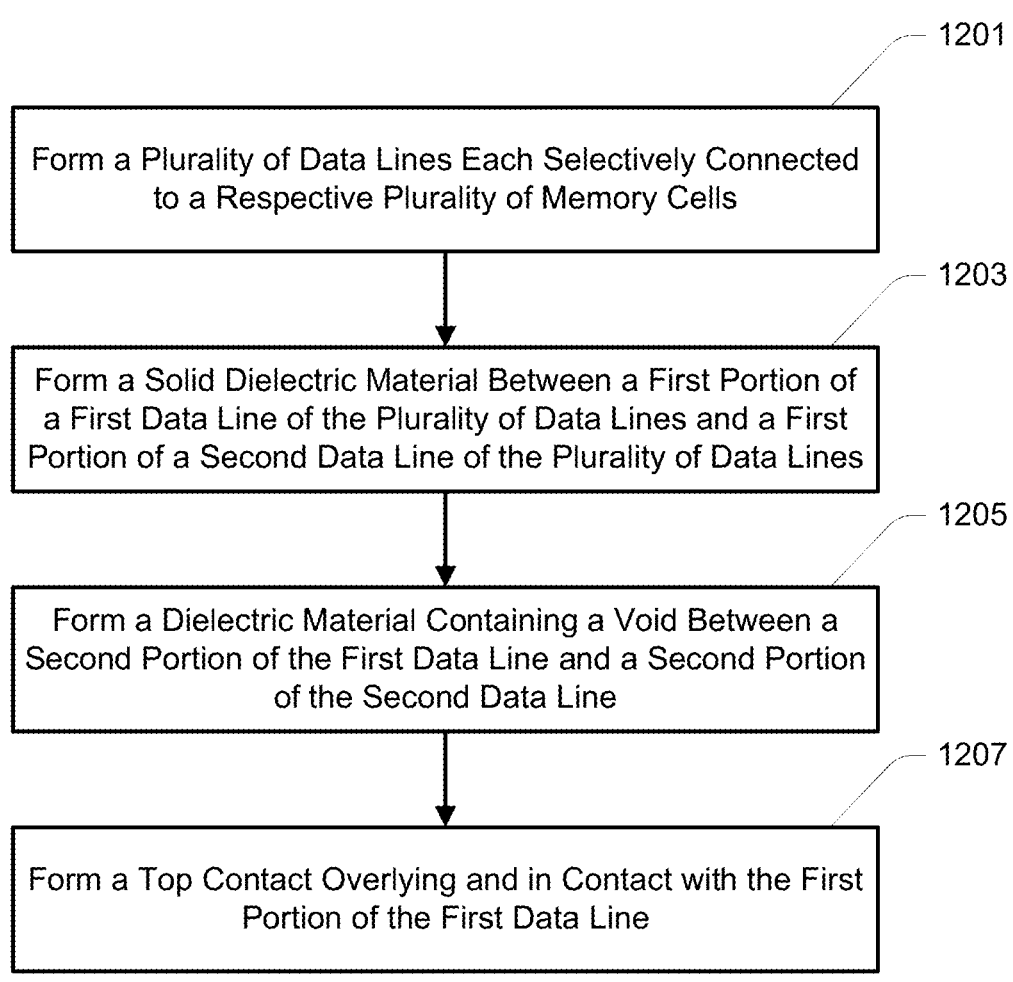

1201

Form a Plurality of Data Lines Each Selectively Connected to a Respective Plurality of Memory Cells

1203

Form a Solid Dielectric Material Between a First Portion of a First Data Line of the Plurality of Data Lines and a First Portion of a Second Data Line of the Plurality of Data Lines

1205

Form a Dielectric Material Containing a Void Between a Second Portion of the First Data Line and a Second Portion of the Second Data Line

1207

Form a Top Contact Overlying and in Contact with the First Portion of the First Data Line

FIG. 12

MEMORY ARRAY STRUCTURES

RELATED APPLICATION

This application claims the benefit of U.S. Provisional Application No. 63/402,488, filed on Aug. 31, 2022, hereby incorporated herein in its entirety by reference.

TECHNICAL FIELD

The present disclosure relates generally to integrated circuits, and, in particular, in one or more embodiments, the present disclosure relates to memory array structures and methods of their fabrication, as well as apparatus containing such memory array structures.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor might be connected to a source, while each drain select transistor might be connected to a data line, such as column bit line. Variations using more than one select gate between a string of memory cells and the source, and/or between the string of memory cells and the data line, are known.

In programming memory, memory cells might be programmed as what are often termed single-level cells (SLC). SLC might use a single memory cell to represent one digit (e.g., one bit) of data. For example, in SLC, a Vt of 2.5V or higher might indicate a programmed memory cell (e.g., representing a logical 0) while a Vt of −0.5V or lower might indicate an erased memory cell (e.g., representing a logical 1). Such memory might achieve higher levels of storage capacity by including multi-level cells (MLC), triple-level cells (TLC), quad-level cells (QLC), etc., or combinations thereof in which the memory cell has multiple levels that enable more digits of data to be stored in each memory cell. For example, MLC might be configured to store two digits of data per memory cell represented by four Vt ranges, TLC might be configured to store three digits of data per memory cell represented by eight Vt ranges, QLC might be configured to store four digits of data per memory cell represented by sixteen Vt ranges, and so on.

BRIEF DESCRIPTION OF THE DRAWINGS

FIG. 12 is a flowchart of a method of fabricating a memory array structure in accordance with an embodiment.

DETAILED DESCRIPTION

Figure 1:
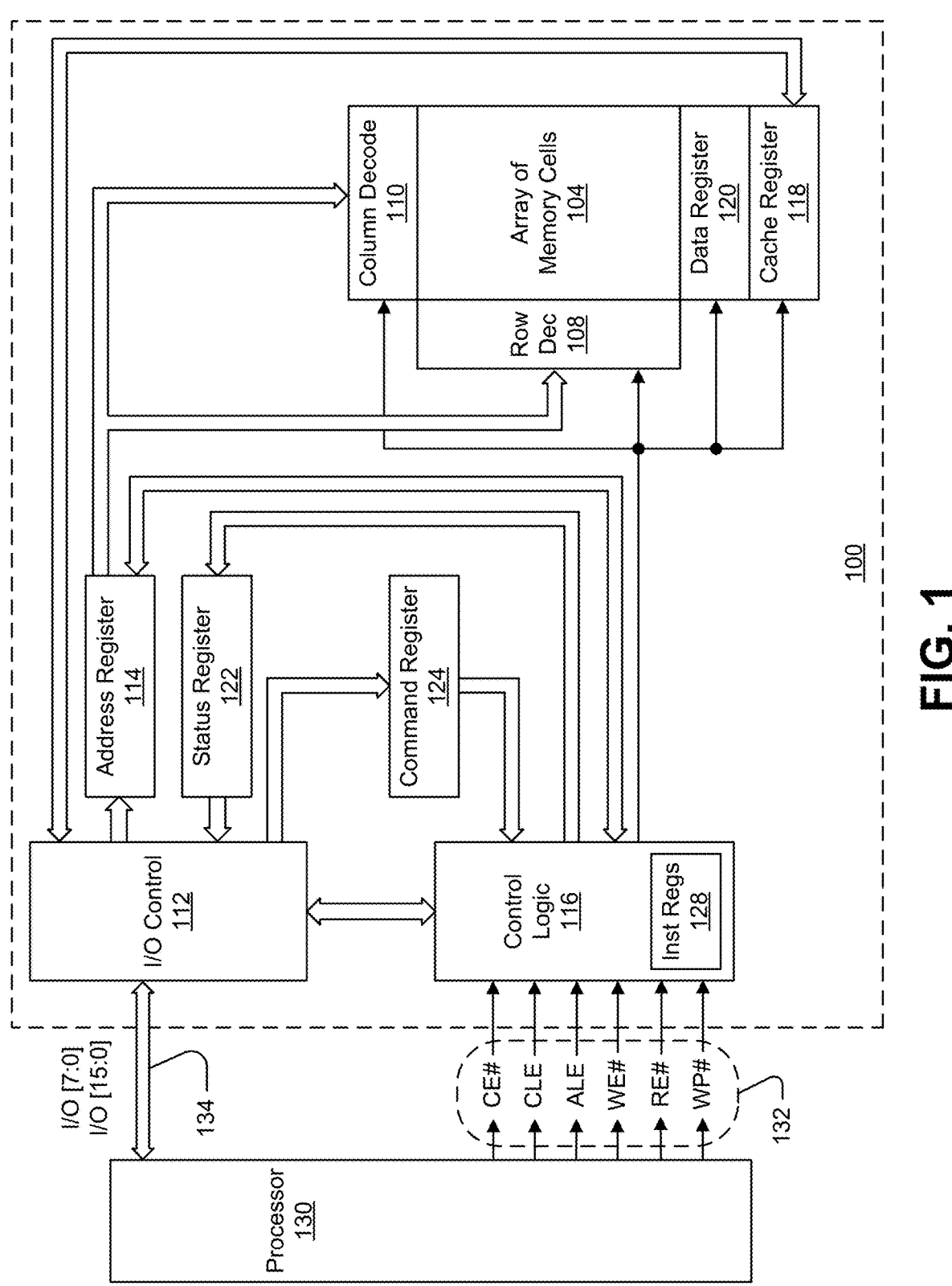
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments might be utilized and structural, logical and electrical changes might be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps might have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting by an electrically conductive path unless otherwise apparent from the context.

It is recognized herein that even where values might be intended to be equal, variabilities and accuracies of industrial processing and operation might lead to differences from their intended values. These variabilities and accuracies will generally be dependent upon the technology utilized in fabrication and operation of the integrated circuit device. As such, if values are intended to be equal, those values are deemed to be equal regardless of their resulting values.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, might be a memory controller or other external host device.

Memory device 100 includes an array of memory cells 104 that might be logically arranged in rows and columns. Memory cells of a logical row are typically connected to the same access line (commonly referred to as a word line) while memory cells of a logical column are typically selectively connected to the same data line (commonly referred to as a bit line). A single access line might be associated with more than one logical row of memory cells and a single data line might be associated with more than one logical column. Memory cells (not shown in FIG. 1) of at least a portion of array of memory cells 104 are capable of being programmed to one of at least two target data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and might generate status information for the external processor 130, i.e., control logic 116 is configured to perform array operations (e.g., sensing operations [which might include read operations and verify operations], programming operations and/or erase operations) on the array of memory cells 104. The control logic 116 is in communication with row decode circuitry 108 and column decode circuitry 110 to control the row decode circuitry 108 and column decode circuitry 110 in response to the addresses. The control logic 116 might include instruction registers 128 which might represent computer-usable memory for storing computer-readable instructions. For some embodiments, the instruction registers 128 might represent firmware. Alternatively, the instruction registers 128 might represent a grouping of memory cells, e.g., reserved block(s) of memory cells, of the array of memory cells 104.

Control logic 116 might also be in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data might be passed from the cache register 118 to the data register 120 for transfer to the array of memory cells 104, then new data might be latched in the cache register 118 from the I/O control circuitry 112. During a read operation, data might be passed from the cache register 118 to the I/O control circuitry 112 for output to the external processor 130, then new data might be passed from the data register 120 to the cache register 118. The cache register 118 and/or the data register 120 might form (e.g., might form a portion of) a page buffer of the memory device 100. A data register 120 might further include sense circuits (not shown in FIG. 1) to sense a data state of a memory cell of the array of memory cells 104, e.g., by sensing a state of a data line connected to that memory cell. A status register 122 might be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) might be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands might be received over input/output (I/O) pins [7:0] of I/O bus 134 at I/O control circuitry 112 and might then be written into command register 124. The addresses might be received over input/output (I/O) pins [7:0] of I/O bus 134 at I/O control circuitry 112 and might then be written into address register 114. The data might be received over input/output (I/O) pins [7:0] for an 8-bit device or input/output (I/O) pins [15:0] for a 16-bit device at I/O control circuitry 112 and then might be written into cache register 118. The data might be subsequently written into data register 120 for programming the array of memory cells 104. For another embodiment, cache register

118 might be omitted, and the data might be written directly into data register 120. Data might also be output over input/output (I/O) pins [7:0] for an 8-bit device or input/output (I/O) pins [15:0] for a 16-bit device. Although reference might be made to I/O pins, they might include any conductive nodes providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 might not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) might be used in the various embodiments.

Figure 2A:
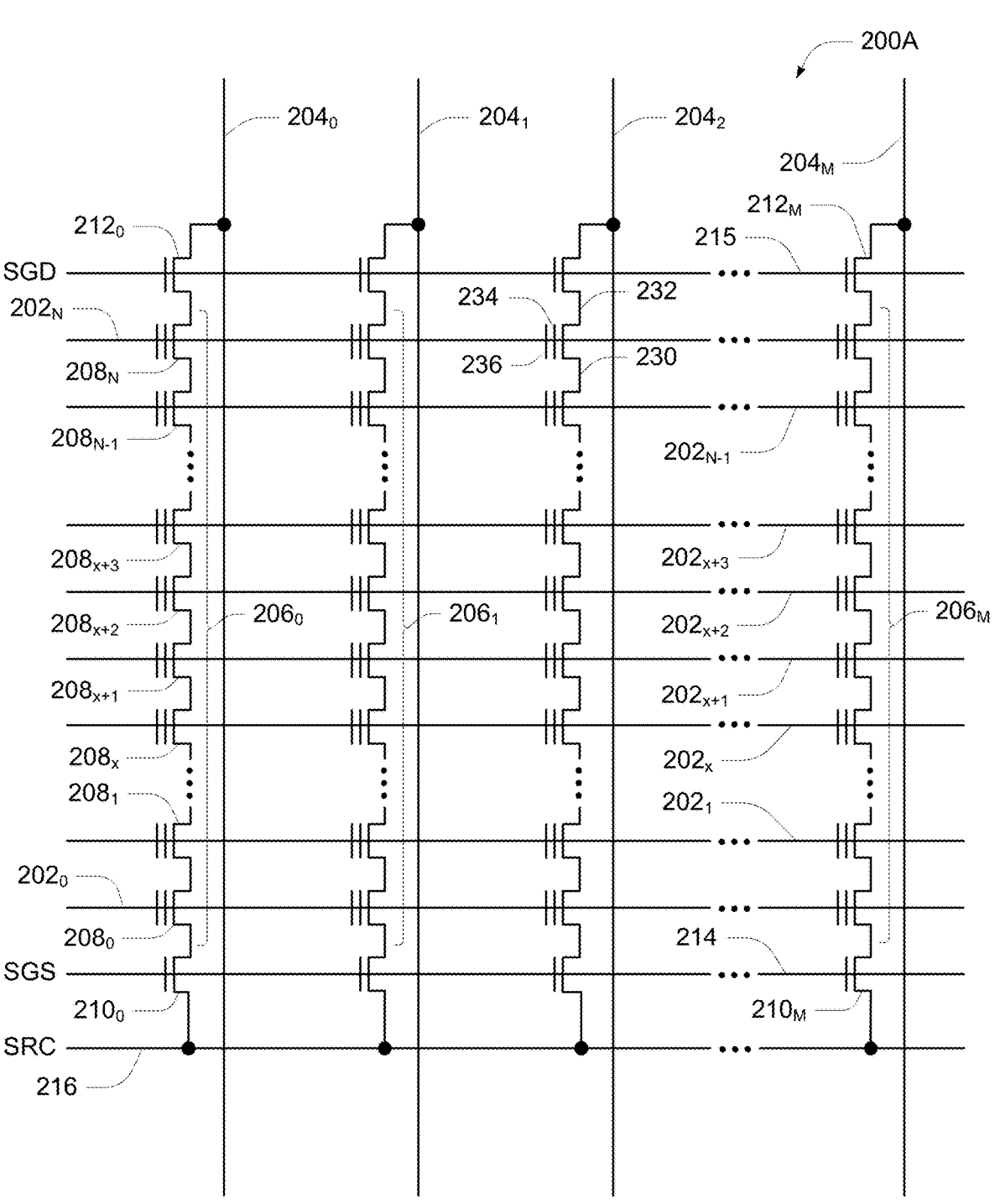
FIGS. 2A-2C are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines (e.g., word lines) $202_0$ to $202_N$, and data lines (e.g., bit lines) $204_0$ to $204_M$. The access lines 202 might be connected to global access lines (e.g., global word lines), not shown in FIG. 2A, in a many-to-one relationship. For some embodiments, memory array 200A might be formed over a semiconductor that, for example, might be conductively doped to have a conductivity type, such as a p-type conductivity, e.g., to form a p-well, or an n-type conductivity, e.g., to form an n-well.

Memory array 200A might be arranged in rows (each corresponding to an access line 202) and columns (each corresponding to a data line 204). Each column might include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 might represent non-volatile memory cells for storage of data. The memory cells $208_0$ to $208_N$ might include memory cells intended for storage of data, and might further include other memory cells not intended for storage of data, e.g., dummy memory cells. Dummy memory cells are typically not accessible to a user of the memory, and are instead typically incorporated into the string of series-connected memory cells for operational advantages that are well understood.

The memory cells 208 of each NAND string 206 might be connected in series between a select gate 210 (e.g., a field-effect transistor), such as one of the select gates $210_0$ to $210_M$ (e.g., that might be source select transistors, commonly referred to as select gate source), and a select gate 212 (e.g., a field-effect transistor), such as one of the select gates $212_0$ to $212_M$ (e.g., that might be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 might utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the data line 204 for the corresponding NAND string 206. For example, the drain of select gate $212_0$ might be connected to the data line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding data line 204. A control gate of each select gate 212 might be connected to select line 215.

The memory array in FIG. 2A might be a quasi-two-dimensional memory array and might have a generally planar structure, e.g., where the common source 216, NAND strings 206 and data lines 204 extend in substantially parallel planes. Alternatively, the memory array in FIG. 2A might be a three-dimensional memory array, e.g., where NAND strings 206 might extend substantially perpendicular to a plane containing the common source 216 and to a plane containing the data lines 204 that might be substantially parallel to the plane containing the common source 216.

Typical construction of memory cells 208 includes a data-storage structure 234 (e.g., a floating gate, charge trap, or other structure configured to store charge) that can determine a data state of the memory cell (e.g., through changes in threshold voltage), and a control gate 236, as shown in FIG. 2A. The data-storage structure 234 might include both conductive and dielectric structures while the control gate 236 is generally formed of one or more conductive materials. In some cases, memory cells 208 might further have a defined source/drain (e.g., source) 230 and a defined source/drain (e.g., drain) 232. Memory cells 208 have their control gates 236 connected to (and in some cases form) an access line 202.

A column of the memory cells 208 might be a NAND string 206 or a plurality of NAND strings 206 selectively connected to a given data line 204. A row of the memory cells 208 might be memory cells 208 commonly connected to a given access line 202. A row of memory cells 208 can, but need not, include all memory cells 208 commonly connected to a given access line 202. Rows of memory cells 208 might often be divided into one or more groups of physical pages of memory cells 208, and physical pages of memory cells 208 often include every other memory cell 208 commonly connected to a given access line 202. For example, memory cells 208 commonly connected to access line $202_N$ and selectively connected to even data lines 204 (e.g., data lines $204_0$, $204_2$, $204_4$, etc.) might be one physical page of memory cells 208 (e.g., even memory cells) while memory cells 208 commonly connected to access line $202_N$ and selectively connected to odd data lines 204 (e.g., data lines $204_1$, $204_3$, $204_5$, etc.) might be another physical page of memory cells 208 (e.g., odd memory cells). Although data lines $204_3$-$204_5$ are not explicitly depicted in FIG. 2A, it is apparent from the figure that the data lines 204 of the array of memory cells 200A might be numbered consecutively from data line $204_0$ to data line $204_M$. Other groupings of memory cells 208 commonly connected to a given access line 202 might also define a physical page of memory cells 208. For certain memory devices, all memory cells commonly connected to a given access line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells might include those memory cells that are configured to be erased together, such as all memory cells connected to access lines $202_0$-$202_N$ (e.g., all NAND strings 206 sharing common access lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS or other data storage structure configured to store charge) and other architectures (e.g., AND arrays, NOR arrays, etc.).

Figure 2B:
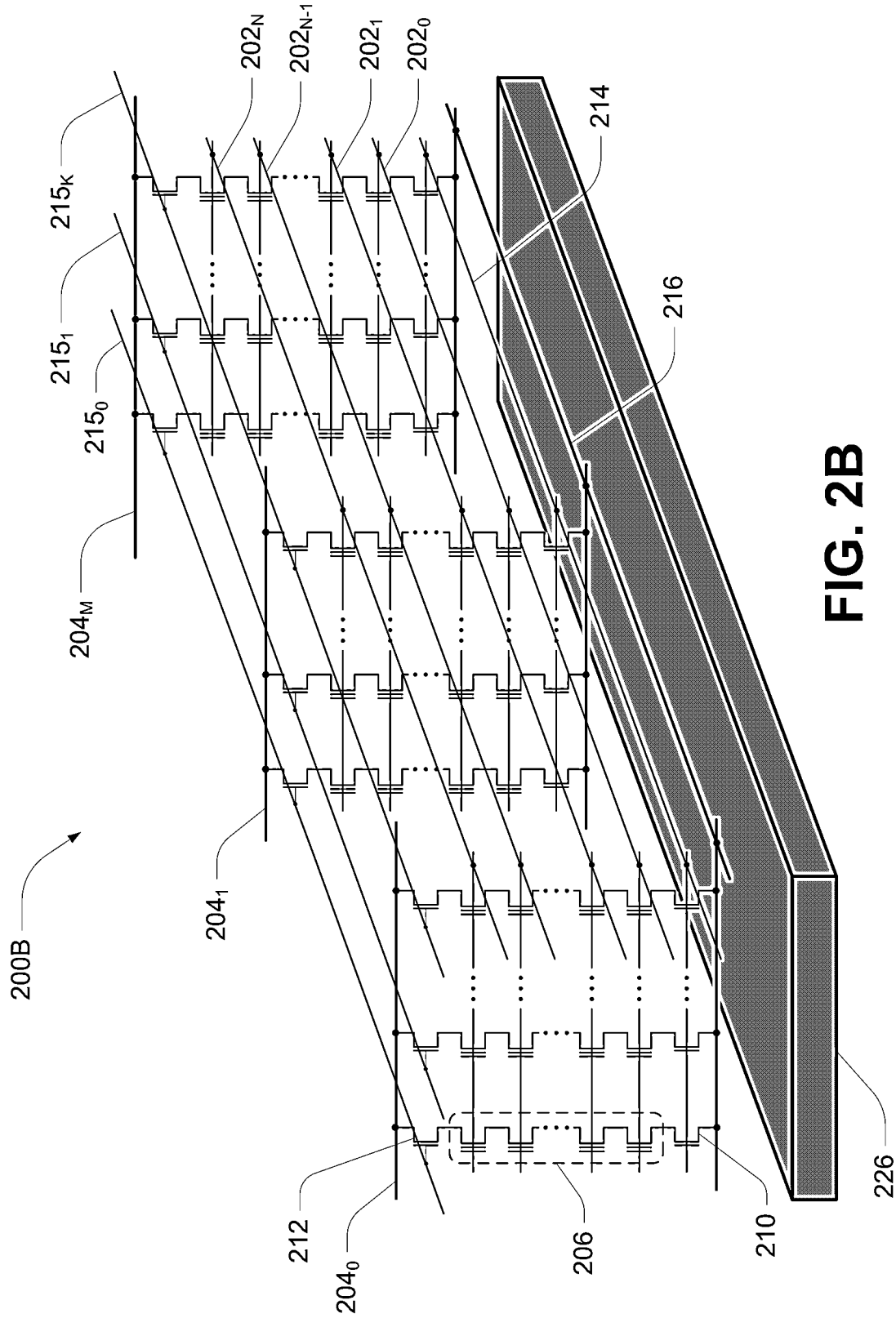

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B might incorporate vertical structures which might include semiconductor pillars, which might be solid or hollow, where a portion of a pillar might act as a channel region of the memory cells of NAND strings 206, e.g., a region through which current might flow when a memory cell, e.g., a field-effect transistor, is activated. The NAND strings 206 might be each selectively connected to a data line $204_0$-$204_M$ by a select transistor 212 (e.g., that might be drain select transistors, commonly referred to as select gate drain) and to a common source 216 by a select transistor 210 (e.g., that might be source select transistors, commonly referred to as select gate source). Multiple NAND strings 206 might be selectively connected to the same data line 204. Subsets of NAND strings 206 can be connected to their respective data lines 204 by biasing the select lines $215_0$-$215_K$ to selectively activate particular select transistors 212 each between a NAND string 206 and a data line 204. The select transistors 210 can be activated by biasing the select line 214. Each access line 202 might be connected to multiple rows of memory cells of the memory array 200B. Rows of memory cells that are commonly connected to each other by a particular access line 202 might collectively be referred to as tiers.

The three-dimensional NAND memory array 200B might be formed over peripheral circuitry 226. The peripheral circuitry 226 might represent a variety of circuitry for accessing the memory array 200B. The peripheral circuitry 226 might include complementary circuit elements. For example, the peripheral circuitry 226 might include both n-channel region and p-channel region transistors formed on a same semiconductor substrate, a process commonly referred to as CMOS, or complementary metal-oxide-semiconductors. Although CMOS often no longer utilizes a strict metal-oxide-semiconductor construction due to advancements in integrated circuit fabrication and design, the CMOS designation remains as a matter of convenience.

Figure 2C:
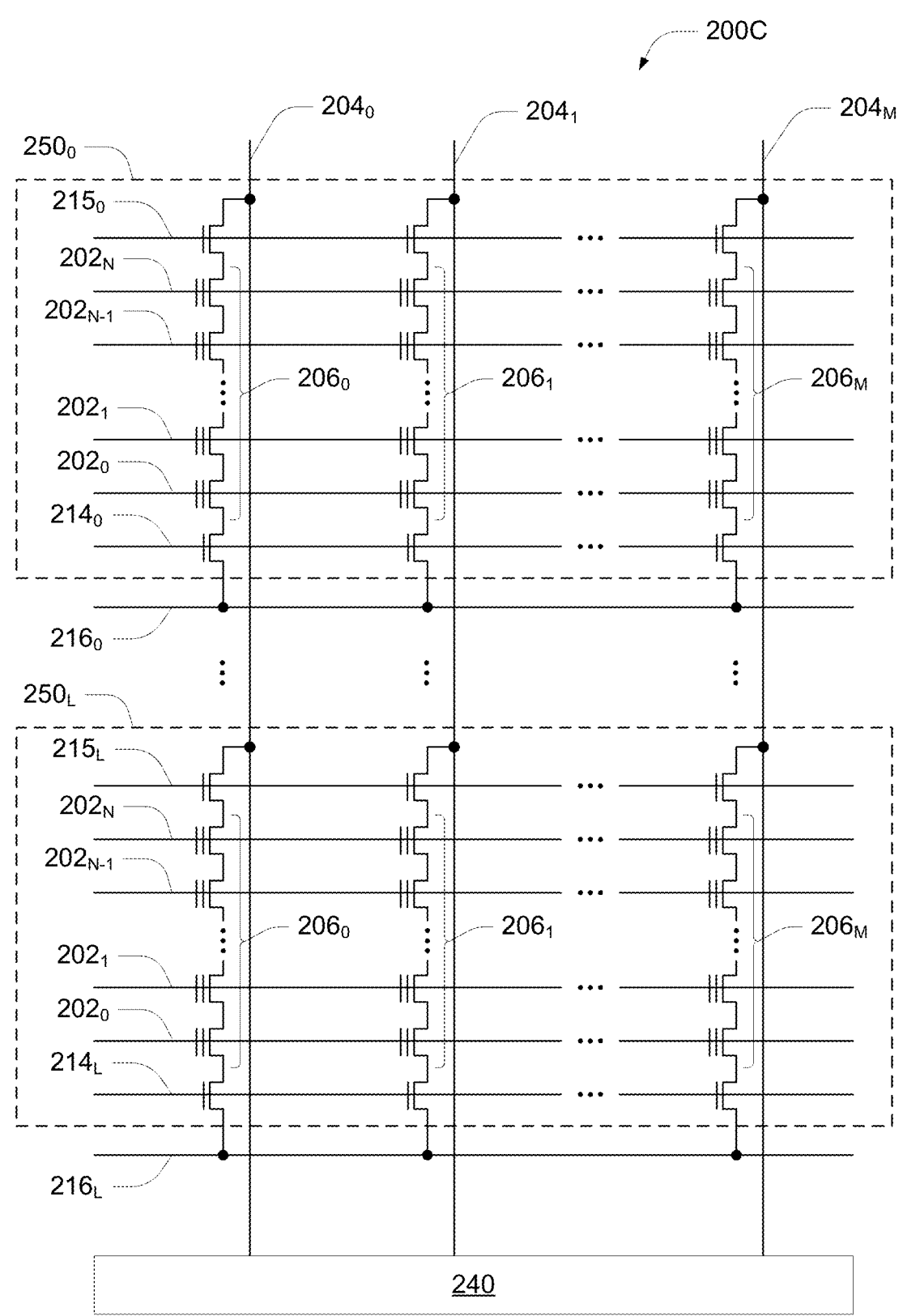

FIG. 2C is a further schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. Array of memory cells 200C might include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 2A. A portion of the array of memory cells 200A might be a portion of the array of memory cells 200C, for example. FIG. 2C depicts groupings of NAND strings 206 into blocks of memory cells 250, e.g., blocks of memory cells $250_0$-$250_L$. Blocks of memory cells 250 might be groupings of memory cells 208 that might be erased together in a single erase operation, sometimes referred to as erase blocks. Each block of memory cells 250 might represent those NAND strings 206 commonly associated with a single select line 215, e.g., select line $215_0$. The source 216 for the block of memory cells $250_0$ might be a same source as the source 216 for the block of memory cells $250_L$. For example, each block of memory cells $250_0$-$250_L$ might be commonly selectively connected to the source 216. Access lines 202 and select lines 214 and 215 of one block of memory cells 250 might have no direct connection to access lines 202 and select lines 214 and 215, respectively, of any other block of memory cells of the blocks of memory cells $250_0$-$250_L$.

The data lines $204_0$-$204_M$ might be connected (e.g., selectively connected) to a buffer portion 240, which might be a portion of a page buffer of the memory. The buffer portion 240 might correspond to a memory plane (e.g., the set of blocks of memory cells $250_0$-$250_L$). The buffer portion 240 might include sense circuits (not shown in FIG. 2C) for sensing data values indicated on respective data lines 204.

Figure 3A:
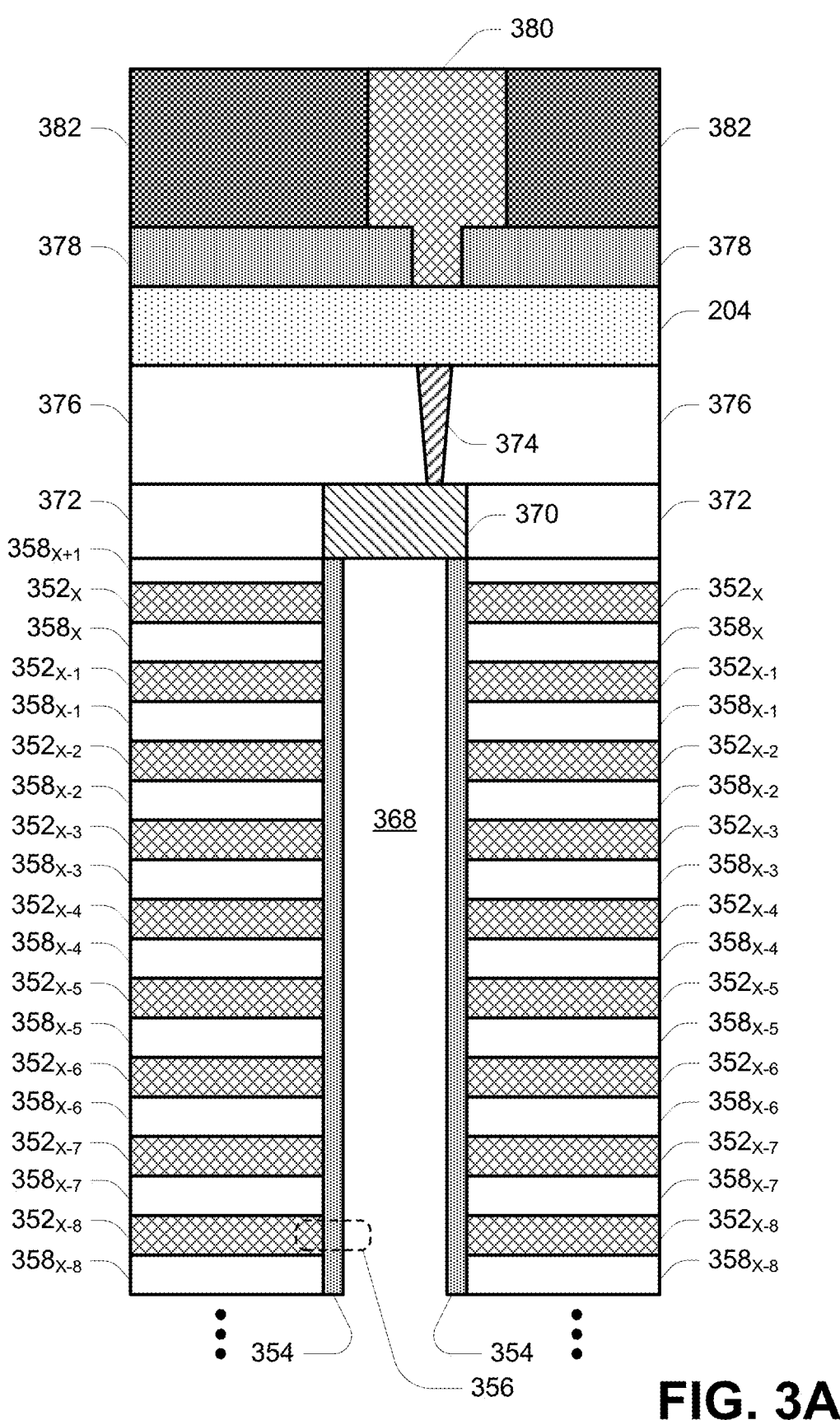
FIG. 3A depicts a cross-sectional view of a memory array structure to aid description of various embodiments.
Figure 3B:
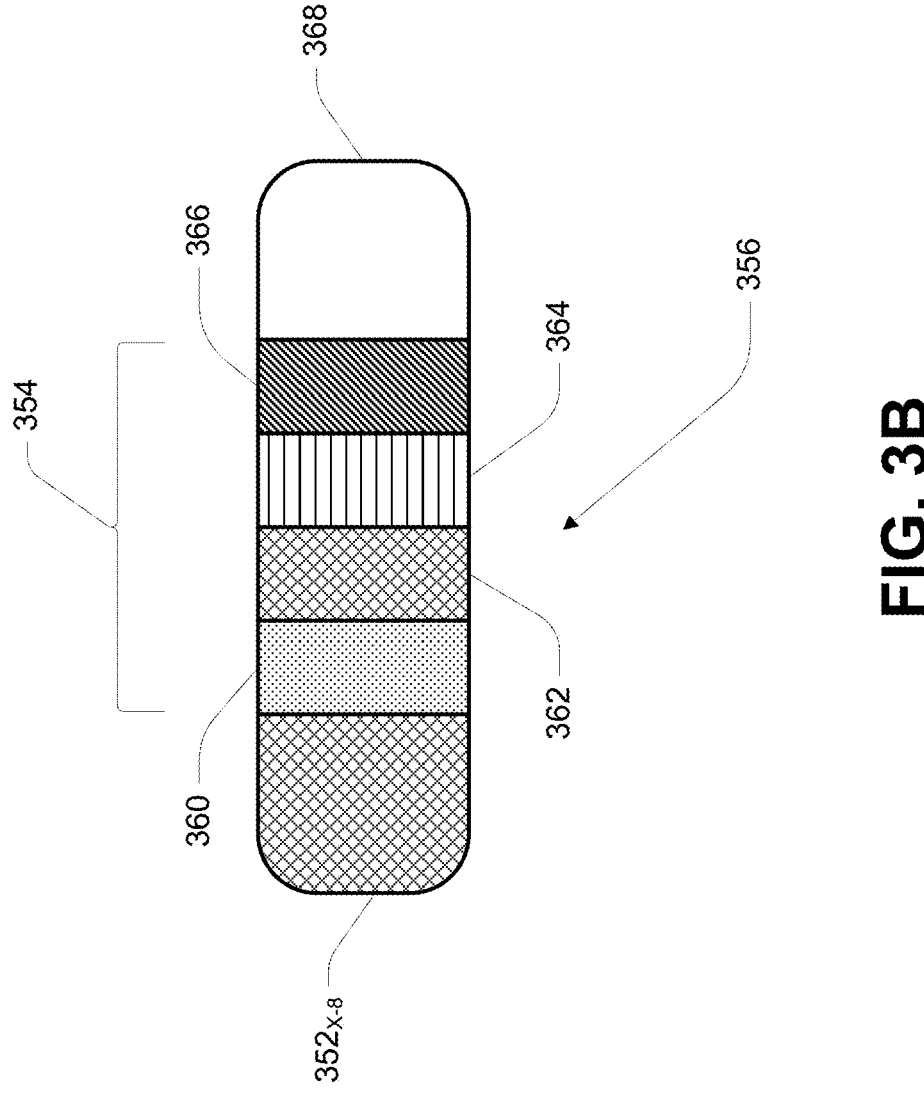
FIG. 3B depicts an exploded portion of the memory array structure of FIG. 3A.

FIG. 3A depicts a cross-sectional view of a memory array structure to aid description of various embodiments. For example, the memory array structure might correspond to a portion of a string of series-connected memory cells and corresponding drain select gates depicting connectivity to a data line. FIG. 3B depicts an exploded portion of the memory array structure of FIG. 3A providing additional detail of a channel material structure.

As noted, memory cells and select gates might utilize a same structure, e.g., the structure of a programmable field-effect transistor (FET). These transistors might be formed from alternating layers of conductive materials and dielectric materials, formed around a pillar that acts as a common channel for the transistors, and which might be hollow.

In FIG. 3A, a transistor might be formed at each intersection of a control gate 352 and a channel material structure 354. Although the channel material structure 354 in FIG. 3A is depicted as a hollow pillar containing a void 368, the channel material structure 354 could alternatively be a solid pillar. The portion 356 of the channel material structure 354 is depicted in further detail in FIG. 3B. The instances of control gates 352 might be isolated from one another by instances of a dielectric 358.

Each instance of control gate 352 might be formed of one or more conductive materials. A control gate 352 might comprise, consist of, or consist essentially of conductively doped polysilicon. Alternatively or in addition, each control gate 352 might comprise, consist of, or consist essentially of metal, such as a refractory metal, or a metal-containing material, such as a refractory metal silicide or a metal nitride, e.g., a refractory metal nitride, as well as any other conductive material.

Each instance of dielectric 358 might be formed of one or more dielectric materials. A dielectric 358 might comprise, consist of, or consist essentially of an oxide, e.g., silicon dioxide ($SiO_2$), and/or may comprise, consist of, or consist essentially of a high-K dielectric material, such as aluminum oxides ($AlO_x$), hafnium oxides ($HfO_x$), hafnium aluminum oxides ($HfAlO_x$), hafnium silicon oxides ($HfSiO_x$), lanthanum oxides ($LaO_x$), tantalum oxides ($TaO_x$), zirconium oxides ($ZrO_x$), zirconium aluminum oxides ($ZrAlO_x$), or yttrium oxide ($Y_2O_3$), as well as any other dielectric material. High-K dielectrics as used herein means a material having a dielectric constant greater than that of silicon dioxide. A dielectric 358 might further comprise, consist of, or consist essentially of a spin-on dielectric material, e.g., hydrogen silsesquioxane (HSQ), hexamethyldisiloxane, octamethyltrisiloxane, etc., or a high-density-plasma (HDP) oxide. As one example, the dielectric 560 might contain silicon dioxide.

As depicted in FIG. 3B, the channel material structure 354 might include a charge-blocking material 360 formed adjacent to, and surrounded by, the instances of control gates 352 and dielectrics 358. A charge-storage material 362 might be formed on the charge-blocking material 360, a dielectric (e.g., gate dielectric) 364 might be formed on the charge-storage material 362, and a channel material (e.g., a semiconductor) 366 might be formed on the dielectric 364. The charge-storage material 362 might contain a dielectric or conductive charge-storage material. The charge-storage material 362 might further contain both dielectric and conductive materials, e.g., conductive nano-particles in a dielectric bulk material. For charge-storage material 362 containing a conductive material as its bulk, or contiguous, structure, resulting memory cells might typically be referred to as floating-gate memory cells. For charge-storage material 362 containing a dielectric material as its bulk, or contiguous, structure, resulting memory cells might typically be referred to as charge-trap memory cells. For one embodiment, the charge-blocking material 360, charge-storage material 362 and dielectric 364 might form an ONO structure. The channel material 366 might be a portion of a contiguous semiconductor structure for each transistor of the string of series-connected memory cells and associated select gates, or might otherwise be commonly electrically connected, which might include selectively electrically connected, to channels of each of those transistors.

The charge-blocking material 360 might function as a charge-blocking node for future memory cells and other transistors having a same structure, and might include one or more dielectric materials, such as described with reference to the instances of dielectric 358. For example, the charge-blocking material 360 might include a high-K dielectric material. The charge-storage material 362 might function as a charge-storage node for future memory cells and other transistors having a same structure, and might include one or more conductive and/or dielectric materials capable of storing a charge. For example, the charge-storage material 362 might include polysilicon, which might be conductively doped. Alternatively, the charge-storage material 362 might include silicon nitride. The dielectric 364 might function as a gate dielectric for future memory cells and other transistors having a same structure, and might include one or more dielectric materials such as described with reference to the instances of dielectric 358. For example, the dielectric 364 might include silicon dioxide. The channel material 366 might function as a channel for future memory cells and other transistors having a same structure, and might include one or more semiconductor materials, which might be conductively doped to provide desired threshold voltage characteristics.

A contact (e.g., contact plug) 370 might be formed in a dielectric 372, and might be overlying and in physical contact with the channel material structure 354, and in electrical contact with its channel material 366. The contact 370 might contain one or more conductive materials, such as described with reference to the control gates 352. As one example, the contact 370 might comprise, consist of, or consist essentially of a conductively-doped semiconductor material, such as conductively-doped polysilicon. The dielectric 372 might contain one or more dielectric materials, such as described with reference to the dielectric 358. As one example, the dielectric 372 might comprise, consist of, or consist essentially of silicon dioxide.

A contact (e.g., contact via) 374 might be formed in a dielectric 376, and might be overlying and in electrical contact with the contact 370. The contact 374 might further be in physical contact with the contact 370. The contact 374 might contain one or more conductive materials, such as described with reference to the control gates 352. As one example, the contact 374 might comprise, consist of, or consist essentially of a conductively-doped semiconductor material, such as conductively-doped polysilicon. For example, the contact 370 and the contact 374 might both contain conductively-doped polysilicon of a same conductivity type. Alternatively or in addition, the contact 374 might comprise, consist of, or consist essentially of metal, such as a refractory metal, or a metal-containing material, such as a refractory metal silicide or a metal nitride, e.g., a refractory metal nitride, as well as any other conductive material. The metals of chromium (Cr), cobalt (Co), hafnium (Hf), molybdenum (Mo), niobium (Nb), tantalum (Ta), titanium (Ti), tungsten (W), vanadium(V) and zirconium (Zr) are generally recognized as refractory metals. The dielectric 376 might contain one or more dielectric materials, such as described with reference to the dielectric 358. As one example, the dielectric 376 might comprise, consist of, or consist essentially of silicon dioxide.

A data line 204 might be formed to be overlying and in electrical contact with the contact 374. The data line 204 might further be in physical contact with the contact 374. The data line 204 might contain one or more conductive materials, such as described with reference to the control gates 352. As one example, the data line 204 might comprise, consist of, or consist essentially of a refractory metal, such as tungsten. A dielectric cap 378 might be formed to be overlying the data line 204. The dielectric cap 378 might contain one or more dielectric materials, such as described with reference to the dielectric 358. As one example, the dielectric cap 378 might comprise, consist of, or consist essentially of a dielectric nitride, such as silicon nitride or carbon nitride. In general, the dielectric material of the dielectric cap 378 should be different than the dielectric material of the dielectric 376 to allow for removal of a portion of the dielectric cap 378 without removal of undesirable amounts of the dielectric 376.

A top contact 380 might be formed in a dielectric 382 to be overlying and in electrical contact with the data line 204. The top contact 380 might further be in physical contact with the data line 204. The top contact 380 might contain one or more conductive materials, such as described with reference to the control gates 352. As one example, the top contact 380 might comprise, consist of, or consist essentially of a refractory metal, such as tungsten. The dielectric 382 might contain one or more dielectric materials of low conformability. For example, the dielectric 382 might comprise, consist of, or consist essentially of a dielectric material of low conformability such as tetraethylorthosilicate (TEOS) or silane oxide. A dielectric material will be deemed to be of low conformability if, as will be described infra, it is expected to form voids between adjacent data lines 204 during formation of the dielectric 382 overlying the data lines 204, and is not expected to conform sufficiently to fill spaces between those adjacent data lines 204.

Figure 4:
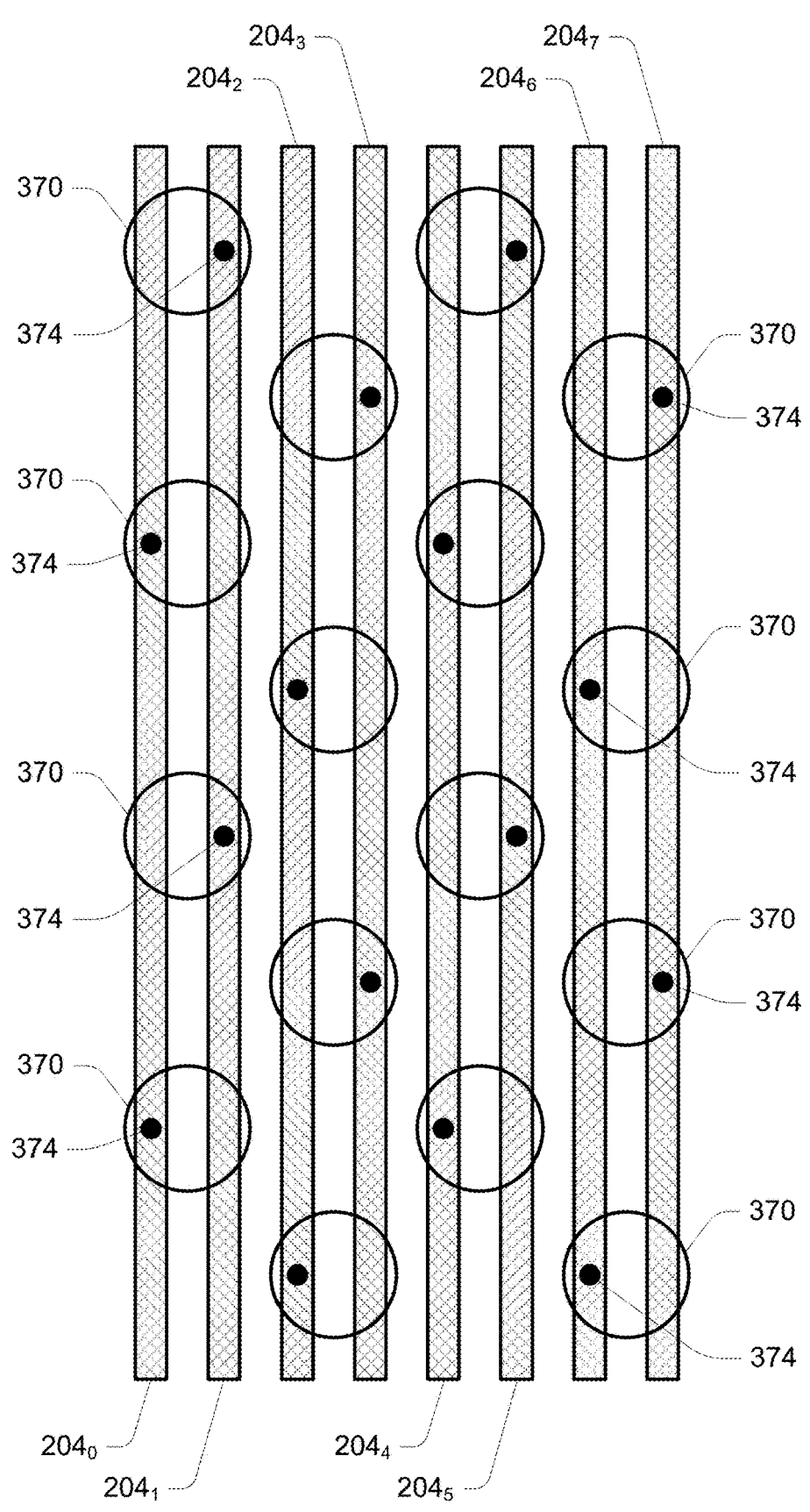
FIG. 4 is a conceptual depiction of a portion of a block of memory cells demonstrating a layout of data line connectivity to a contact for a string of series-connected memory cells, according to an embodiment.

FIG. 4 is a conceptual depiction of a portion of a block of memory cells demonstrating a layout of data line connectivity to a contact for a string of series-connected memory cells, according to an embodiment. FIG. 4 is generally a top-down view depicting a number of data lines 204, e.g., data lines $204_0$-$204_7$, and their connection to contacts 374 and contacts 370. It will be understood that a respective NAND string 206 (e.g., string of series-connected non-volatile memory cells) could be selectively connected to each contact 370 as described supra.

Figure 5A:
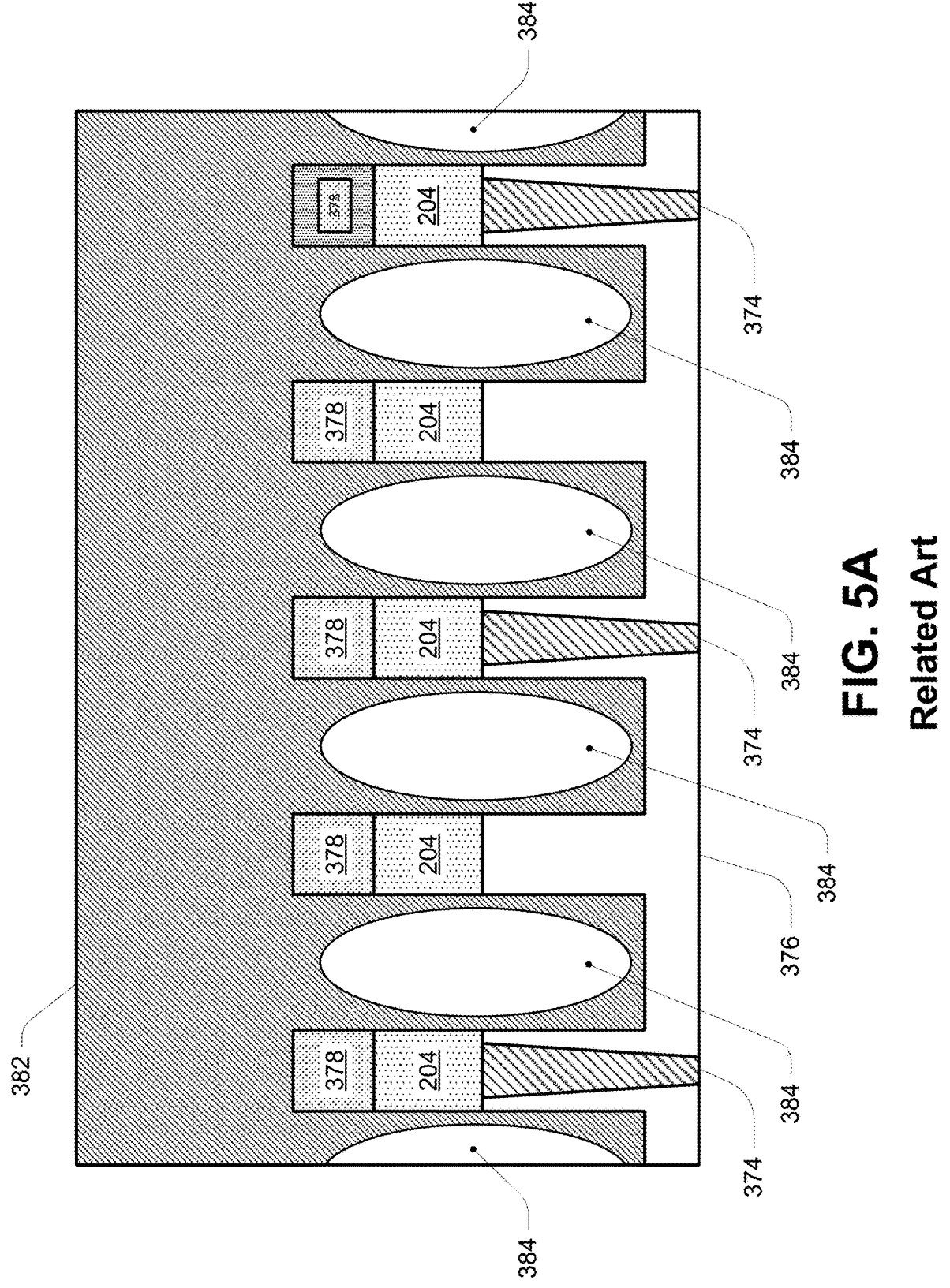
FIGS. 5A-5C depict a memory array structure of the related art during various stages of fabrication.
Figure 5B:
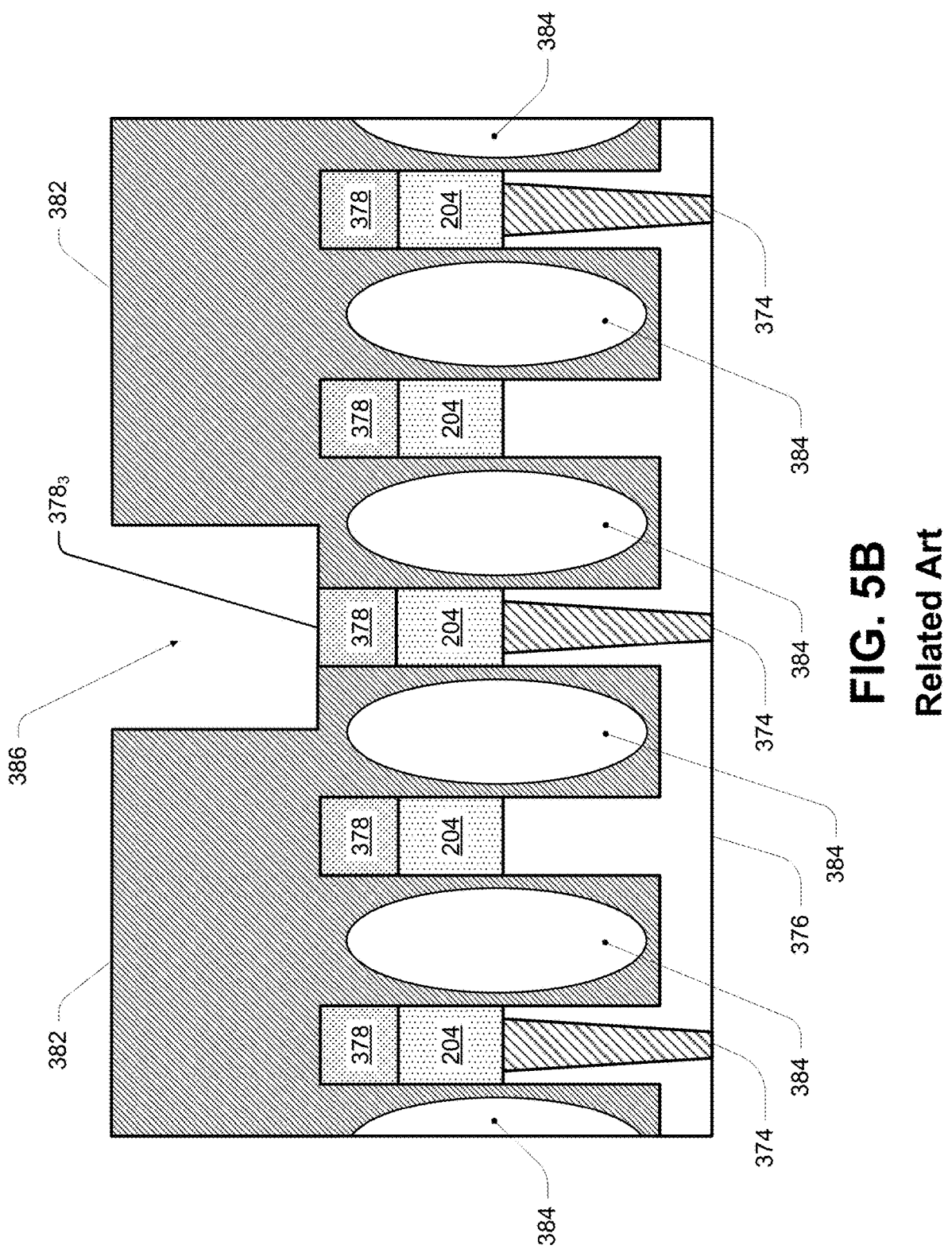
Figure 5C:
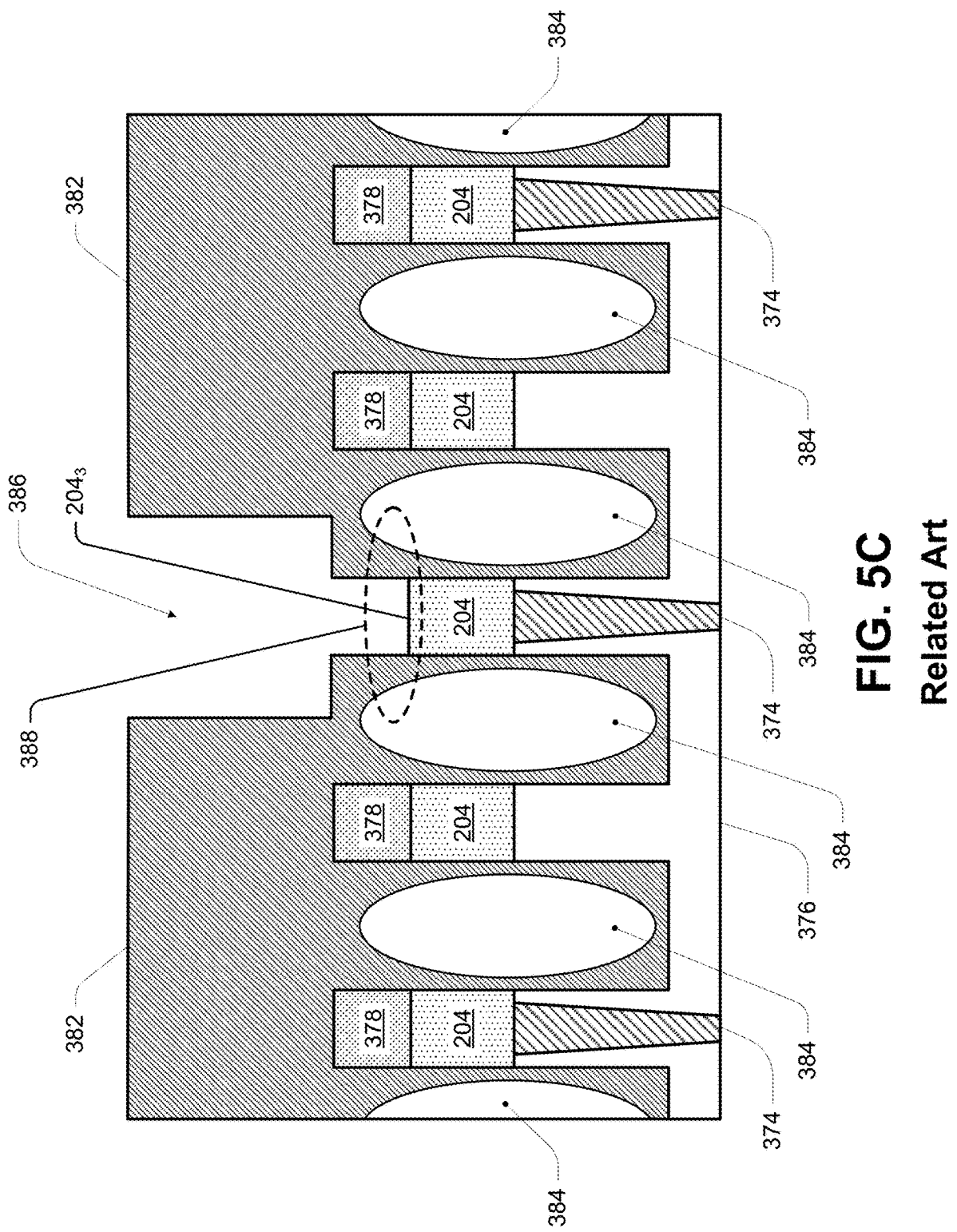

FIGS. 5A-5C depict a memory array structure of the related art during various stages of fabrication. For example, FIGS. 5A-5C might depict formation of a portion of a structure such as depicted in FIG. 3A. The view of FIGS. 5A-5C might represent a vertical cross-section of an upper portion of FIG. 3A prior to completion of fabrication. For example, the center data line 204 of FIG. 5A and its corresponding contact 374 might correspond to the data line 204 and contact 374 of FIG. 3A.

In FIG. 5A, the dielectric 382 is depicted to be overlying the dielectric caps 378, data lines 204, and dielectric 376. The dielectric 382 is depicted to include voids 384, often referred to as air gaps, extending between instances of the dielectric caps 378, between instances of data lines 204, and between fins of dielectric 376 (e.g., the vertical portions of dielectric 376 upon which the data lines 204 are formed), some of which are depicted to include contacts 374.

In FIG. 5B, an opening 386 might be formed in the dielectric 382. The opening 386 might define an area for formation of a top contact 380, and might further expose a portion of a dielectric cap 378. In FIG. 5C, the opening 386 might be extended by removing the exposed portion of the dielectric cap 378 to expose a portion of a corresponding data line 204. As highlighted in area 388, portions of the dielectric 382 might be relatively thin, such that formation of the opening 386 might risk breach into one or both of the adjacent voids 384. Subsequent formation of a top contact 380 might then result in conductive material contaminating one or both of the adjacent voids 384. Various embodiments seek to mitigate such a concern.

FIGS. 6A-6I and 7A-7I depict a memory array structure during various stages of fabrication in accordance with embodiments. For example, FIGS. 6A-6I and 7A-7I might depict formation of a structure such as depicted in FIG. 3A. The views of FIGS. 6A-6I might represent top views of the formation of an upper portion of the structure of FIG. 3A. The views of FIGS. 7A-7I might be taken along line 7-7 of FIG. 6A. As such, the views of FIGS. 7A-7I might represent vertical cross-sectional views of the formation of the upper portion of the structure of FIG. 3A, e.g., orthogonal to the view of FIG. 3A. For example, the dielectric 376 and the dielectric cap $378_3$ of FIG. 6A might correspond to the dielectric 376 and the dielectric cap 378 of FIG. 3A, respectively. Similarly, the dielectric 376, the center contact 374, the data line $204_3$, and the dielectric caps $378_3$ of FIG. 7A might correspond to the dielectric 376, contact 374, data line 204, and dielectric cap 378 of FIG. 3A, respectively. The views of FIGS. 6A-6I and 7A-7I might be formed overlying an array of memory cells, and each contact (e.g., contact via) 374 might be in contact with a respective contact (e.g., contact plug) 370 that is selectively connected to a respective string of series-connected memory cells. For clarity, some reference numbers might be omitted from certain elements of the figures. However, each element of any figure can be identified by its reference number in one or more other figures included herewith.

Figure 6A:
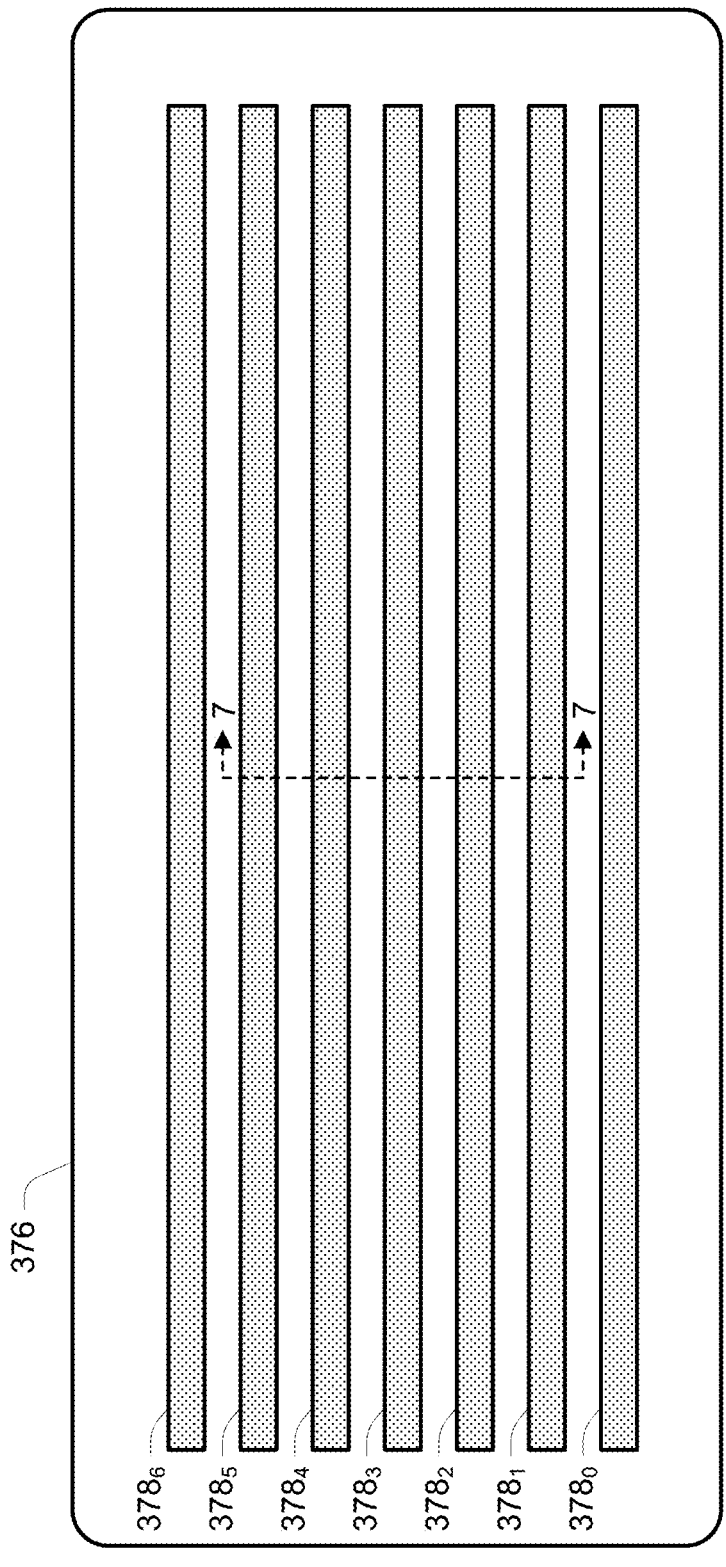
FIGS. 6A-6I and 7A-7I depict top views and cross-sectional views, respectively, of a memory array structure during various stages of fabrication in accordance with embodiments.
Figure 6B:
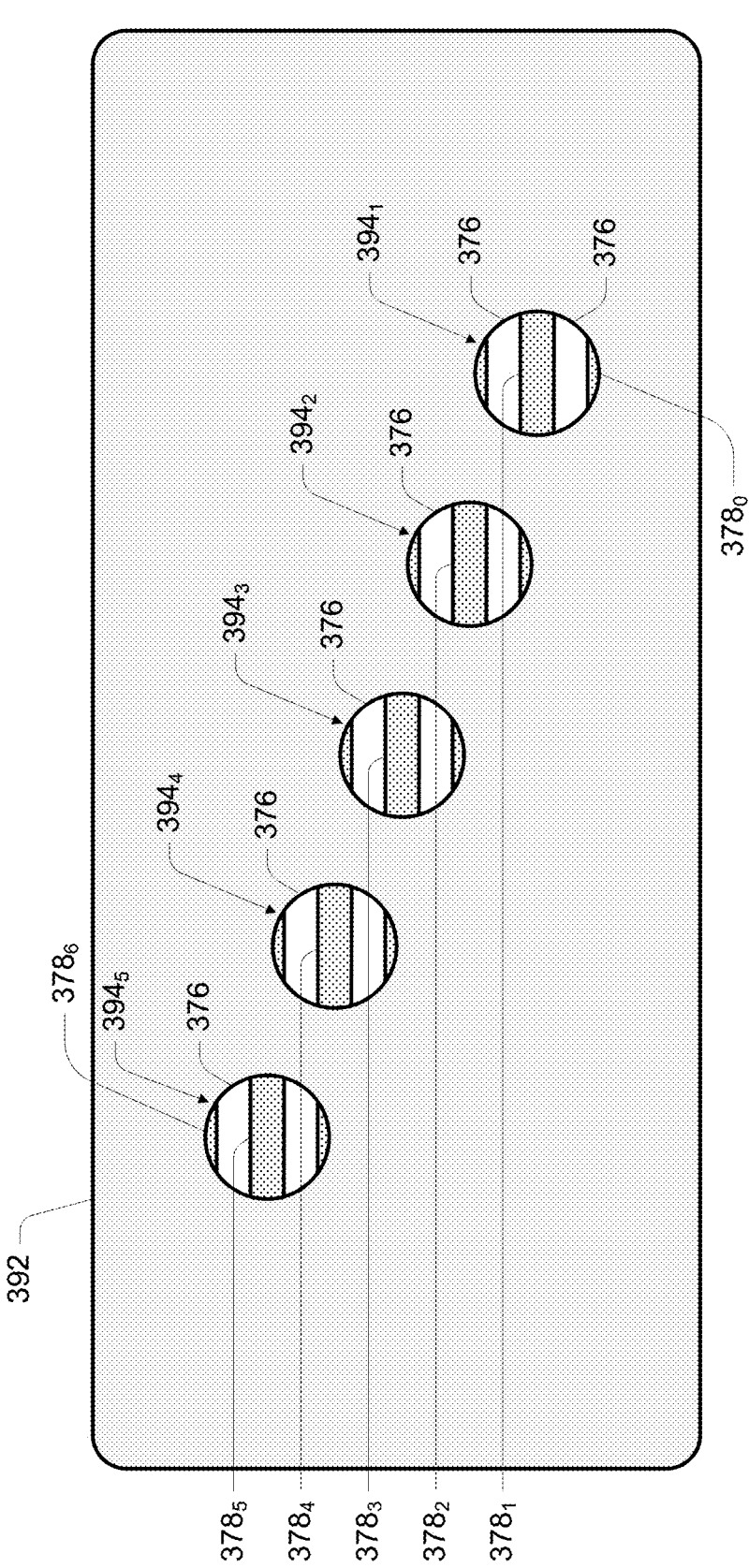
Figure 6C:
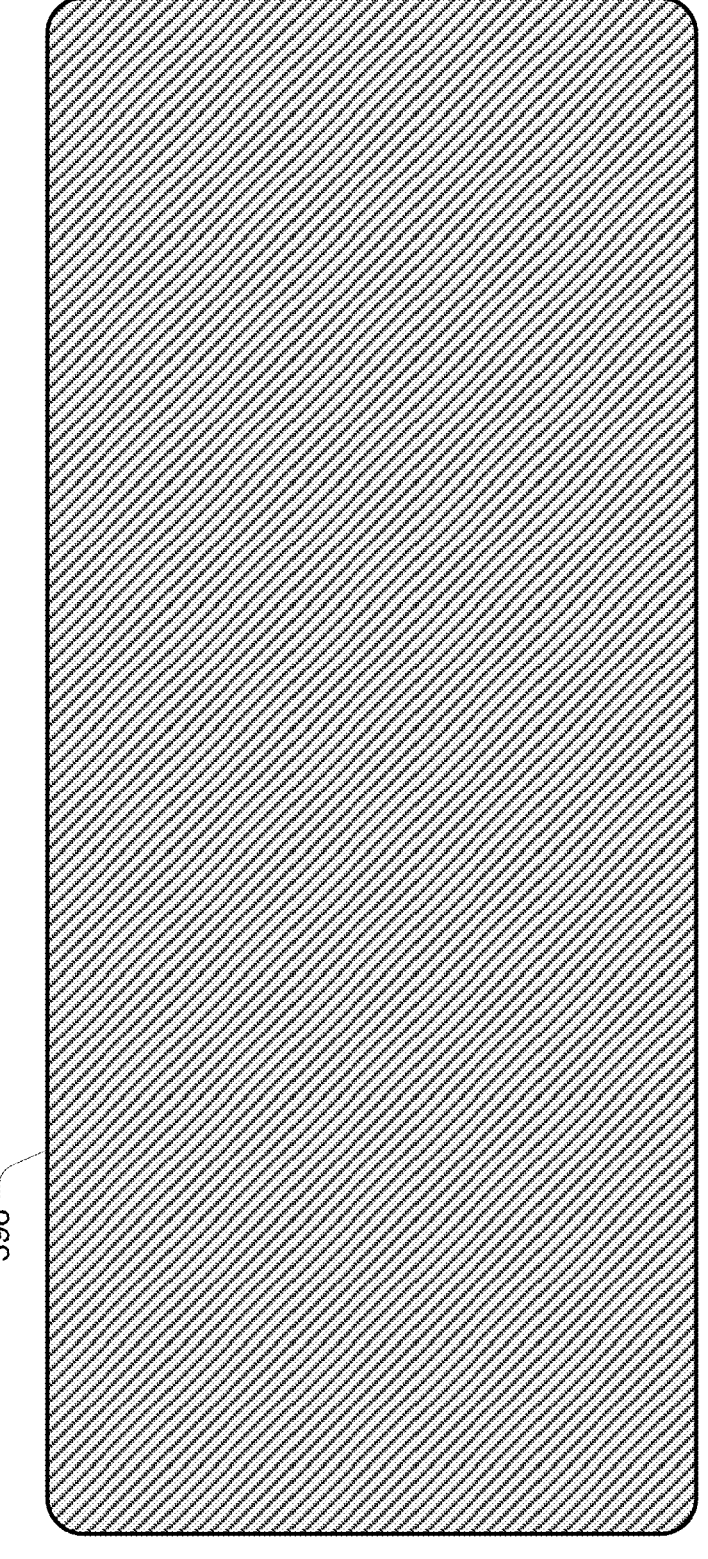
Figure 6D:
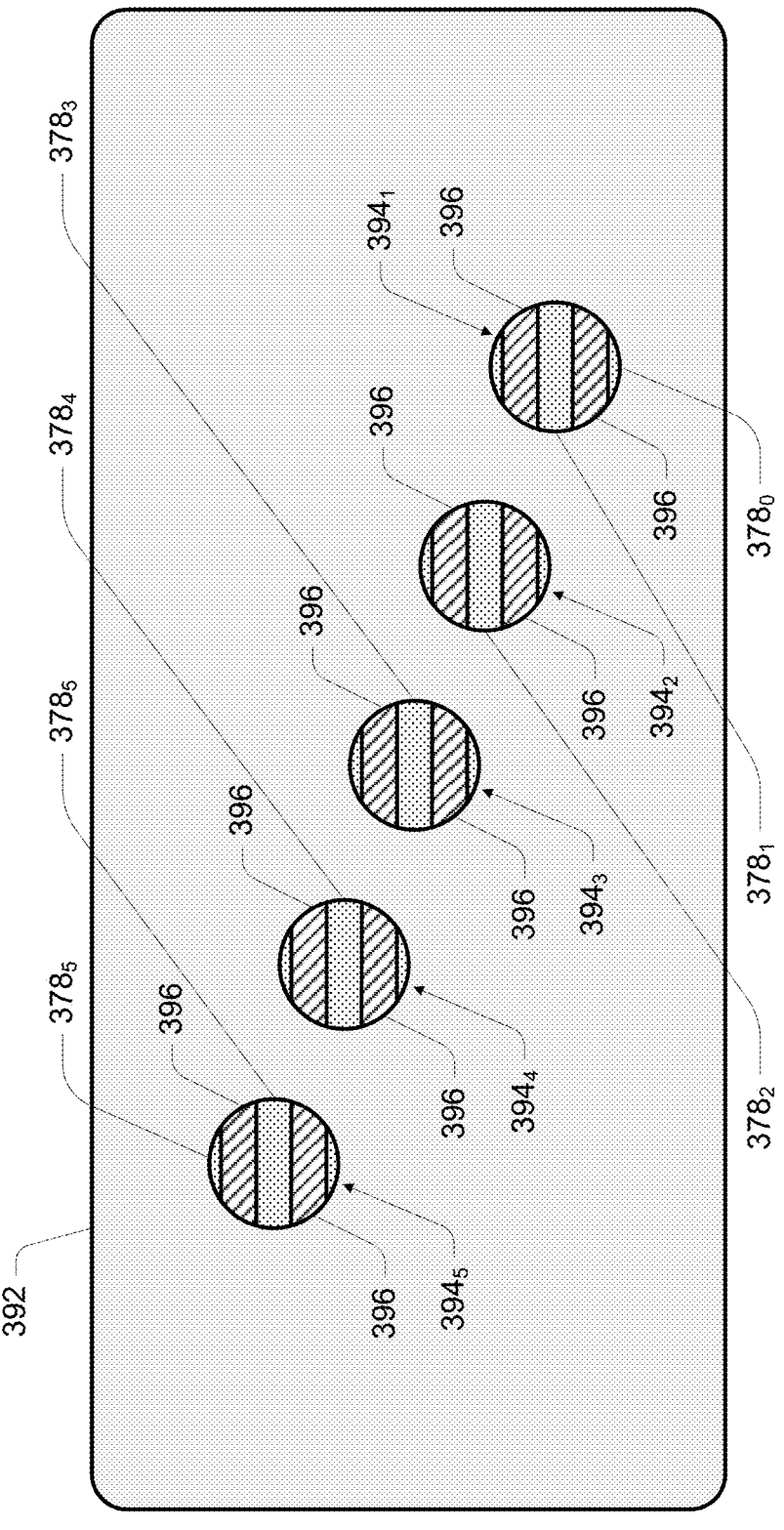
Figure 6E:
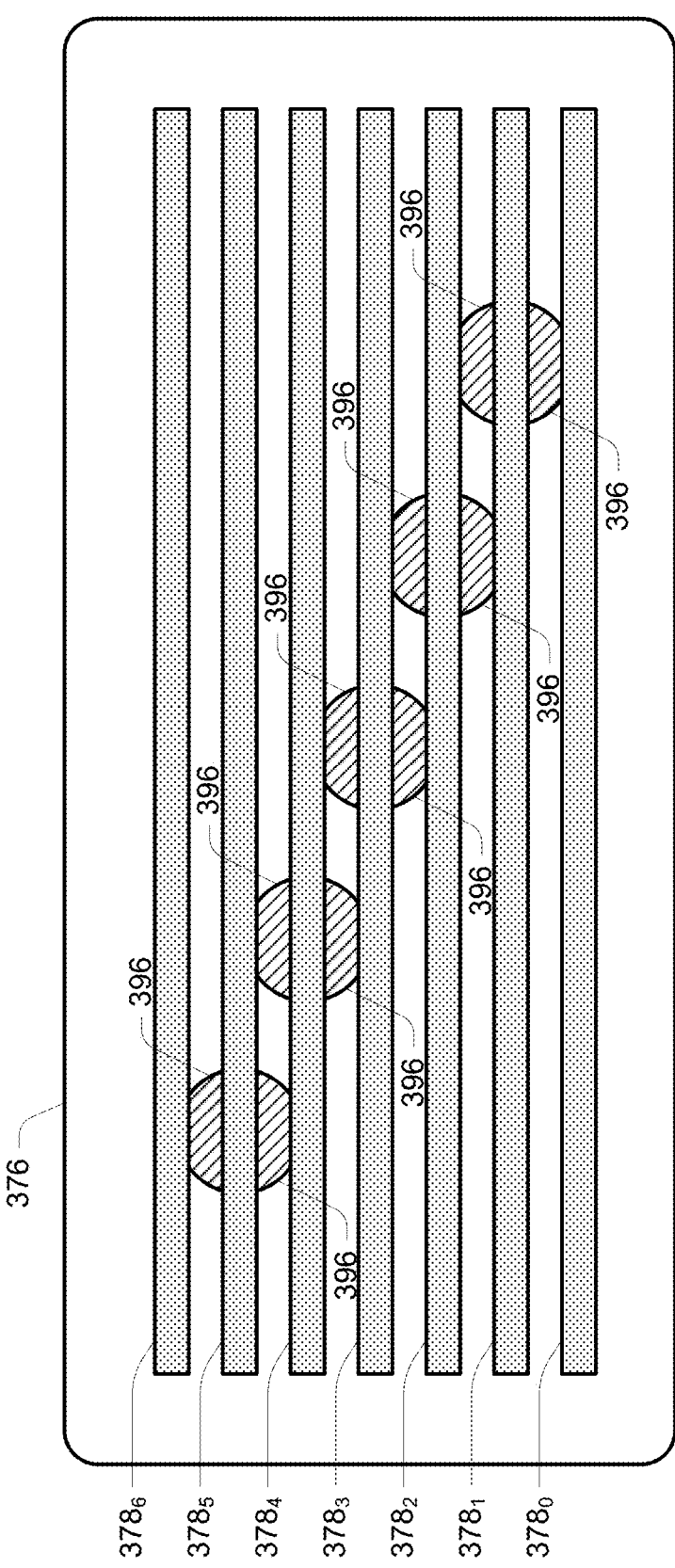
Figure 6F:
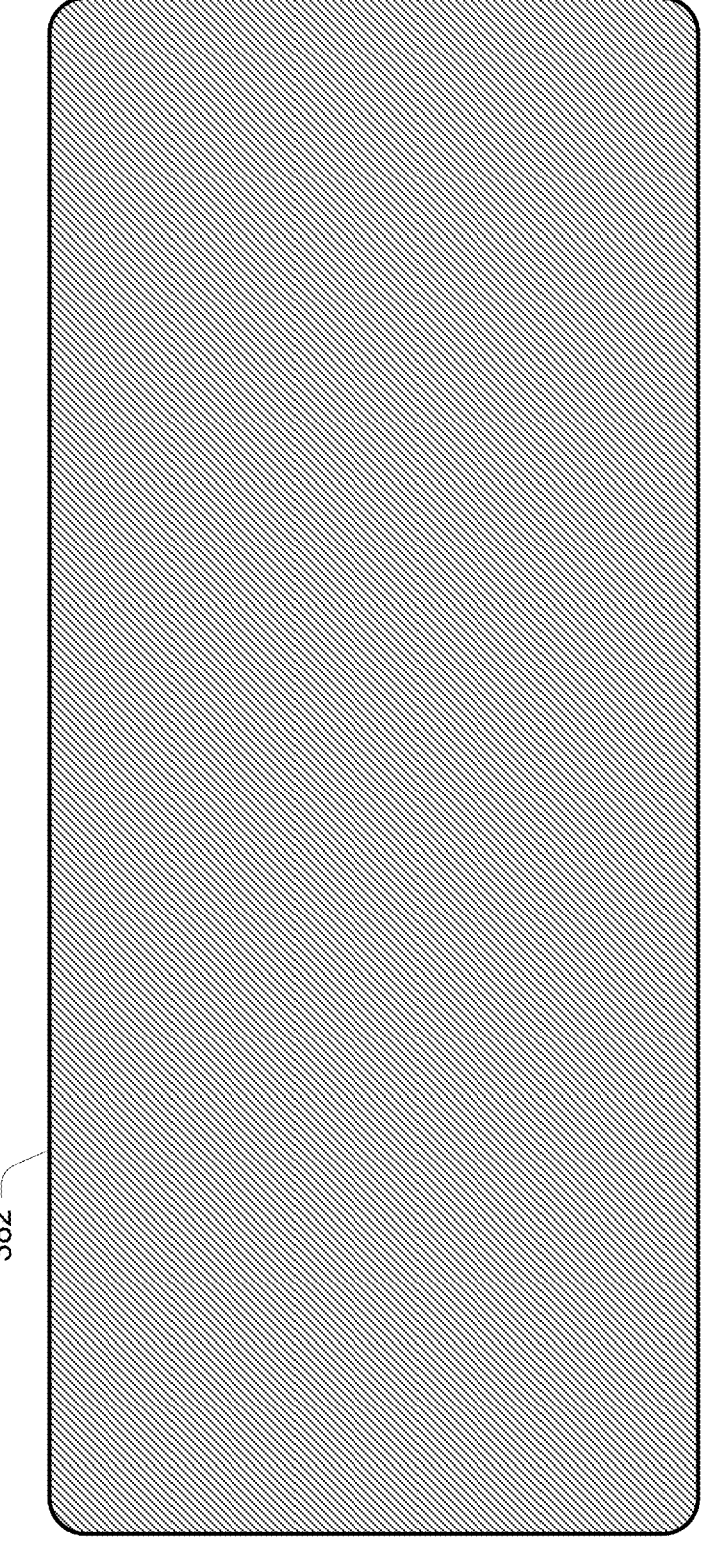
Figure 6G:
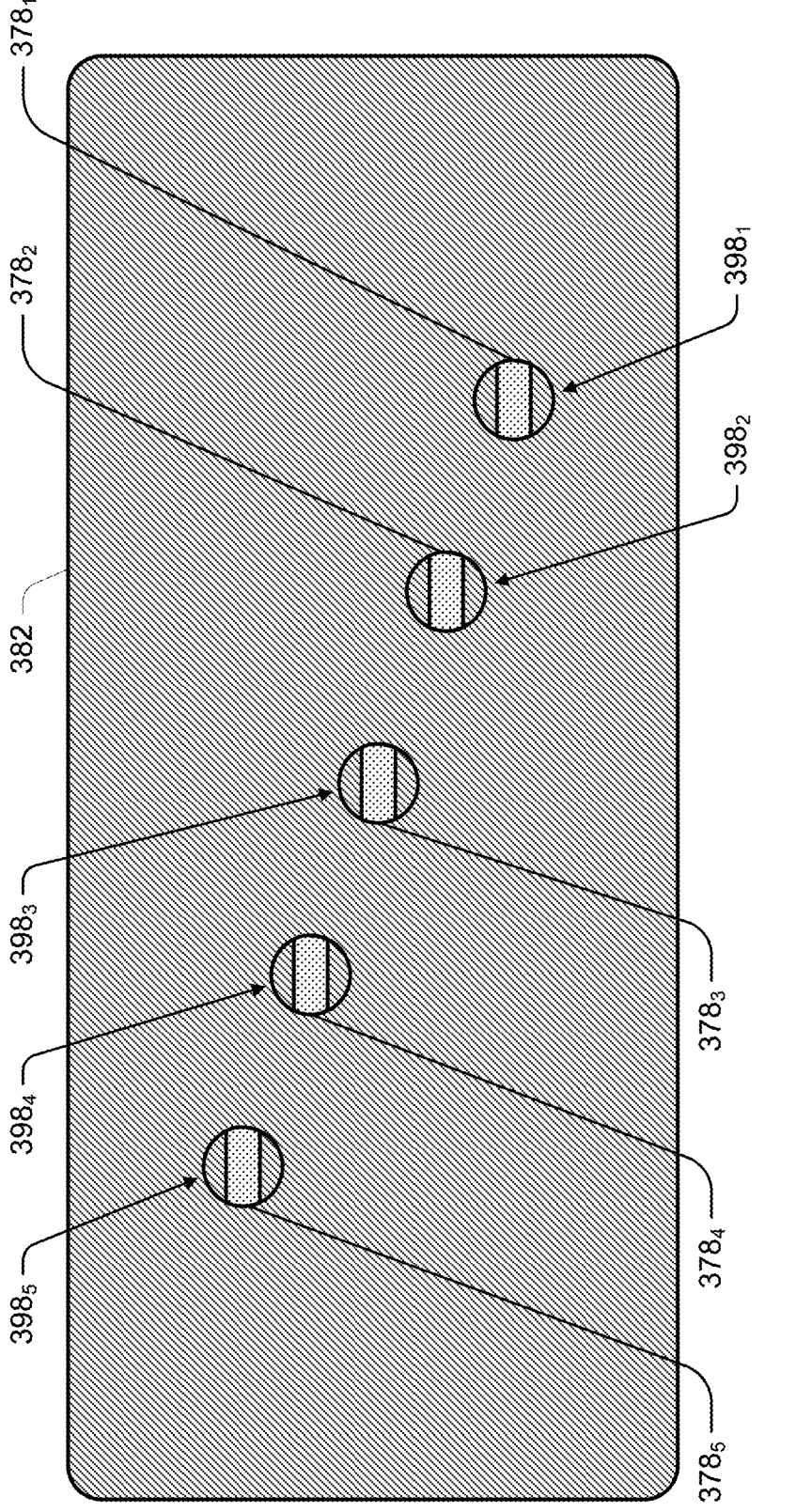
Figure 6H:
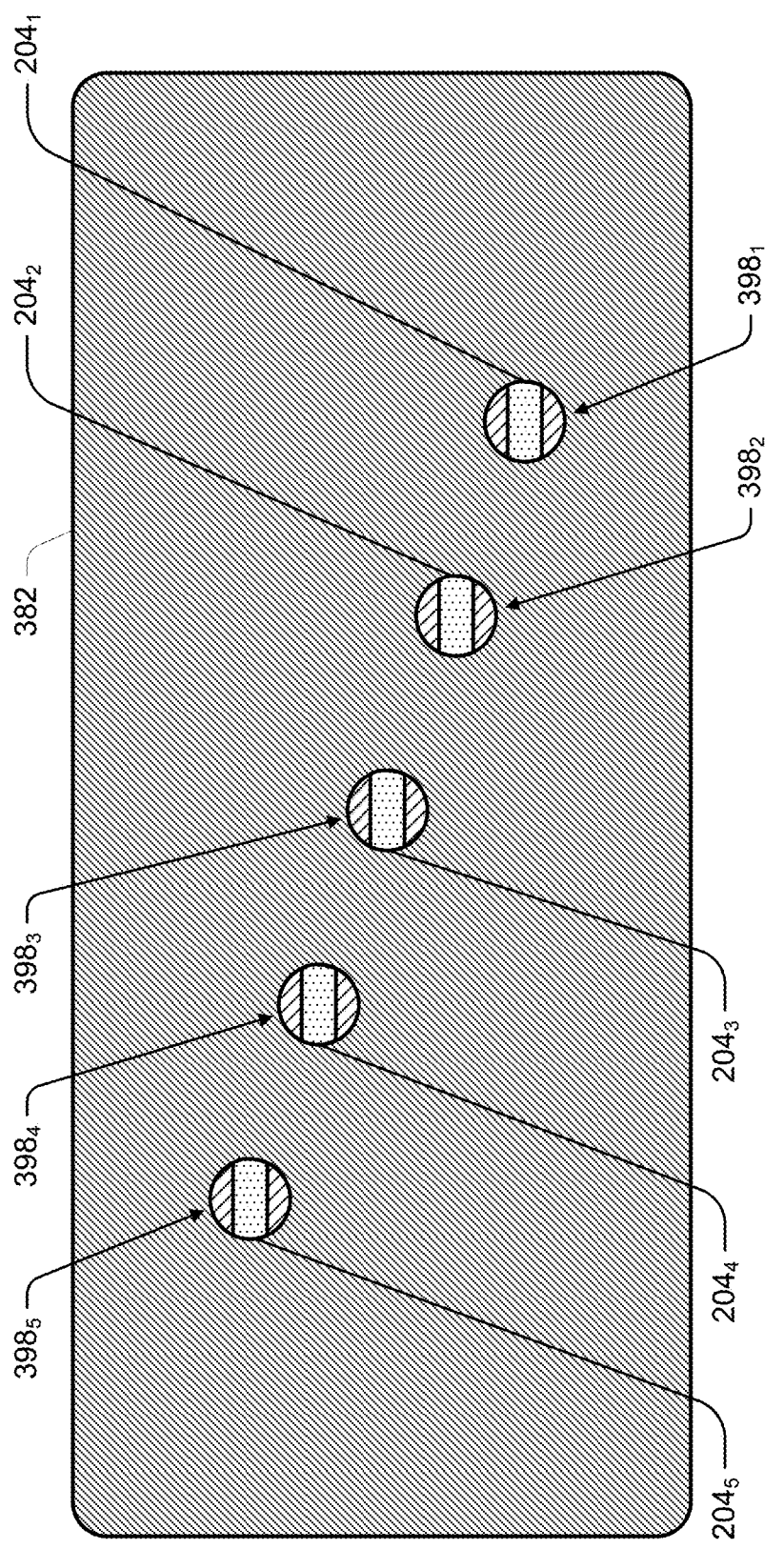
Figure 6I:
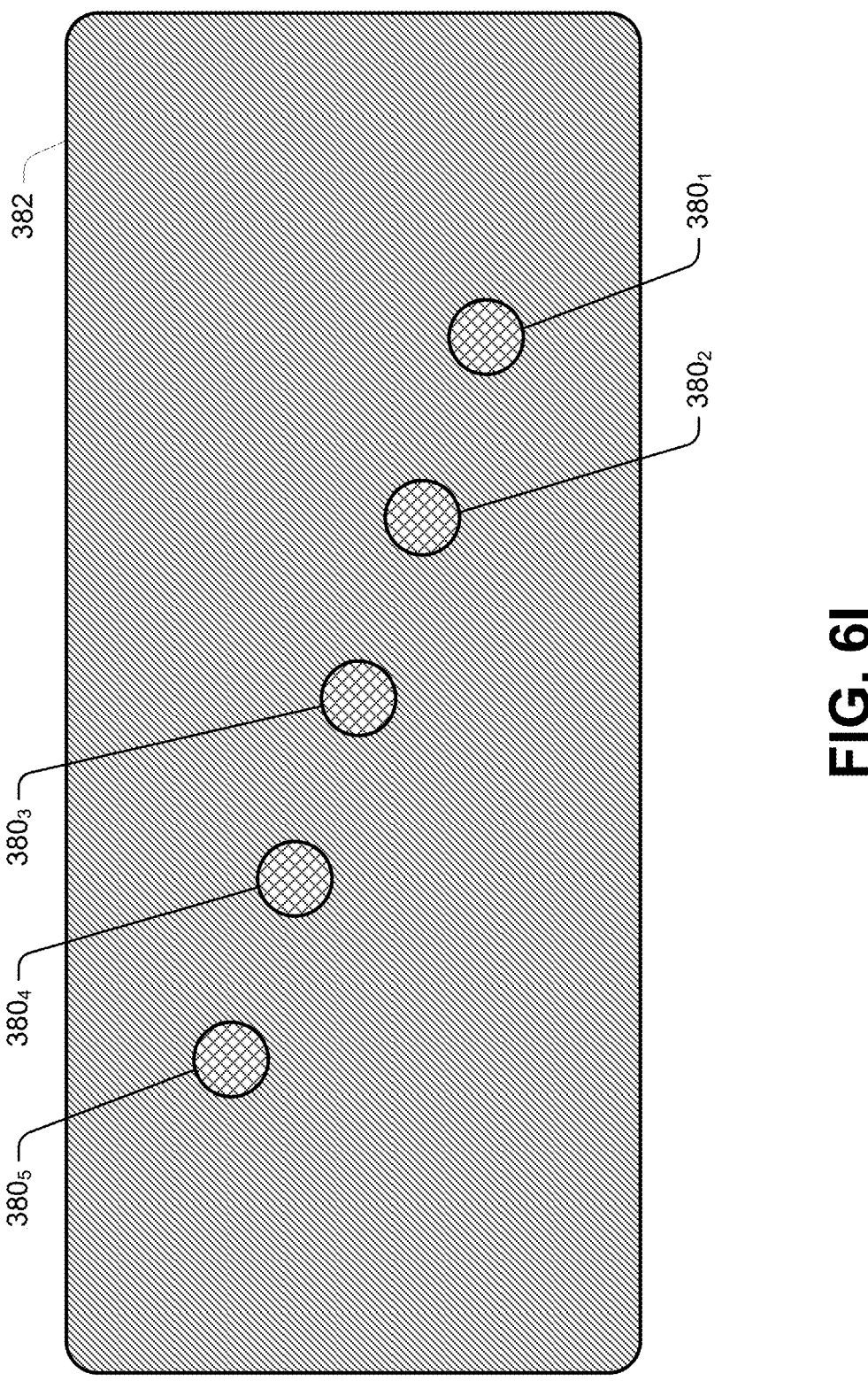
Figure 7A:
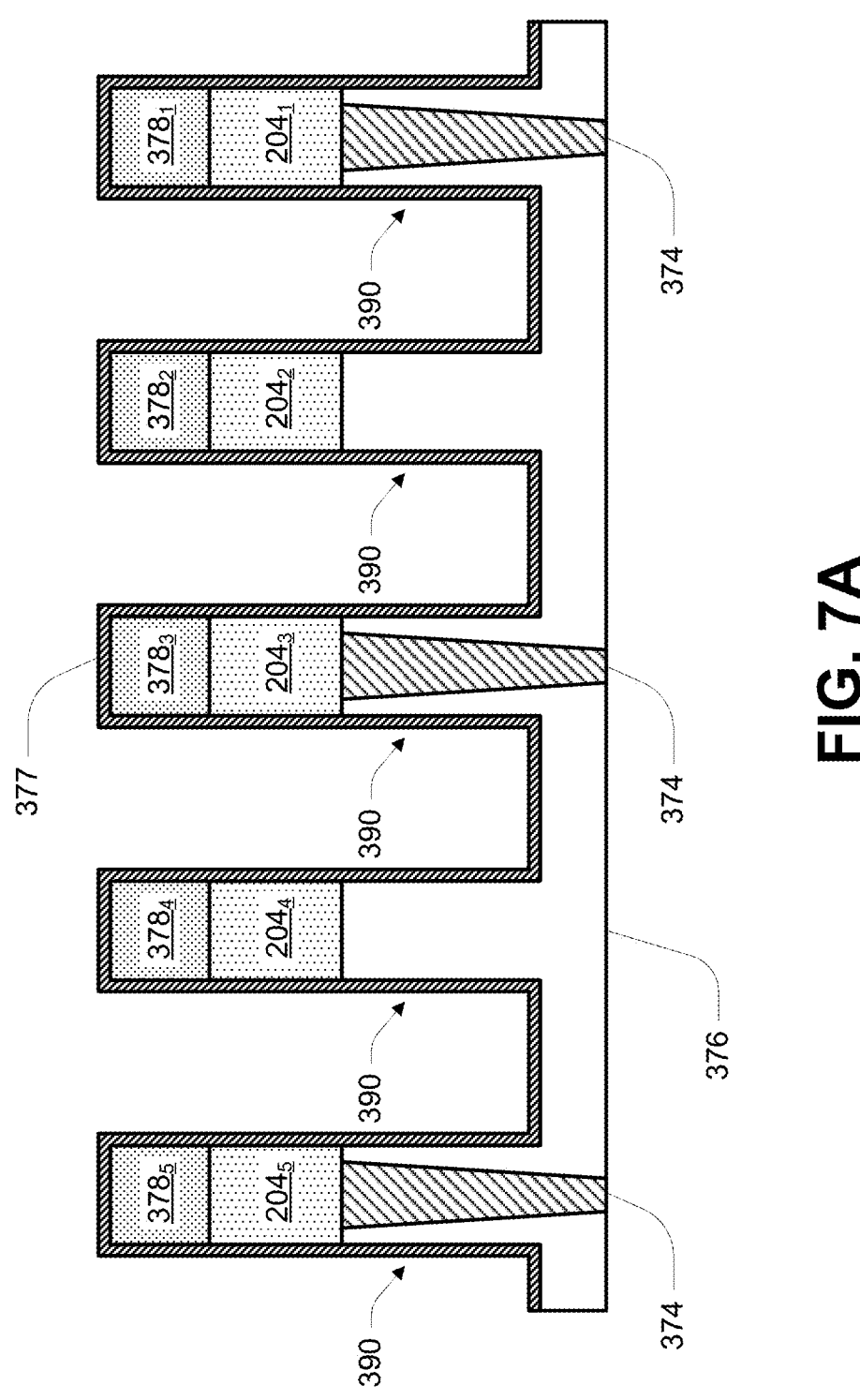

In FIGS. 6A and 7A, the structure might include the dielectric 376 having fins 390. One or more of the fins 390 of the dielectric 376 might contain a contact 374. It is noted that placement of the contacts 374 might be dependent upon the arrangement of the underlying array of memory cells. For some embodiments, an optional dielectric liner 377 might be formed overlying the structure of FIG. 7A. For example, a layer of silicon dioxide, e.g., approximately 2 nm thick, might be formed overlying exposed surfaces of the dielectric 376, the data lines 204, and the dielectric caps 378. Such a dielectric liner 377 might serve to mitigate chemical/material interaction from subsequent materials formed between the data lines 204. For clarity, the optional dielectric liner 377 will not be depicted in FIGS. 6A-6I.

Instances of data lines 204, e.g., data lines $204_1$-$204_5$ as depicted, might be overlying respective fins 390 of the dielectric 376. Instances of dielectric caps 378, e.g., dielectric caps $378_0$-$378_6$, might be overlying respective data lines 204, e.g., data lines $204_0$-$204_6$. Although data lines $204_0$ and $204_6$ are not explicitly depicted in FIG. 6A or 7A, their presence is apparent as each dielectric cap 378 might have a corresponding data line 204. Formation of the structure depicted in FIGS. 6A and 7A might include forming a layer of dielectric material for the dielectric 376, forming contacts 374 in the dielectric 376, forming a layer of conductive material for the data lines 204, and forming a layer of dielectric material for the dielectric caps 378. This structure might then be patterned to define the instances of dielectric caps $378_0$-$378_6$, the instances of data lines $204_0$-$204_6$ (data lines $204_1$-$204_5$ depicted in FIG. 7A), and the fins 390 of the dielectric 376 by removing portions of the dielectric material of the dielectric caps 378, removing portions of the conductive material of the data lines 204, and removing portions of (e.g., recessing) the dielectric material of the dielectric 376.

Figure 7B:
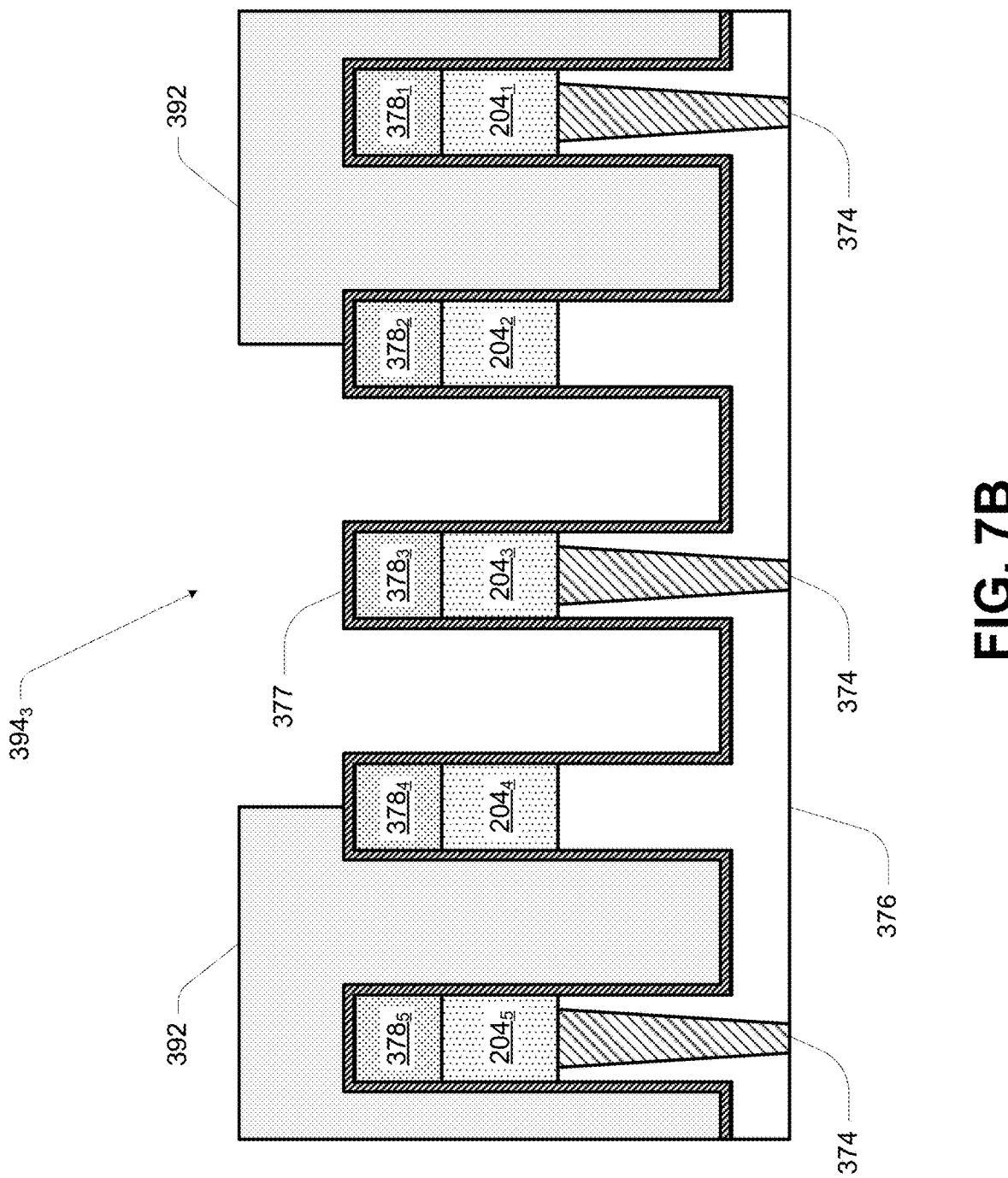

In FIGS. 6B and 7B, a sacrificial material 392 might be formed overlying the structure of FIGS. 6A and 7A, and patterned to define openings 394, e.g., openings $394_1$-$394_5$. For example, a patterned mask (not shown) might be formed overlying (e.g., on) the sacrificial material 392 to expose areas of the sacrificial material 392 for removal, e.g., areas of the openings 394. Alternatively, the sacrificial material 392 might be the patterned mask itself. The mask might be formed using a photolithographic process. Photolithographic processes are often used to define a desired pattern in integrated circuit fabrication. In a photolithographic process, a photoresist layer might be formed on the surface of the in-process device. The photoresist layer might contain a photo-sensitive polymer whose ease of removal is altered upon exposure to light or other electromagnetic radiation. To define the pattern, the photoresist layer might be selectively exposed to electromagnetic radiation and then developed to expose portions of the underlying layer. In a positive resist system, the portions of the photoresist layer exposed to the electromagnetic radiation are photosolubilized and a photolithographic mask is designed to block the electromagnetic radiation from those portions of the photoresist layer that are to remain after developing. In a negative resist systems, the portions of the photoresist layer exposed to the electromagnetic radiation are photopolymerized and the photolithographic mask is designed to block the electromagnetic radiation from those portions of the photoresist layer that are to be removed by developing. The sacrificial material 392 might be formed of a material that can be subjected to removal without adversely affecting the materials of the dielectric caps 378, the data lines 204, the dielectric 376, and/or the dielectric liner 377.

Each opening 394 might expose portions of corresponding dielectric caps 378. For example, opening $394_1$ might expose respective portions of dielectric caps $378_0$, $378_1$ and $378_2$; opening $394_2$ might expose respective portions of dielectric caps $378_1$, $378_2$ and $378_3$; opening $394_3$ might expose respective portions of dielectric caps $378_2$, $378_3$ and $378_4$; opening $394_4$ might expose respective portions of dielectric caps $378_3$, $378_4$ and $378_5$; and opening $394_5$ might expose respective portions of dielectric caps $378_4$, $378_5$ and $378_6$. The openings 394 might further expose portions of data lines 204 corresponding to their respective portions of dielectric caps 378, and portions of the dielectric 376 between their respective portions of dielectric caps 378. While each opening 394 is depicted to expose a full width of one dielectric cap 378, and partial widths for adjacent dielectric caps 378, the openings could be larger, e.g., exposing full widths of the adjacent dielectric caps 378 or exposing additional dielectric caps 378. For example, opening $394_3$ is depicted to expose a full width of dielectric cap $378_3$ and partial widths of dielectric caps $378_2$ and $378_4$. Optionally, opening $394_3$ could be expanded to expose full widths of dielectric caps $378_2$ and $378_4$, and could be further expanded to expose partial or full widths of next adjacent dielectric caps $378_1$ and/or $378_5$, and so on. For embodiments including a dielectric liner 377, the dielectric caps 378, data lines 204 and dielectric 376 will be deemed to be exposed by an opening 394 if there is no overlying sacrificial material 392.

Each opening 394 might expose a portion of a dielectric cap 378 overlying a corresponding data line 204 to which contact is to be made with a future top contact 380 in the area of that opening 394, and might further expose a portion (e.g., at least a portion) of each adjacent (e.g., immediately adjacent) dielectric cap 378. For example, the opening $394_3$ might expose a portion of the dielectric cap $378_3$ overlying the data line $204_3$ to which contact is to be made with a future top contact 380 (see, e.g., FIG. 7I), and might further expose portions of the adjacent (e.g., immediately adjacent) dielectric caps $378_2$ and $378_4$.

Figure 7C:
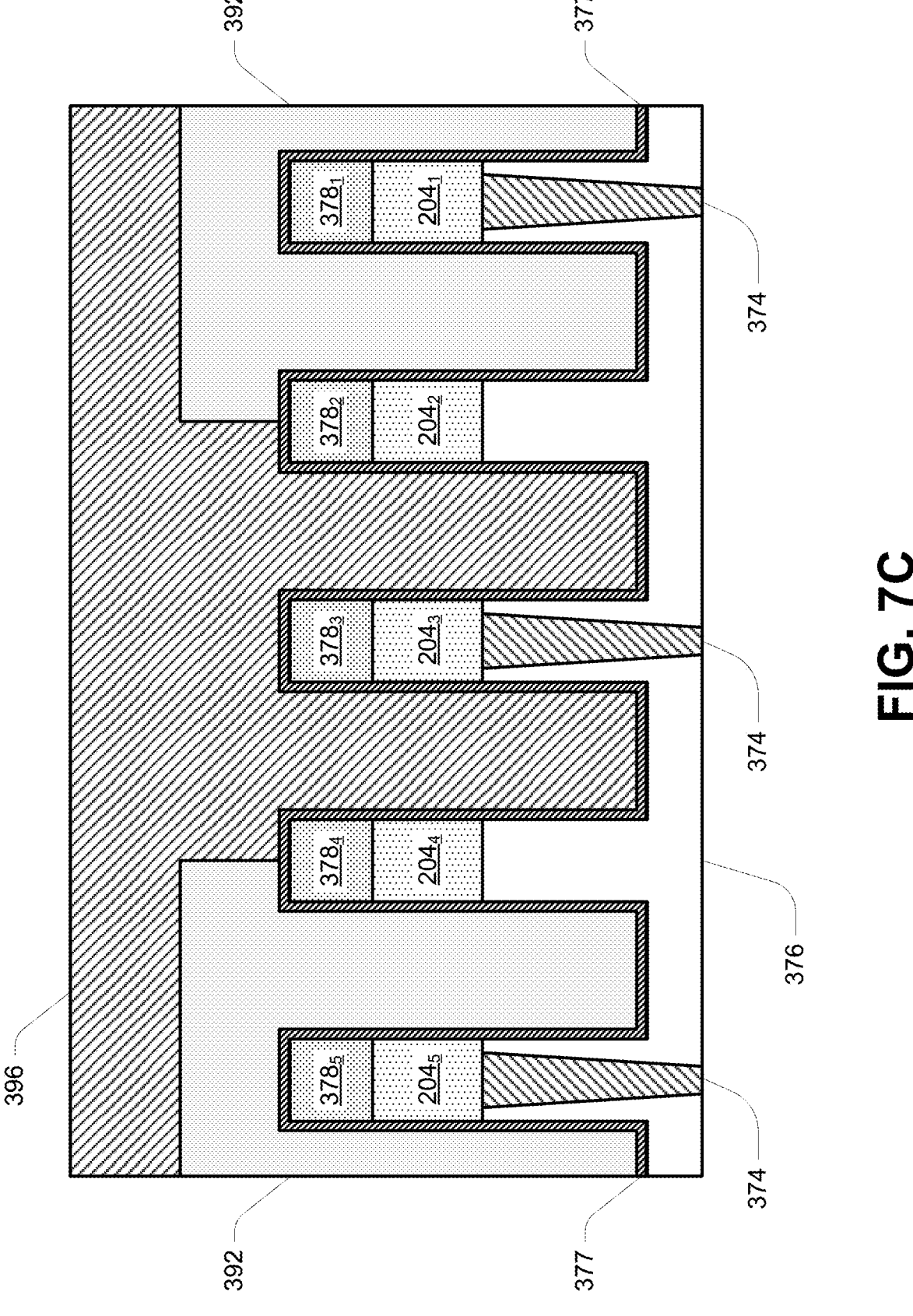

In FIGS. 6C and 7C, a dielectric 396 might be formed overlying the structure of FIGS. 6B and 7B. The dielectric 396 might contain one or more dielectric materials. The dielectric 396 might comprise, consist of, or consist essentially of an oxide, e.g., silicon dioxide ($SiO_2$), and/or may comprise, consist of, or consist essentially of a high-K dielectric material, such as aluminum oxides ($AlO_x$), hafnium oxides ($HfO_x$), hafnium aluminum oxides ($HfAlO_x$), hafnium silicon oxides ($HfSiO_x$), lanthanum oxides ($LaO_x$), tantalum oxides ($TaO_x$), zirconium oxides ($ZrO_x$), zirconium aluminum oxides ($ZrAlO_x$), or yttrium oxide ($Y_2O_3$), as well as any other dielectric material. High-K dielectrics as used herein means a material having a dielectric constant greater than that of silicon dioxide. The dielectric 396 might further comprise, consist of, or consist essentially of a spin-on dielectric material, e.g., hydrogen silsesquioxane (HSQ), hexamethyldisiloxane, octamethyltrisiloxane, etc., or a high-density-plasma (HDP) oxide. As one example, the dielectric 396 might contain silicon dioxide. The dielectric 396 might be formed of a dielectric material that can be subjected to removal without adversely affecting the material of the dielectric caps 378. However, removal of portions of the dielectric 396 might be permitted to damage the sacrificial material 392, provided that underlying data lines 204 and dielectric 376 are not adversely affected.

Figure 7D:
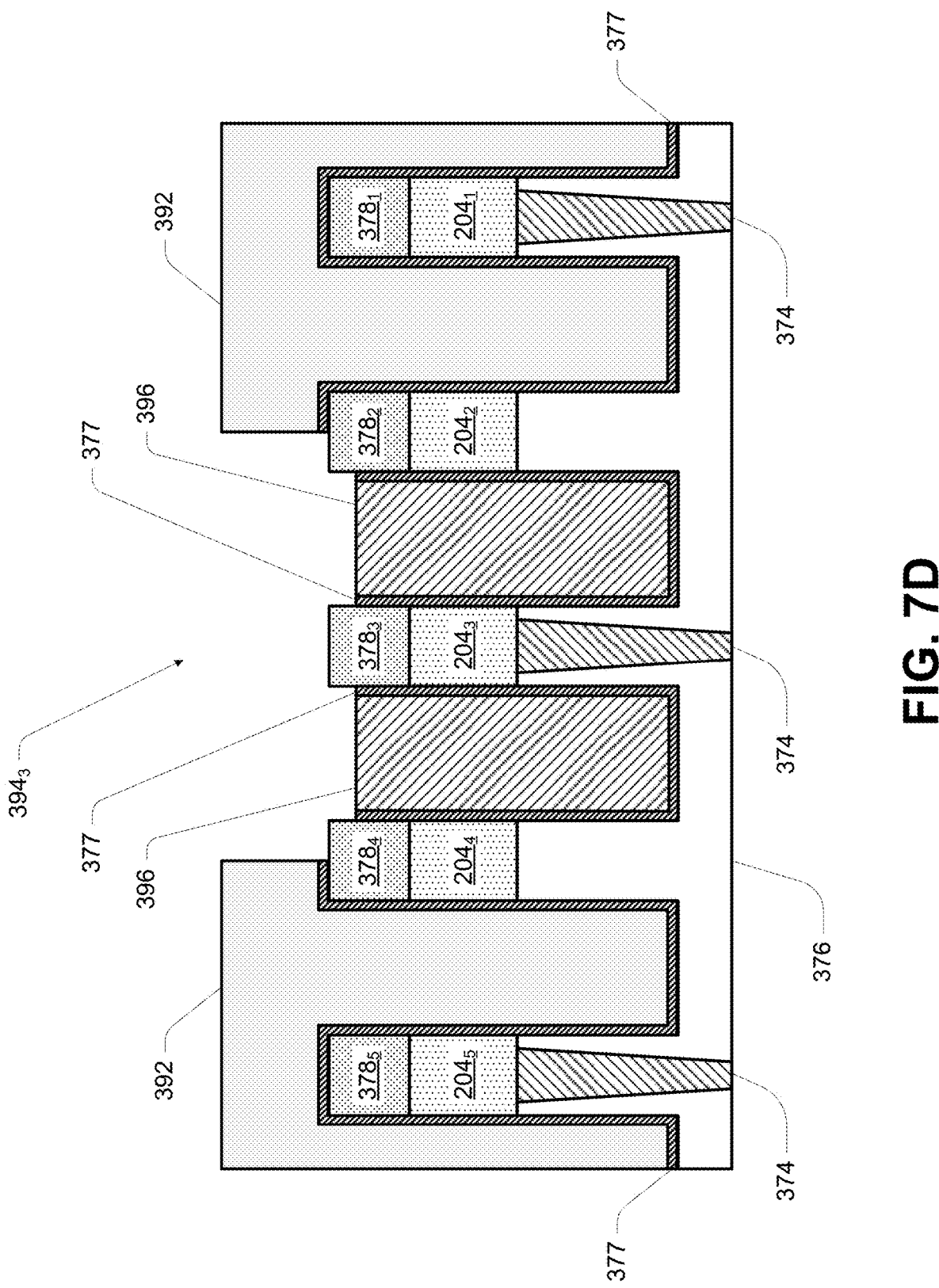

In FIGS. 6D and 7D, portions of the dielectric 396 might be removed to expose the sacrificial material 392, and might further be recessed below top surfaces of the corresponding dielectric caps 378 exposed by the openings 394. Removal of portions of the dielectric 396 might include isotropic or anisotropic removal processes. For example, the structure of FIGS. 6C and 7C might be subjected to an isotropic or anisotropic removal process for a particular time expected to recess the dielectric 396 below the top surfaces of the corresponding dielectric caps 378 exposed by the openings 394. The time expected to result in a desired level of recessing might, for example, be determined experimentally, empirically or through simulation. Isotropic removal processes might involve wet etching processes, e.g., exposing the structure of FIGS. 6C and 7C to a dilute hydrofluoric acid (HF) solution (e.g., 100:1 $H_2O$:HF). Isotropic removal processes might alternatively involve dry etching processes, e.g., exposing the structure of FIGS. 6C and 7C to an oxygen-rich plasma (e.g., 10-100% oxygen by volume). Anisotropic removal processes might involve reactive ion etching. Although the dielectric 396 is depicted to be recessed to a level between top and bottom surfaces of the corresponding dielectric caps 378 exposed by the openings 394, the dielectric 396 could be further recessed to expose portions of the corresponding data lines 204 underlying the dielectric caps 378. Recessing of the dielectric 396 might further remove portions of the dielectric liner 377 as depicted in FIG. 7D. Alternatively, the dielectric liner 377 might remain intact after recessing of the dielectric 396.

Figure 7E:
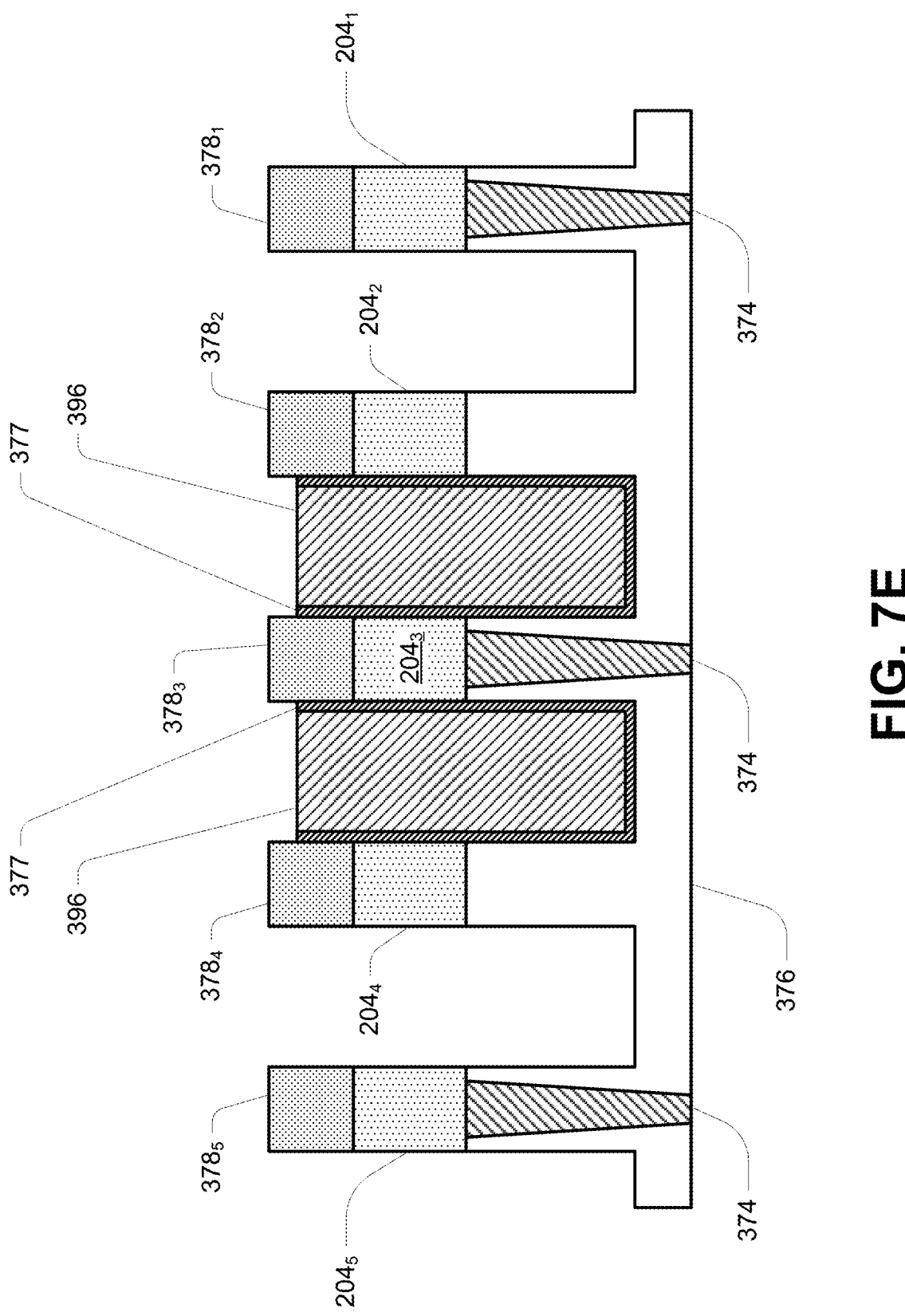
Figure 7F:
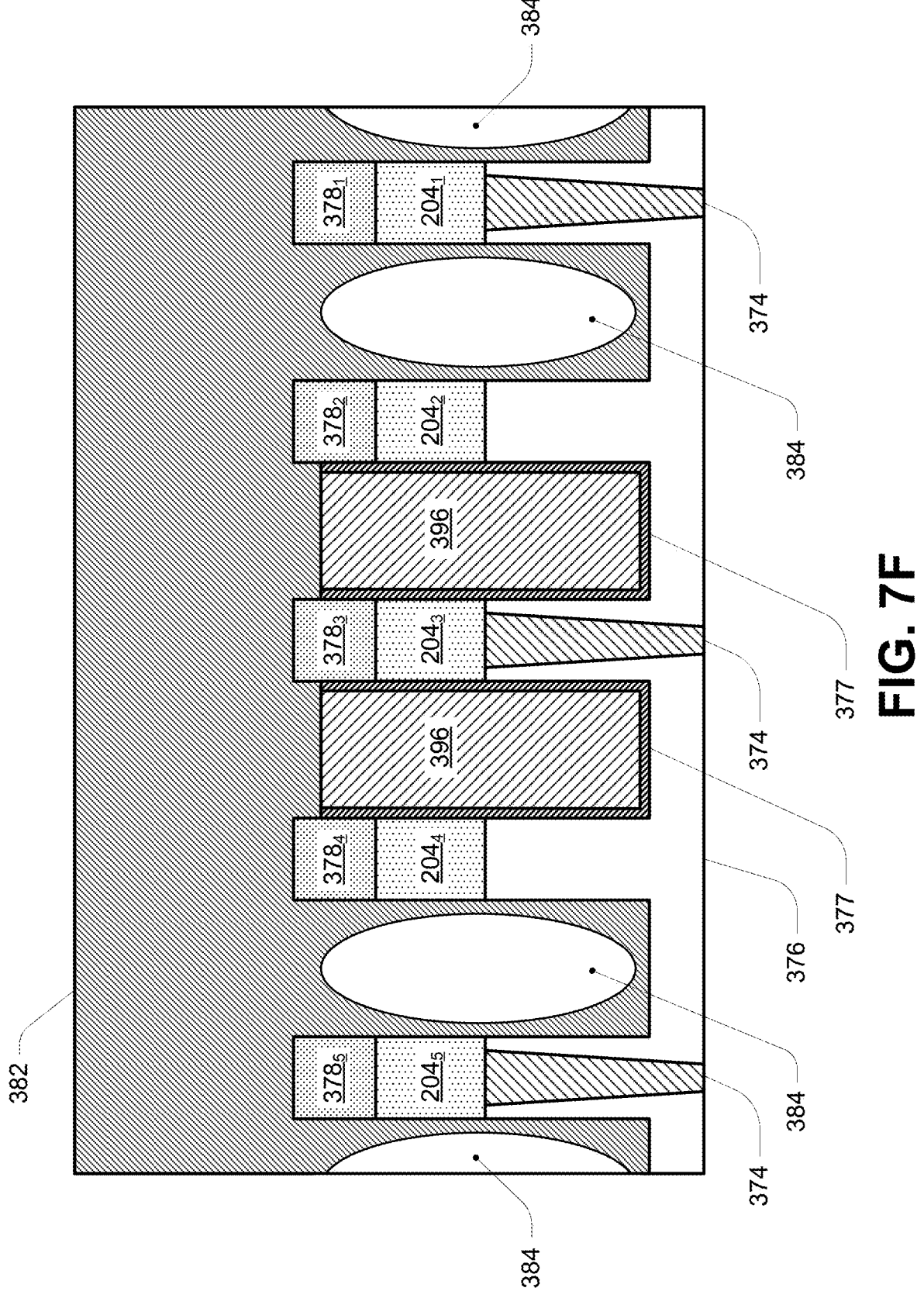

In FIGS. 6E and 7E, the sacrificial material 392 might be removed. Removal of the sacrificial material 392 might remove portions of the dielectric liner 377 as depicted in FIG. 7E. Alternatively, the dielectric liner 377 might remain intact after removal of the sacrificial material. In FIGS. 6F and 7F, a dielectric 382 might be formed overlying the structure of FIGS. 6E and 7E. The dielectric 382 is depicted to include voids 384, often referred to as air gaps, extending between instances of the dielectric caps 378, between instances of data lines 204, and between fins 390 of dielectric 376. The voids 384 represent areas of entrapped gaseous components within trenches (e.g., areas between adjacent dielectric caps 378, data lines 204, and fins 390 of the dielectric 376) resulting from forming the dielectric 382 overlying those trenches. While the voids 384 are depicted to be below uppermost surfaces of the dielectric caps 378, voids 384 could form to extend above the uppermost surfaces of the dielectric caps 378. Although referred to as air gaps, it will be understood that the voids 384 as defined herein may contain one or more gaseous components other than, or in addition to, ambient air. For example, a void 384 as defined herein may contain oxygen, nitrogen, argon, neon or other gaseous components compatible with (e.g., inert to) the surrounding structures, such as dielectric caps 378, data lines 204, and dielectric 376, or a gas containing a mixture of one or more such gaseous components. For some embodiments, the gas contained in a void 384 of the present disclosure might further be below atmospheric pressure. For some embodiments, where the dielectric 396 might be recessed to expose portions of the corresponding data lines 204 underlying the dielectric caps 378, the resulting spaces above the dielectric 396, e.g., spaces between the data lines 204$_3$ and 204$_2$ and between the data lines 204$_3$ and 204$_4$, might remain too shallow for the dielectric 382 to form voids between those portions of data lines 204.

Formation of the dielectric 382 might involve depositing a dielectric material of low conformability. For example, the dielectric 382 might comprise, consist of, or consist essentially of tetraethylorthosilicate (TEOS) or silane oxide. However, other dielectric materials having low conformability might alternatively be used. A dielectric material will be deemed to be of low conformability if it is expected to form voids between adjacent data lines 204 during formation of the dielectric 382 overlying the data lines 204, and is not expected to conform sufficiently to fill spaces between those adjacent data lines 204. That is, the conformability of the dielectric material being deposited to form the dielectric 382 is to be low enough that, during deposition, the dielectric material would pinch-off the spacing between the top surfaces of the dielectric caps 378 before the spacing between the data lines 204 is expected to be filled with that dielectric material, thus leaving voids 384. Note that as the width of the spacing between the dielectric caps 378 is reduced, the level of conformability can increase while still resulting in pinch-off during deposition, and thus still being deemed to be of low conformability for purposes on this disclosure. Although the dielectric 382 is depicted to be in contact with sidewalls of the data lines 204 and portions of the dielectric 376, the dielectric 382 might alternatively not contact sidewalls of the data lines 204, such that the voids 384 would extend the full width between adjacent data lines 204. Such voids 384 might further extend the full width between adjacent fins 390 of the dielectric 376. For example, during deposition, the dielectric material of the dielectric 382 might pinch off the spacing between the dielectric caps 378 before any of that dielectric material reaches the data lines 204 or the dielectric 376.

Figure 7G:
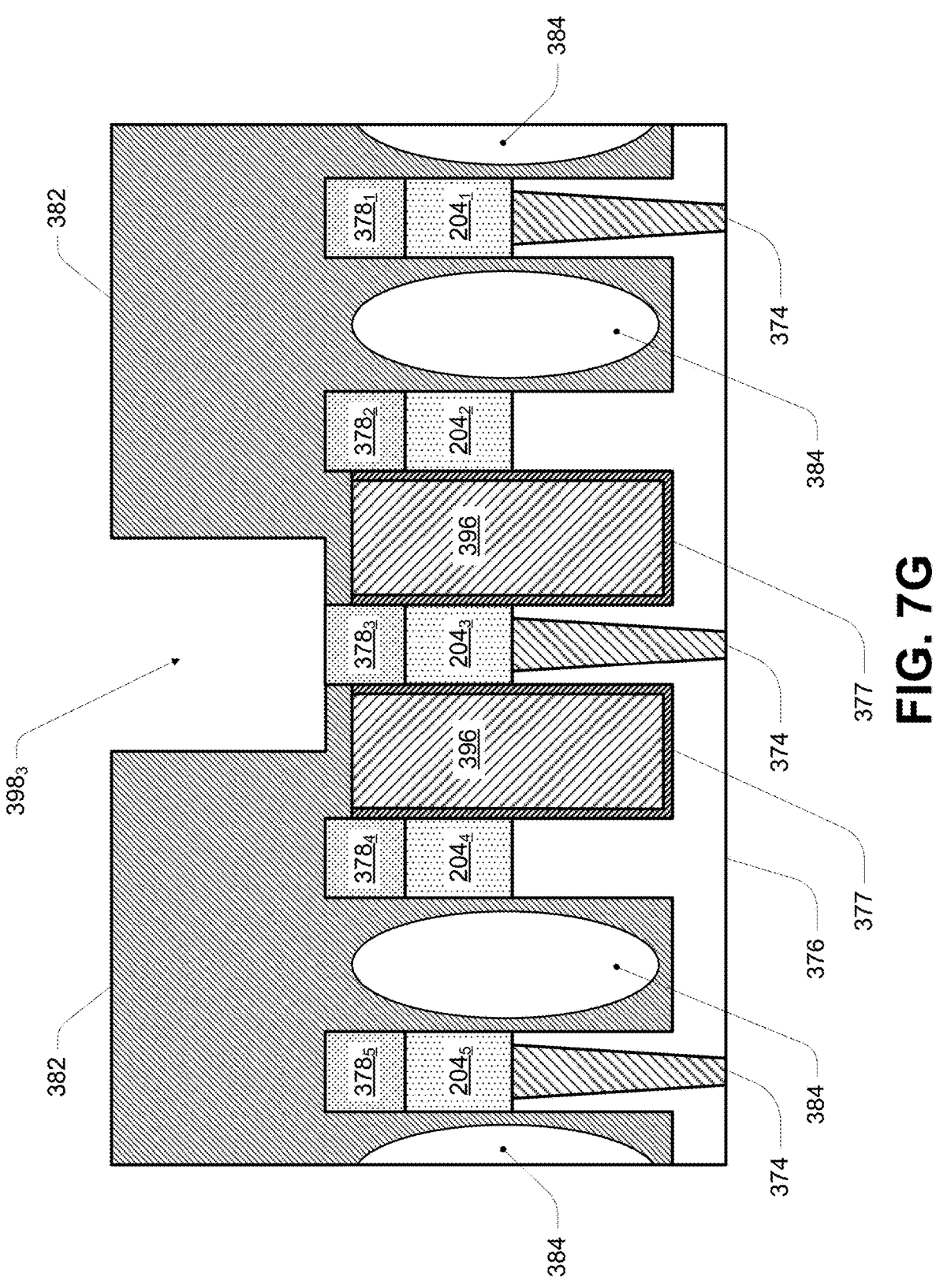
Figure 7H:
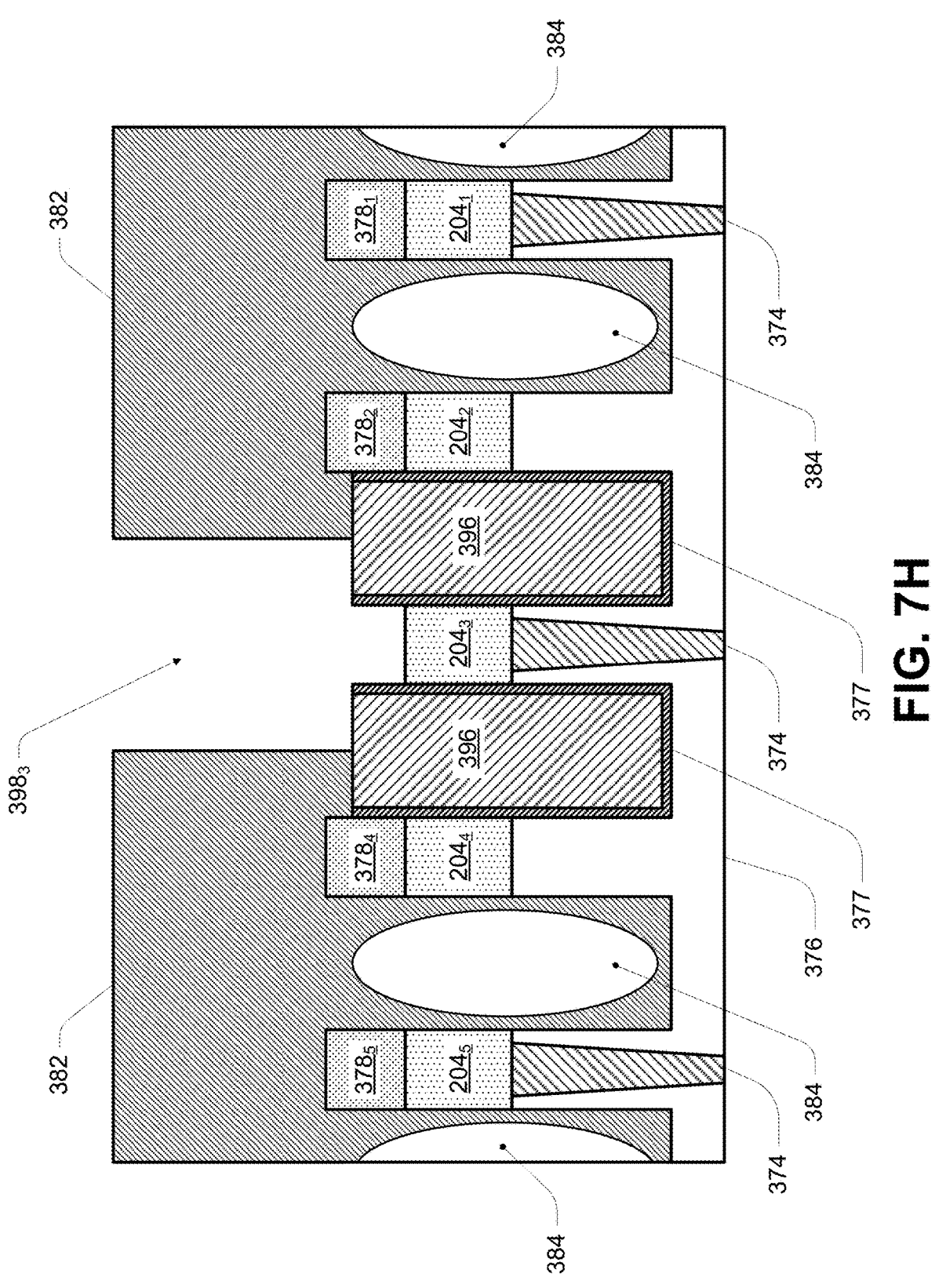

In FIGS. 6G and 7G, the dielectric 382 might be patterned to define openings 398, e.g., openings 398$_1$-398$_5$. For example, a patterned mask (not shown) might be formed overlying (e.g., on) the dielectric 382 to expose areas of the dielectric 382 for removal, e.g., areas of the openings 398. The dielectric 382 in the areas of the openings 398$_1$-398$_5$ might be recessed to expose corresponding portions (e.g., top surfaces) of dielectric caps 378$_1$-378$_5$, respectively. In FIGS. 6H and 7H, the exposed portions of the dielectric caps 378$_1$-378$_5$ in the openings 398$_1$-398$_5$, respectively, might be removed to expose corresponding portions (e.g., top surfaces) of data lines 204$_1$-204$_5$, respectively. Note that this might further recess the dielectric 382 in the areas of the openings 398 to expose portions of the dielectric 396, although exposure of the dielectric 396 is not necessary. For some embodiments, the removal process, e.g., an isotropic or anisotropic removal process, used to remove the dielectric caps 378 might further tend to remove materials of the dielectric 382, the dielectric 396, and/or the dielectric liner 377, which might further expose sidewall portions of the corresponding data lines 204.

Figure 7I:
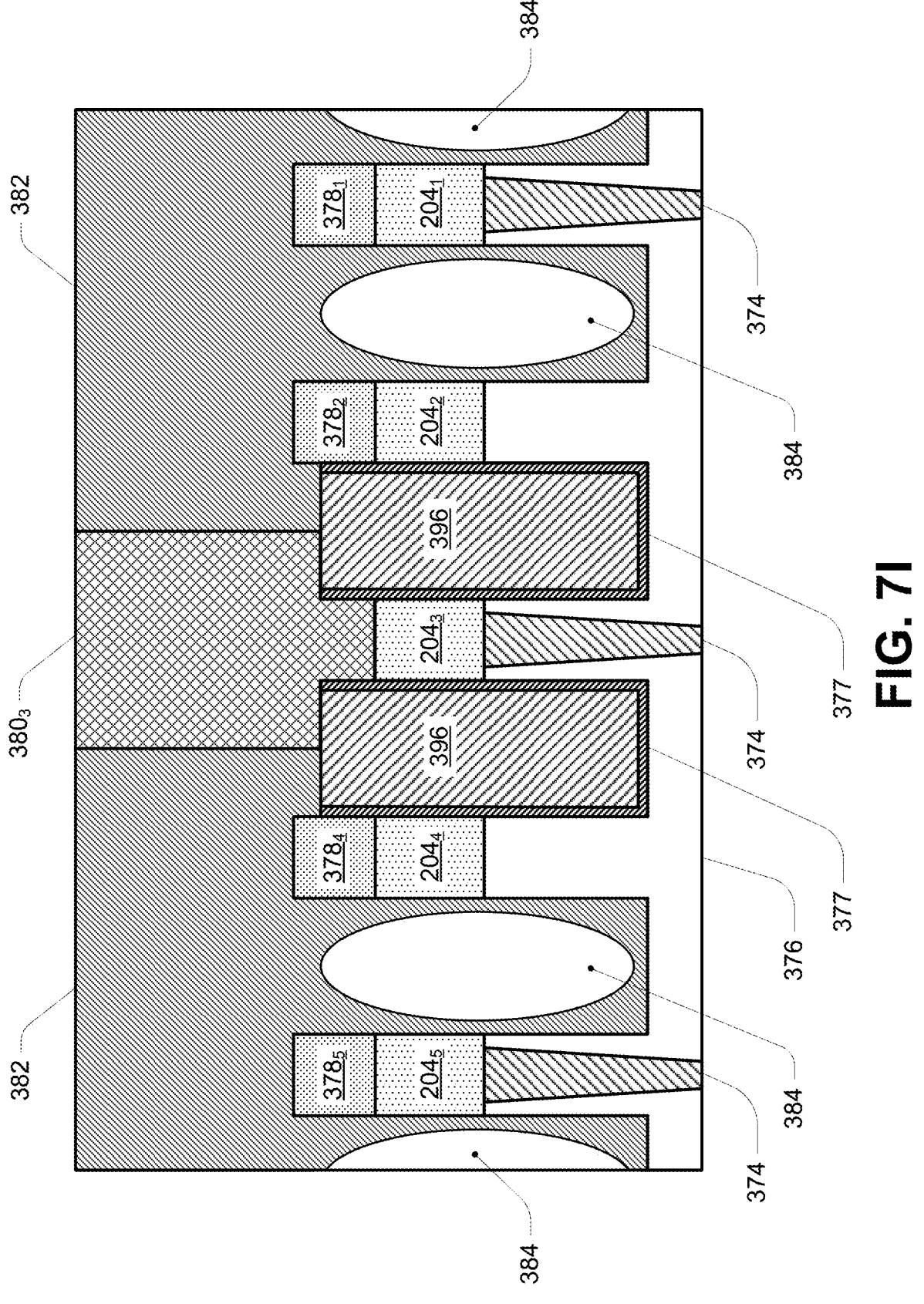

In FIGS. 6I and 7I, top contacts 380$_1$-380$_5$ might be formed in the openings 398$_1$-398$_5$, respectively, to be in contact with data lines 204$_1$-204$_5$, respectively. Each top contact 380 might be formed of one or more conductive materials. Each top contact 380 might comprise, consist of, or consist essentially of conductively doped polysilicon and/or might comprise, consist of, or consist essentially of metal, such as a refractory metal, or a metal-containing material, such as a refractory metal silicide or a metal nitride, e.g., a refractory metal nitride, as well as any other conductive material. As one example, each top contact 380 might include tungsten (W) formed overlying a corresponding data line 204, and titanium nitride (TiN) formed overlying the tungsten.

As can be seen in a comparison of FIGS. 5C and 7I, with the inclusion of the dielectric 396 (with or without the dielectric liner 377), e.g., a solid dielectric spanning a width (e.g., left to right in FIG. 7I) of the spacing between adjacent data lines 204, the risk of breaching a void 384 might be mitigated. While the solid dielectric 396 (with or without the dielectric liner 377) might not provide identical performance characteristics to a void 384 with respect to capacitive coupling between adjacent data lines, selection of a dielectric material having a low dielectric constant for the dielectric 396 might mitigate this minor sacrifice.

Figure 8:
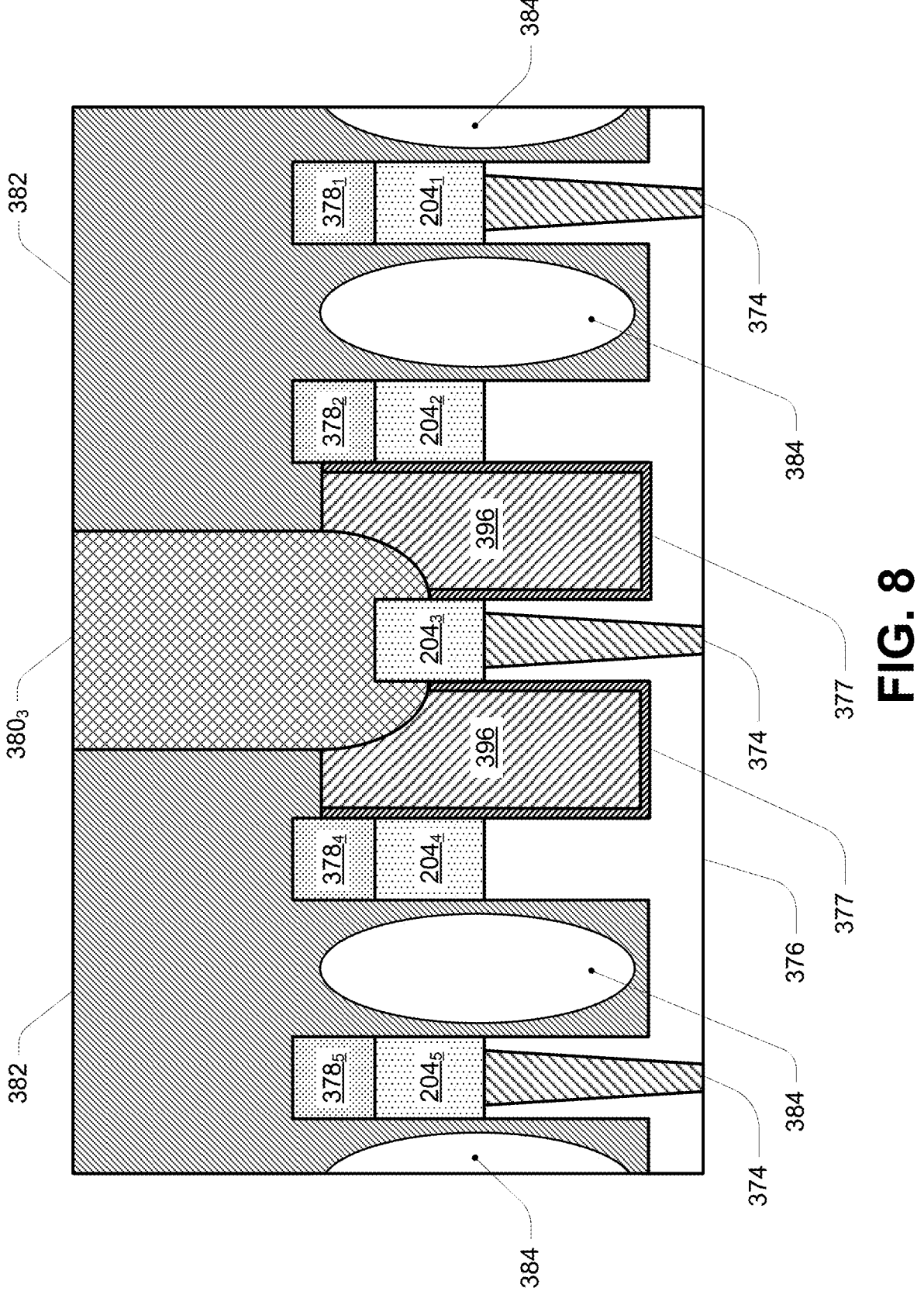
FIG. 8 depicts a cross-sectional view of a memory array structure in accordance with another embodiment.

As noted with respect to FIG. 7H, the removal of portions of the dielectric caps 378 might recess the dielectric 382, the dielectric 396, and/or the dielectric liner 377 in the areas of the openings 398 to expose portions of the corresponding data lines 204. FIG. 8 depicts a resulting structure consistent with this embodiment. Like numbered elements in FIG. 8 correspond to the description as provided with respect to FIGS. 7A-7I. Note that such an embodiment provides for additional contact area between a top contact 380, e.g., top contact 380$_3$, and a corresponding portion of a data line 204, e.g., data line 204$_3$.

Figure 9:
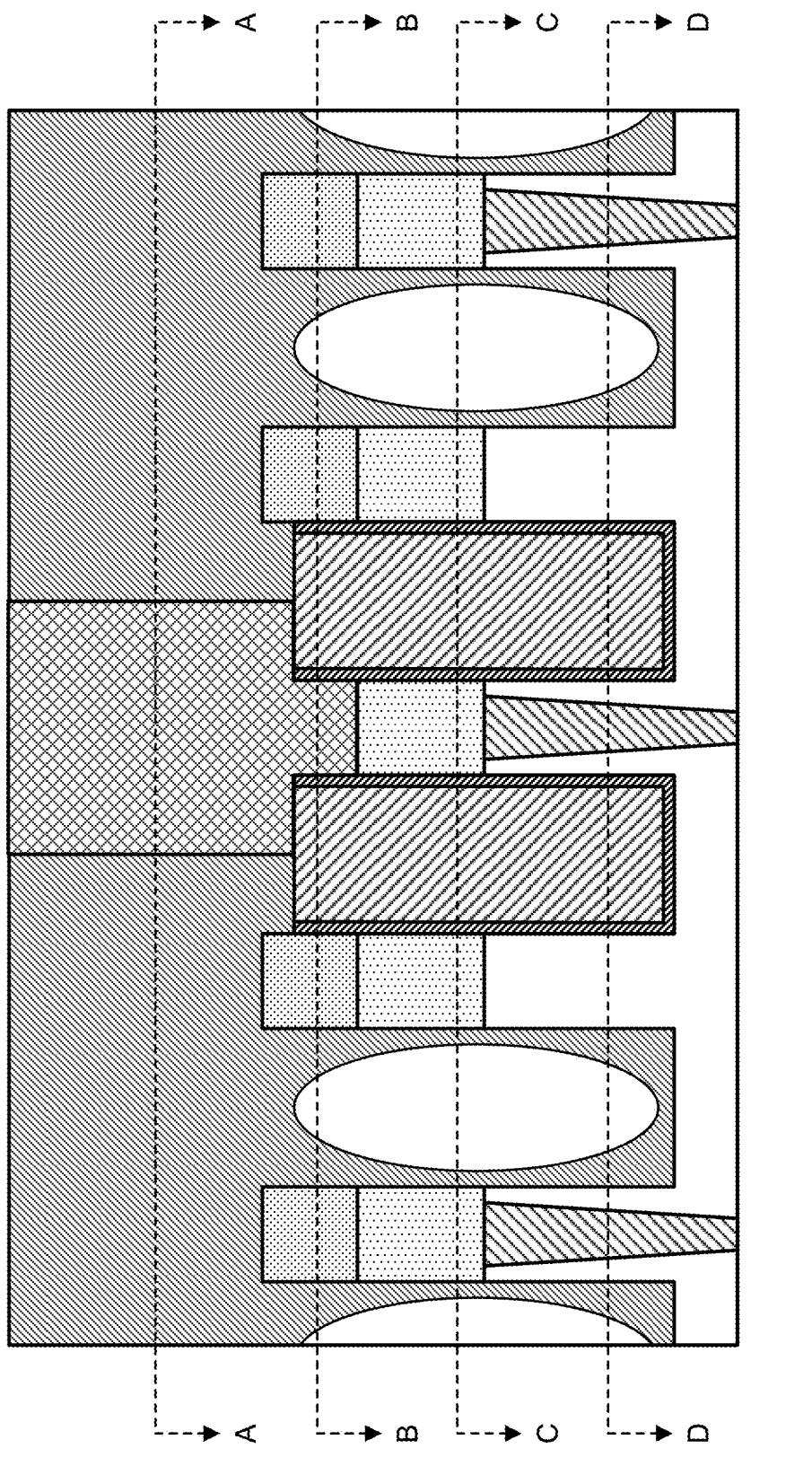
FIG. 9 depicts the cross-sectional view of the memory array structure of FIG. 7I for use in discussing FIGS. 10A-10D.
Figure 10A:
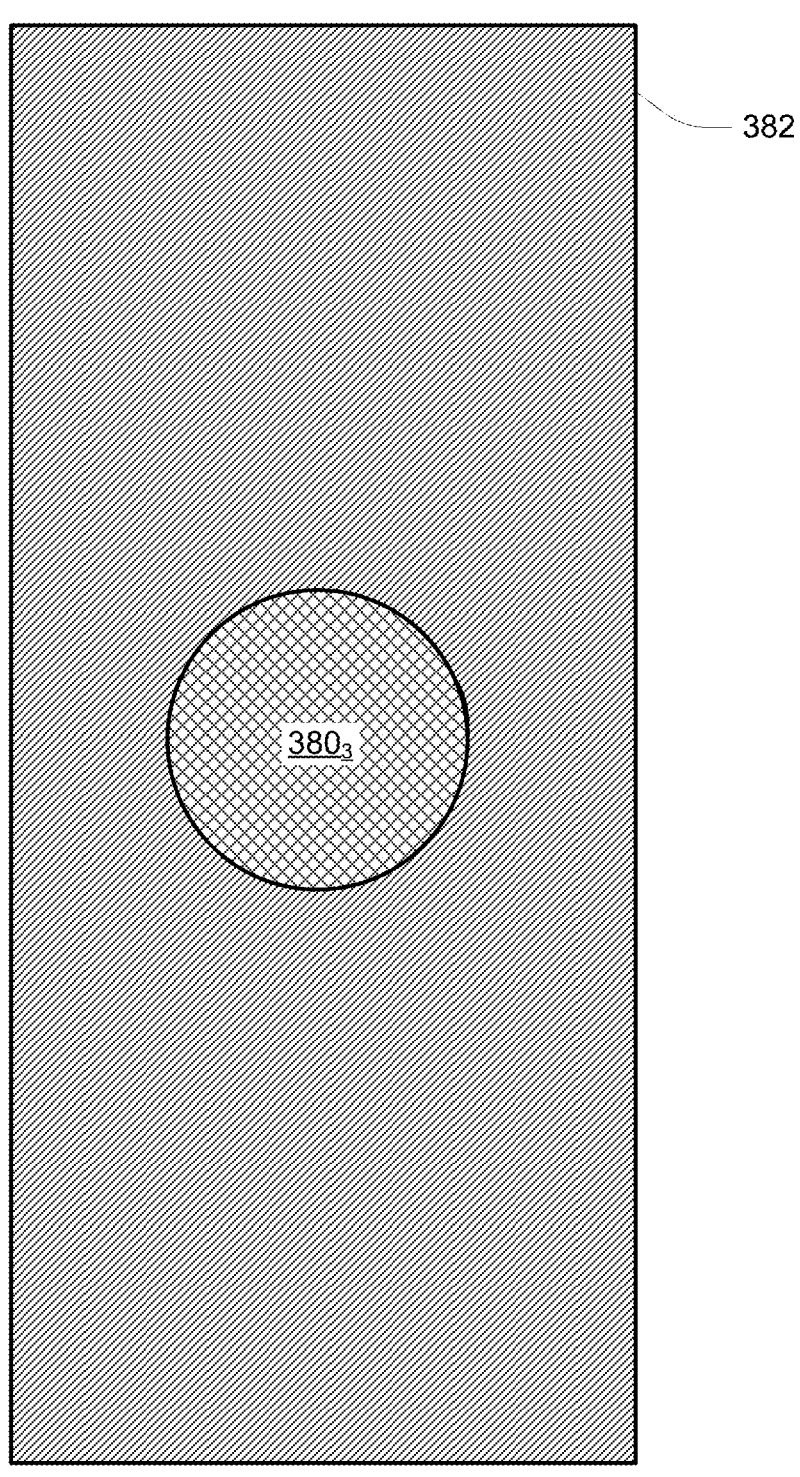
FIGS. 10A-10D depict cross-sectional views of the memory array structure of FIG. 7I.
Figure 10B:
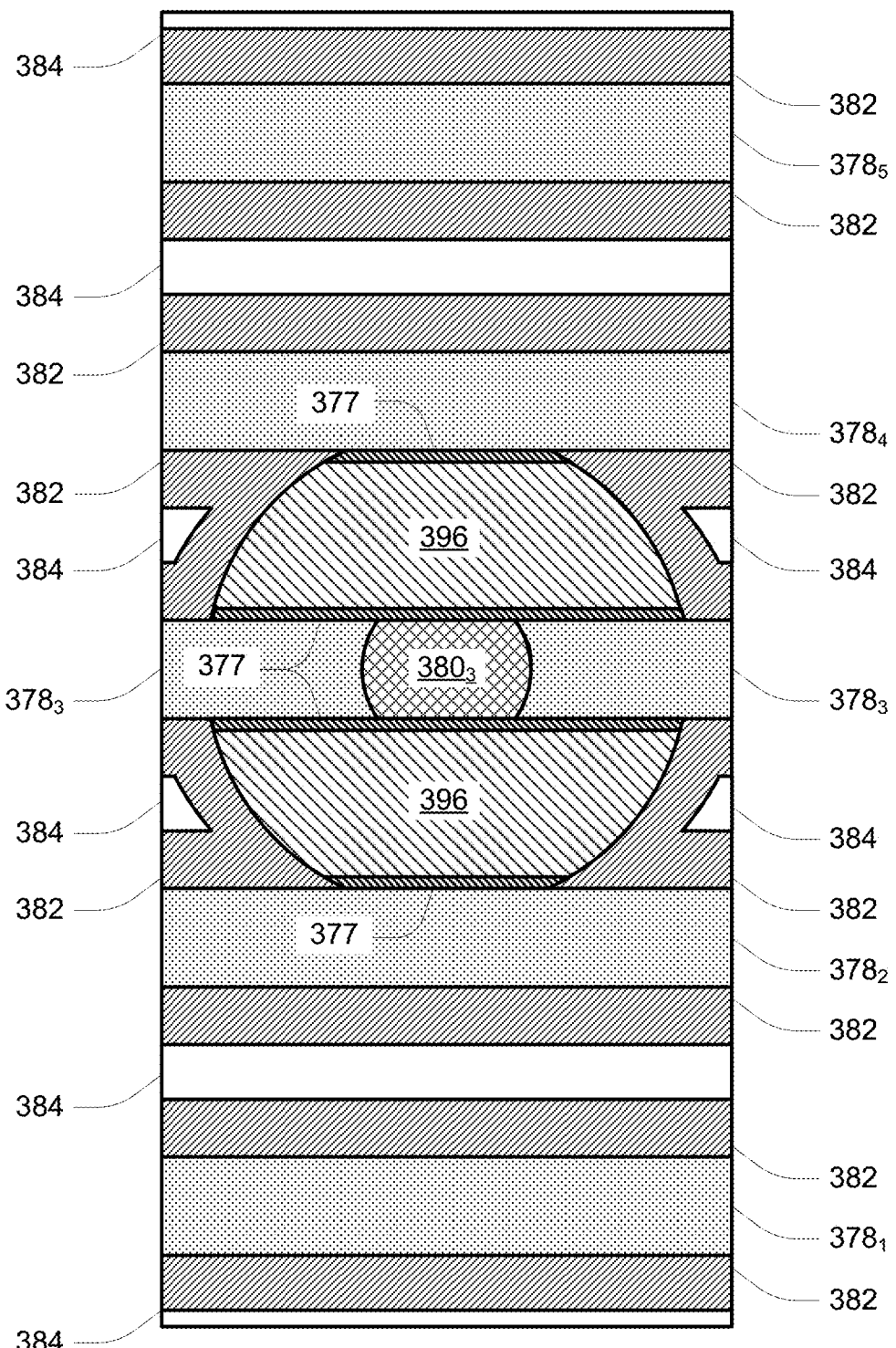
Figure 10C:
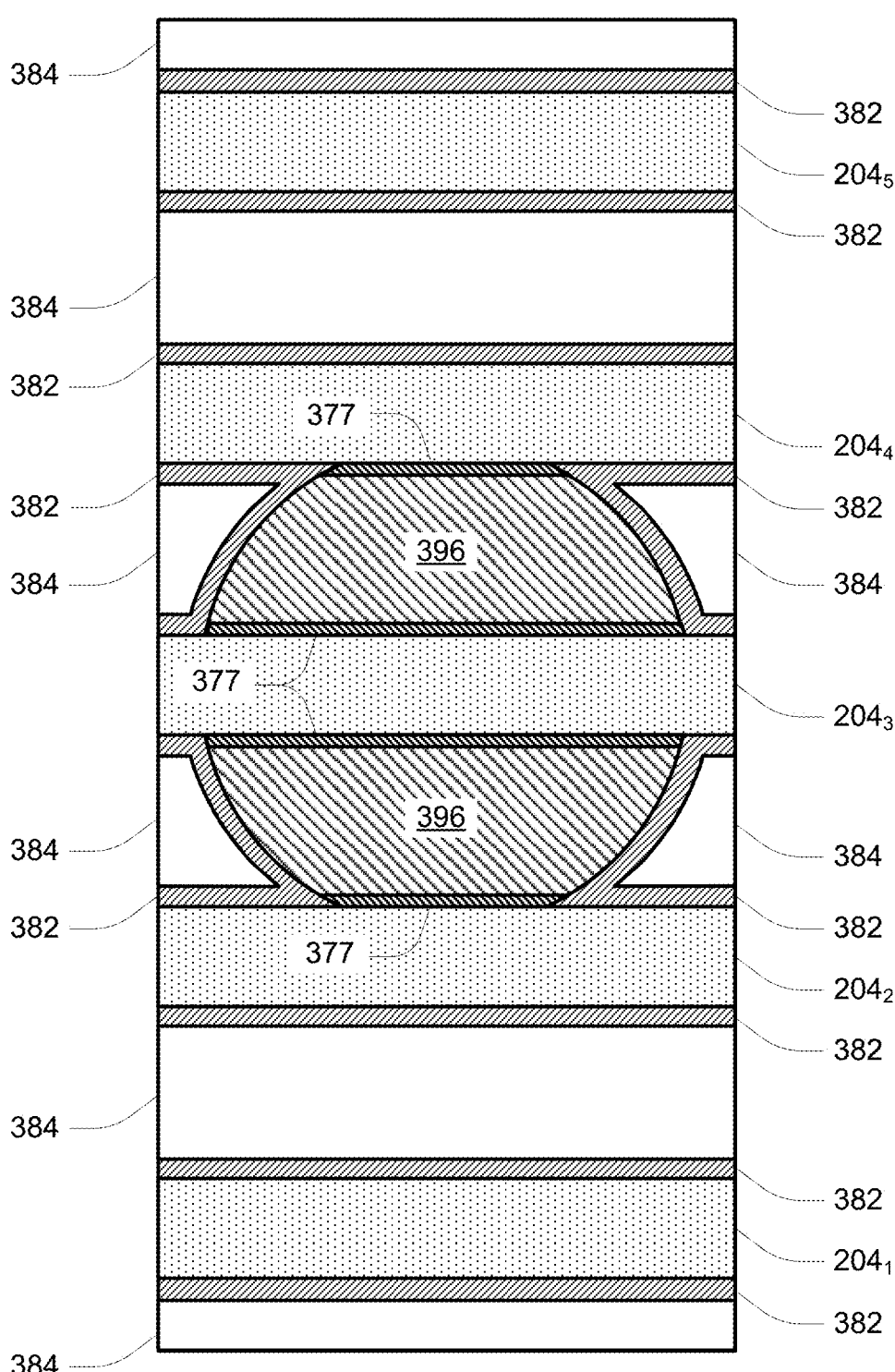
Figure 10D:
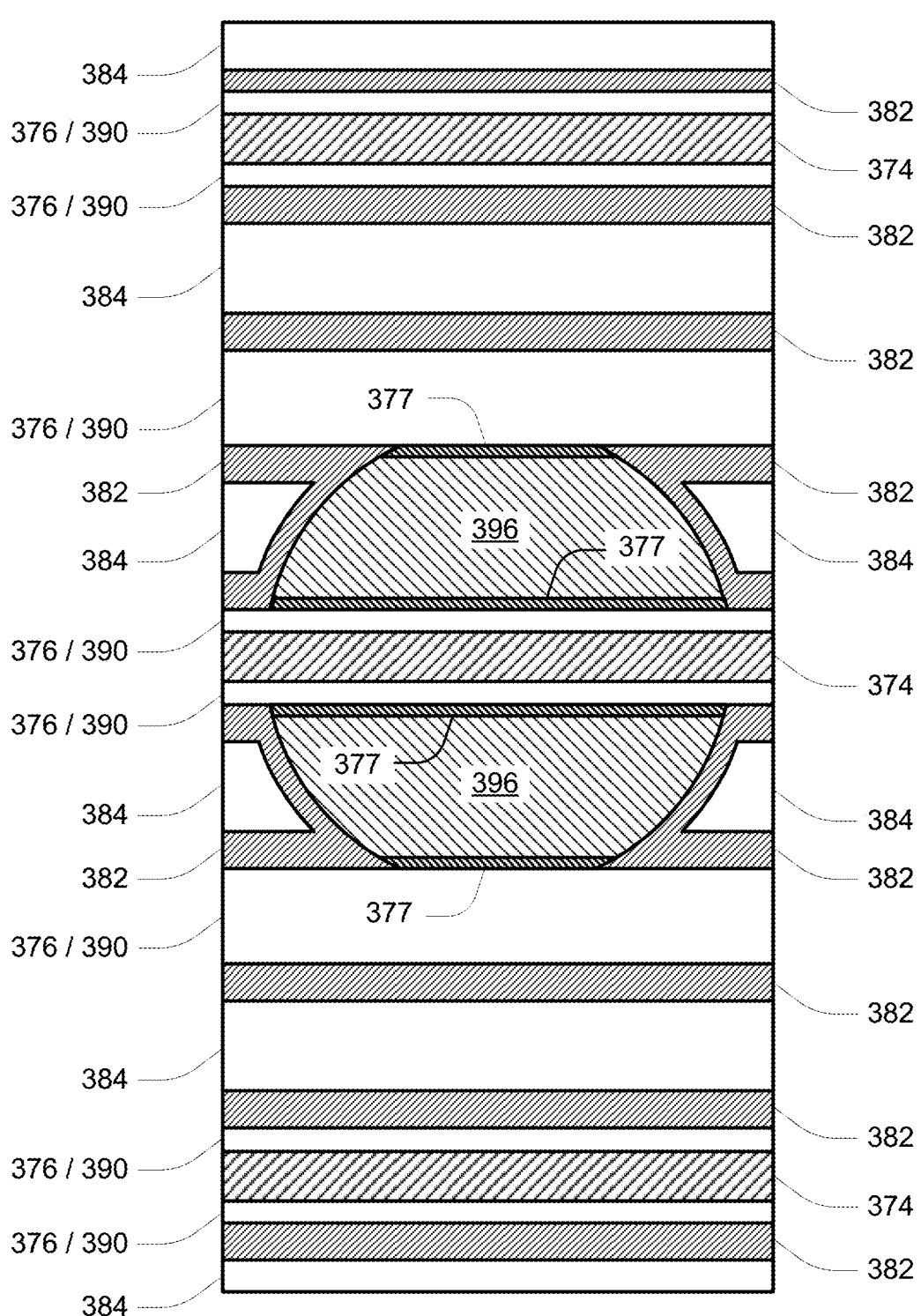

FIG. 9 depicts the memory array structure of FIG. 7I with cross-sections indicated for use in describing FIGS. 10A-10D. For clarity, reference numbers of FIG. 7I are removed from FIG. 9. For example, FIG. 10A depicts a top view of a cross-section of FIG. 9 taken at line A-A, FIG. 10B depicts a top view of a cross-section of FIG. 9 taken at line B-B, FIG. 10C depicts a top view of a cross-section of FIG. 9 taken at line C-C, and FIG. 10D depicts a top view of a cross-section of FIG. 9 taken at line D-D. For clarity, reference numbers are not depicted in FIG. 9. FIGS. 10A-10D are generally drawn to a same scale.

While the top contact 380$_3$ is depicted to have a circular outline in FIG. 10A, other shapes could be utilized. Similarly, although the dielectric 396 in FIG. 10B is depicted to have a generally circular outline, e.g., being formed in circular openings 394, it also could utilize other shapes, e.g., openings 394 having cross-sections other than circular.

FIG. 10B depicts the dielectric 396 and dielectric liner 377 to be (e.g., to collectively be) a solid dielectric spanning a width (e.g., top to bottom in FIG. 10B) of the spacing between adjacent dielectric caps 378, e.g., the spacing between the dielectric cap 378$_3$ and the dielectric cap 378$_2$, and the spacing between the dielectric cap 378$_3$ and the dielectric cap 378$_4$. Similarly, FIG. 10C depicts the dielectric 396 and dielectric liner 377 to be (e.g., to collectively be) a solid dielectric spanning a width (e.g., top to bottom in FIG. 10C) of the spacing between adjacent data lines 204, e.g., the spacing between the data line 204$_3$ and the data line 204$_2$, and the spacing between the data line 204$_3$ and the data line 204$_4$. Furthermore, FIG. 10D depicts the dielectric 396 and dielectric liner 377 to be (e.g., to collectively be) a solid dielectric spanning a width (e.g., top to bottom in FIG. 10D) of the spacing between adjacent fins 390 of the dielectric 376. Such portions of the dielectric 396 might surround a corresponding top contact 380, e.g., top contact 380$_3$ in the example of FIGS. 10A-10D, such that breach of a void 384 during formation of the top contact 380 might be mitigated. As used herein, an instance of the dielectric 396, or dielectric 396 and dielectric liner 377, will be deemed to be solid if a cross-section extending orthogonally between its corresponding data lines 204 contains no voids. For example, a cross-section of the dielectric 396 and dielectric liner 377 taken in a plane orthogonal to a length of adjacent data lines 204$_3$ and 204$_2$ (e.g., a length extending left to right in FIG. 10C), anywhere along an interface between the dielectric liner 377 and the corresponding top contact 380$_3$ as depicted in FIG. 10B, will result in a cross-section such as depicted in FIG. 7I, with no voids between those data lines 204, e.g., a cross-section bounded in a first direction from uppermost surfaces of the adjacent data lines 204 to lowermost surfaces of the adjacent data lines 204, and in a second direction from a sidewall of one of the adjacent data lines 204 to a sidewall of the other one of the adjacent data lines 204.

As is depicted in FIGS. 10B-10D, voids 384 might be formed on either side of these portions of the dielectric 396, e.g., between portions of adjacent instances of dielectric caps 378, data lines 204, and fins 390 of the dielectric 376 that are not separated by instances of the dielectric 396. For example, adjacent data lines 204 might be separated by dielectric 382 containing voids 384 along portions of those data lines 204 not separated by an instance of dielectric 396. Although various figures depict formation of the top contact 380$_3$ overlying and in contact with a portion of the data line 204$_3$ that is overlying a portion of a fin 390 of the dielectric 376 containing a contact (e.g., contact via) 374, such top contacts 380 might make contact to a corresponding data line 204 in an area not overlying a contact 374. Note that the footprint of a top contact 380 (e.g., the view of top contact 380$_3$ in FIG. 10A) might be less than, and might further be entirely contained within, the footprint of the underlying instances of the dielectric 396 (e.g., an outline of an area occupied by the instances of the dielectric 396 in FIG. 10B).

Figure 11A:
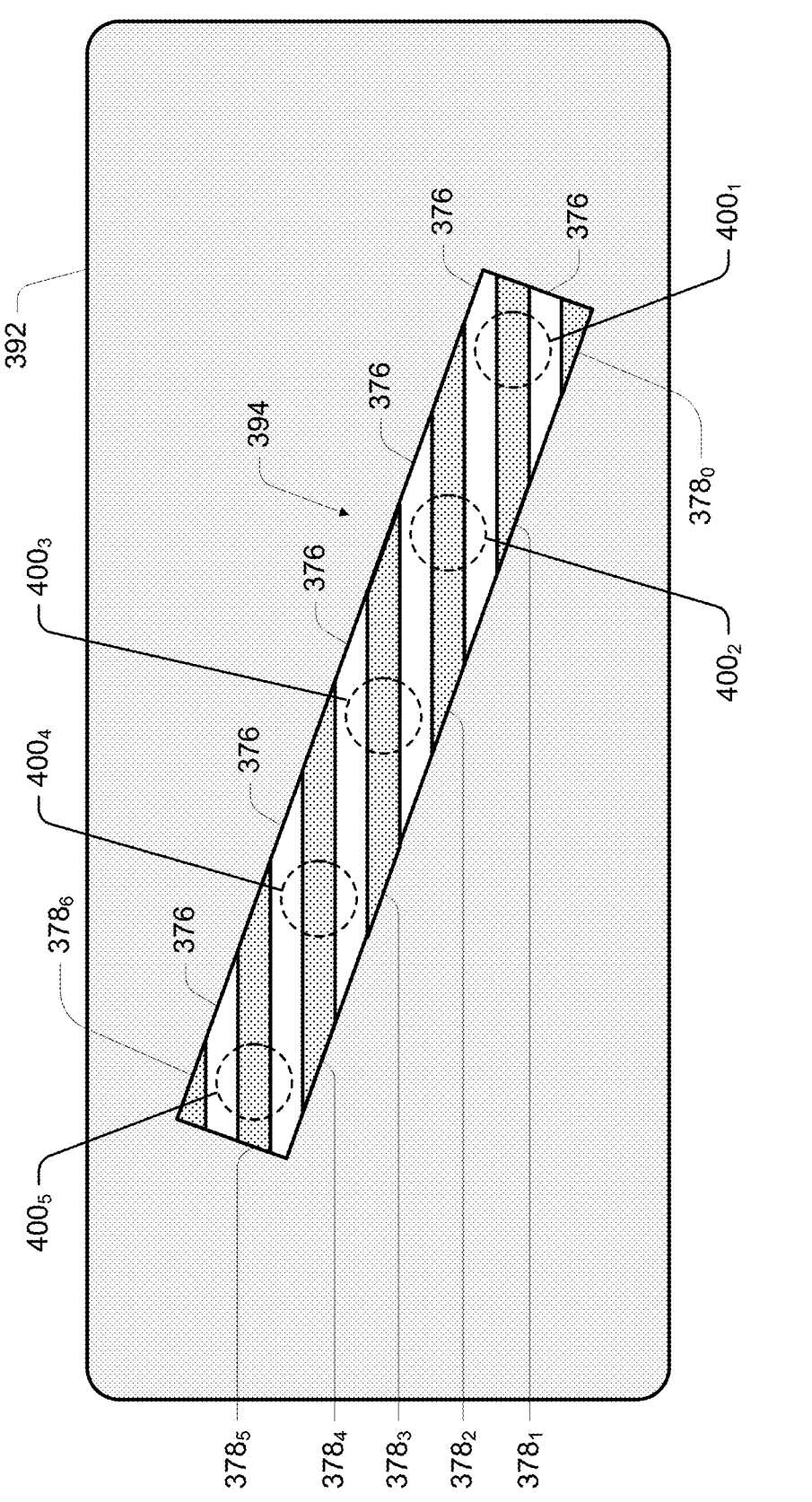
FIGS. 11A-11C depict alternative openings defining areas for formation of instances of dielectric over which top contacts might be formed in accordance with further embodiments.
Figure 11B:
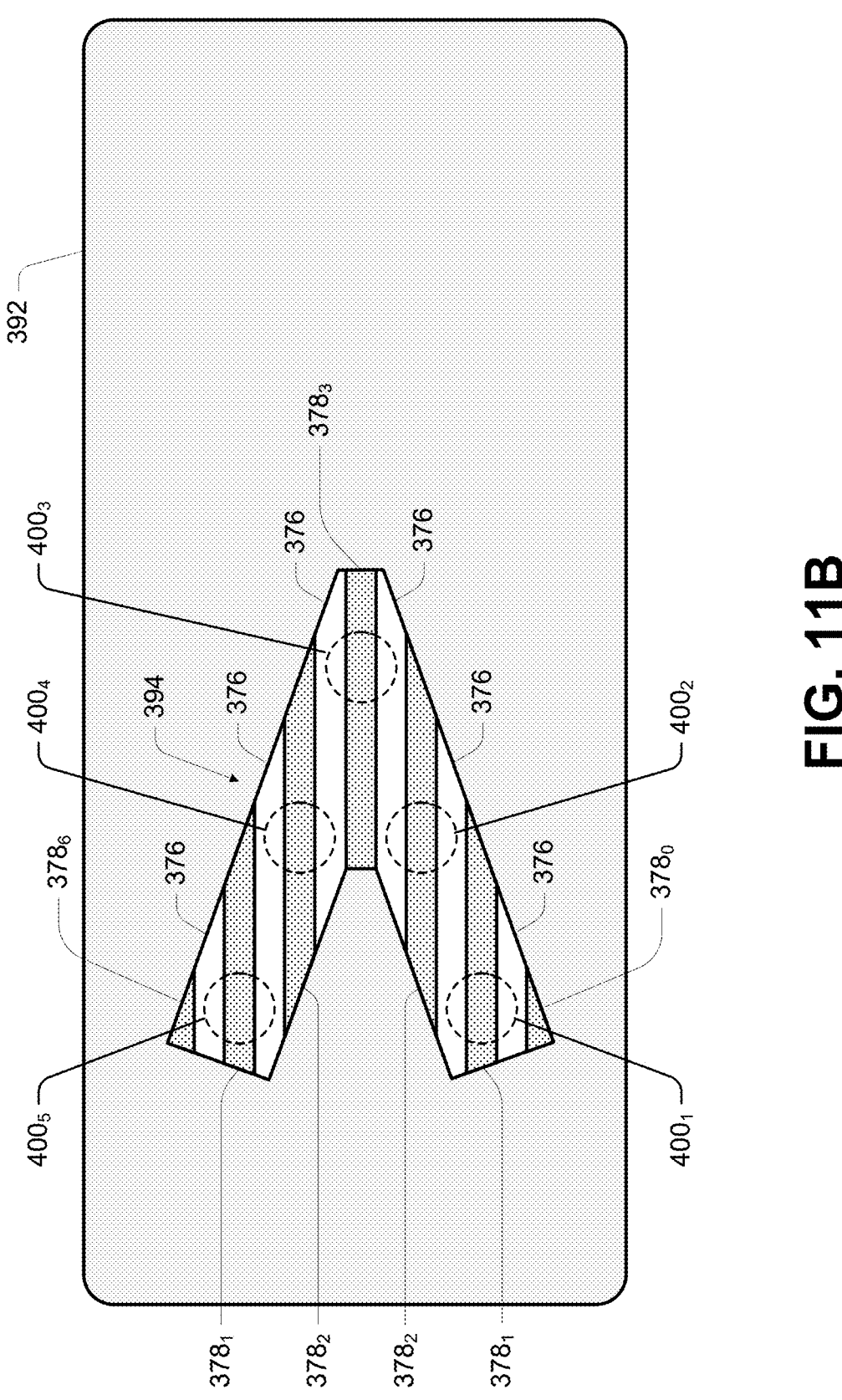
Figure 11C:
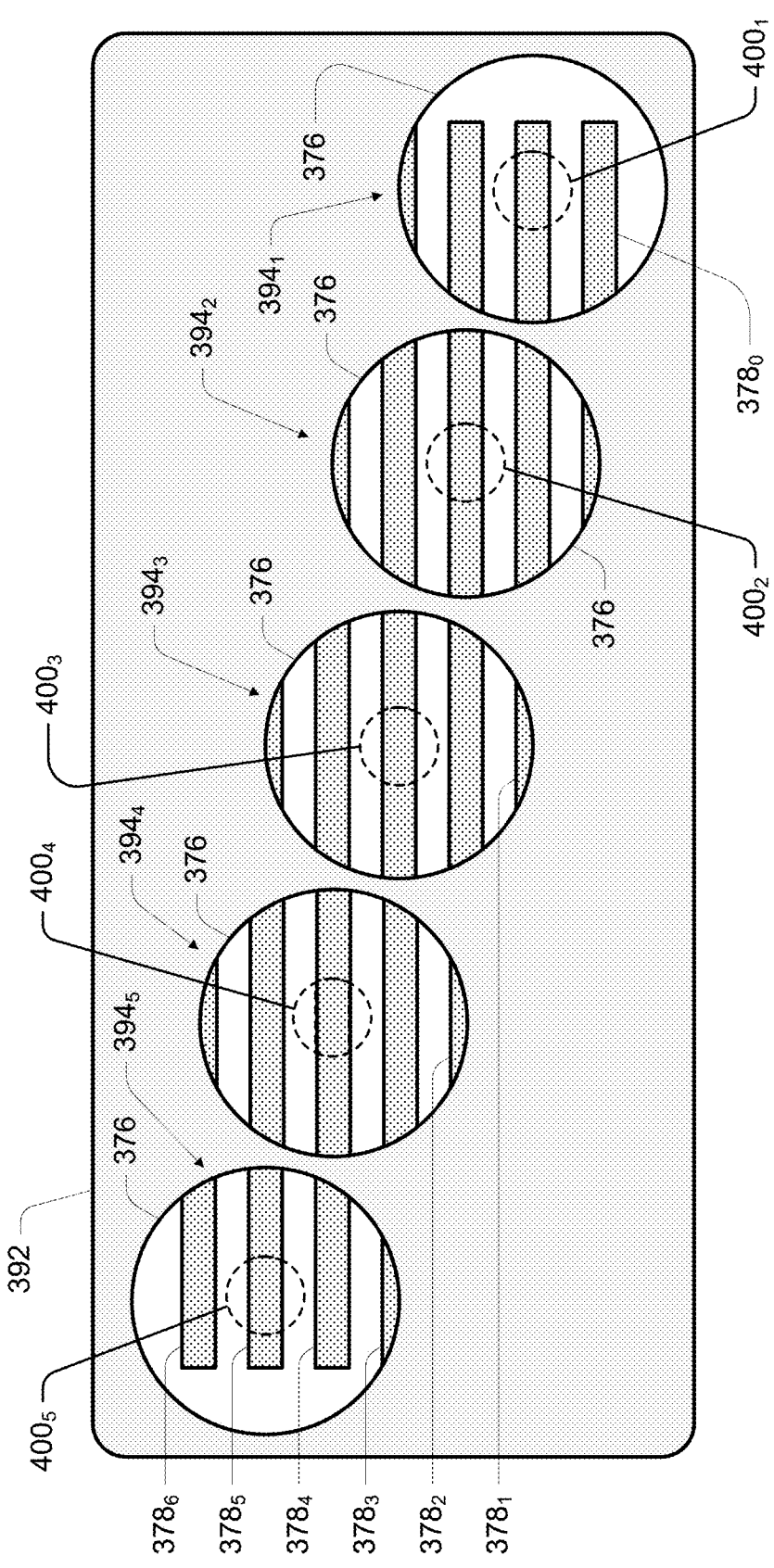

In FIG. 6B, individual openings 394$_1$-394$_5$ were formed defining areas for formation of instances of dielectric 396 corresponding to future top contacts 380$_1$-380$_5$, respectively. However, individual openings 394 for each top contact 380 are not required. FIGS. 11A-11B depict alternative openings 394 defining areas for formation of instances of dielectric 396 over which top contacts 380 might be formed. In addition, openings 394 could be formed to expose additional structures, e.g., they could be formed to be larger than those depicted in FIG. 6B. FIG. 11C depicts alternative openings 394 defining areas for formation of instances of dielectric 396 over which top contacts 380 might be formed.

In FIG. 11A, a single opening 394 might be patterned into the sacrificial material 392, exposing areas between adjacent dielectric caps 378$_6$ and 378$_5$, between adjacent dielectric caps 378$_5$ and 378$_4$, between adjacent dielectric caps 378$_4$ and 378$_3$, between adjacent dielectric caps 378$_3$ and 378$_2$, between adjacent dielectric caps 378$_2$ and 378$_1$, and between adjacent dielectric caps 378$_1$ and 378$_0$. The single opening 394 of FIG. 11A might be generally rectangular. The structure of FIG. 11A might be formed as described with reference to FIGS. 6A-6B and FIGS. 7A-7B, but changing the patterning of the sacrificial material 392 to the shape of the opening 394 of FIG. 11A. Subsequent processing could continue as described with reference to FIGS. 6C-6I and FIGS. 7C-7I. Dashed elements 400$_1$-400$_5$ might represent locations of future top contacts 380$_1$-380$_5$, respectively.

In FIG. 11B, a single opening 394 might be patterned into the sacrificial material 392, exposing areas between adjacent dielectric caps 378$_6$ and 378$_5$, between adjacent dielectric caps 378$_5$ and 378$_4$, between adjacent dielectric caps 378$_4$ and 378$_3$, between adjacent dielectric caps 378$_3$ and 378$_2$, between adjacent dielectric caps 378$_2$ and 378$_1$, and between adjacent dielectric caps 378$_1$ and 378$_0$. The single opening 394 of FIG. 11B might be generally angular. The structure of FIG. 11B might be formed as described with reference to FIGS. 6A-6B and FIGS. 7A-7B, but changing the patterning of the sacrificial material 392 to the shape of the opening 394 of FIG. 11B. Subsequent processing could continue as described with reference to FIGS. 6C-6I and FIGS. 7C-7I, although moving the locations of the openings 398$_1$ and 398$_2$ to overlie portions of the dielectric caps 378$_1$ and 378$_2$, respectively, exposed by the opening 394 of FIG. 11B. Dashed elements 400$_1$-400$_5$ might represent locations of future top contacts 380$_1$-380$_5$, respectively. Other patterns of openings 394 might alternatively be used.

Although the embodiment of FIGS. 6A-6I and 7A-7I might result in dielectric 382 having voids 384 between instances of the dielectric 396 (e.g., note exposed areas of dielectric 376 that would be between adjacent data lines 204 and between instances of the dielectric 396 separating those adjacent data lines 204 in FIGS. 6E and 7E), the embodiments of FIGS. 11A and 11B might not contain voids 384 between instances of dielectric 396. For example, the embodiment of FIGS. 6A-6I and 7A-7I might result in individual instances of the dielectric 396 between adjacent data lines 204 for each top contact 380. However, for the embodiments of FIGS. 11A and 11B, a single instance of the dielectric 396 could span a sufficient length of two adjacent data lines 204 to provide isolation for two top contacts 380 with no intervening void 384. For example, in FIG. 11A, an instance of dielectric 396 might be formed in an area of the exposed dielectric 376 between dielectric caps 378$_5$ and 378$_4$ (e.g., between data lines 204$_5$ and 204$_4$) that would provide isolation for future top contacts 380 formed in the areas of the dashed elements 400$_5$ and 400$_4$ with no intervening voids 384 to be formed in the areas of the dashed elements 400$_5$ and 400$_4$.

In FIG. 11C, individual openings 394 might expose portions of more than three dielectric caps 378, and might thus expose a full width of more than one dielectric cap 378. For example, in FIG. 11C, opening 394$_1$ might expose respective portions of dielectric caps 378$_0$, 378$_1$, 378$_2$ and 378$_3$; opening 394$_2$ might expose respective portions of dielectric caps 378$_0$, 378$_1$, 378$_2$, 378$_3$ and 378$_4$; opening 394$_3$ might expose respective portions of dielectric caps 378$_1$, 378$_2$, 378$_3$, 378$_4$ and 378$_5$; opening 394$_4$ might expose respective portions of dielectric caps 378$_2$, 378$_3$, 378$_4$, 378$_5$ and 378$_6$; and opening 394$_5$ might expose respective portions of dielectric caps 378$_3$, 378$_4$, 378$_5$ and 378$_6$. The structure of FIG. 11C might be formed as described with reference to FIGS. 6A-6B and FIGS. 7A-7B, but changing the patterning of the sacrificial material 392 to the size of the openings 394 of FIG. 11C. Subsequent processing could continue as described with reference to FIGS. 6C-6I and FIGS. 7C-7I. Dashed elements 400$_1$-400$_5$ might represent locations of future top contacts 380$_1$-380$_5$, respectively. Other shapes and sizes of openings 394 might alternatively be used.

FIG. 12 is a flowchart of a method of fabricating a memory array structure in accordance with an embodiment. At 1201, a plurality of data lines might be formed. Each data line of the plurality of data lines might be selectively connected to a respective plurality of memory cells. For example, the plurality of data lines might be formed as described with reference to FIGS. 6A and 7A. Each of these data lines might be selectively connected to a respective plurality of strings of series-connected memory cells as described with reference to FIGS. 2B, 2C and 4.

At 1203, a solid dielectric material might be formed between a first portion of a first data line of the plurality of data lines and a first portion of a second data line of the plurality of data lines. For example, instances of the dielectric 396 might be formed between adjacent data lines 204 as described with reference to FIGS. 6B-6D and FIGS. 7B-7D, with or without a dielectric liner 377. The solid dielectric material might be formed in a manner intended to avoid formation of voids. As one example, the first data line might correspond to the data line 204₃ and the second data line might correspond to the data line 204₄. The first portion of the first data line might correspond to that portion of the data line 204₃ adjacent to (which might include in contact with) the dielectric liner 377 that is between the data lines 204₃ and 204₄ as depicted in FIG. 10C, while the first portion of the second data line might correspond to that portion of the data line 204₄ adjacent to (which might include in contact with) the dielectric liner 377 that is between the data lines 204₃ and 204₄ as depicted in FIG. 10C.

At 1205, a dielectric material containing a void might be formed between a second portion of the first data line and a second portion of the second data line. For example, the dielectric 382 might be formed containing voids 384 between adjacent data lines 204 as described with reference to FIGS. 6E-6F and FIGS. 7E-7F. The dielectric material containing a void might be formed in a manner intended to form voids. Continuing with the foregoing example, the second portion of the first data line might correspond to a portion of the data line 204₃ adjacent to (which might include in contact with) the dielectric 382 that is between the data lines 204₃ and 204₄ as depicted in FIG. 10C (e.g., either to the left or to the right of the dielectric 396 in the figure), while the second portion of the second data line might correspond to a portion of the data line 204₄ adjacent to (which might include in contact with) the dielectric 382 that is between the data lines 204₃ and 204₄ as depicted in FIG. 10C (e.g., either to the left or to the right of the dielectric 396 in the figure).

At 1207, a top contact might be formed overlying and in contact with the first portion of the first data line. For example, the a top contact 380 might be formed as described with reference to FIGS. 6G-6I and FIGS. 7G-7I. Continuing with the foregoing example, the top contact 380₃ might be formed overlying the data line 204₃ in the portion adjacent an instance of the dielectric 396. The top contact 380₃ might be in contact with the data line 204₃.

Embodiments described herein facilitate a top contact 380 of sufficient size to be utilized with wafer-on-wafer (WOW) technology. In WOW technology, portions of an integrated circuit device might be formed on different substrates, e.g., support or carrier wafers. These substrates might include semiconductor substrates or dielectric substrates, for example. As one example, relevant to the present disclosure, a memory array and supporting structures might be formed on one substrate, and access circuitry for connection to the supporting structures might be formed on a different substrate. These structures might then be joined, e.g., bonded, to connect these different portions of an integrated circuit device, with a contact from one portion making a connection to a contact from the other portion. Continuing with the example, a top contact 380 of one portion of a memory formed overlying a first substrate might be bonded to a contact from a different portion of the memory, e.g., a contact to access circuitry of the memory in this example, formed overlying a second substrate distinct from the first substrate. WOW technology might further permit subsequent removal of one of the substrates, providing access for further fabrication on the resulting exposed portion of the integrated circuit device. Although outside the scope of this disclosure, such processing is described in U.S. Patent Application Publication No. US 2021/0398996 A1 to Kunal R. Parekh, published Dec. 23, 2021.

Figure 13A:
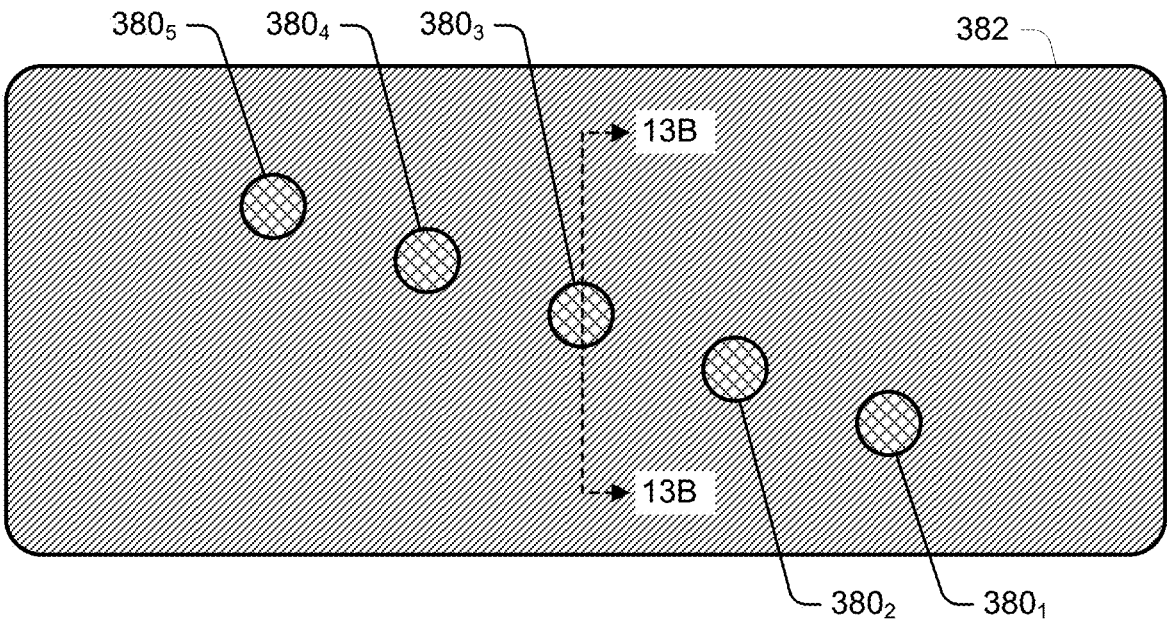
FIGS. 13A and 13B depict a top view and a cross-sectional view, respectively, of a memory array structure in accordance with an embodiment.
Figure 13B:
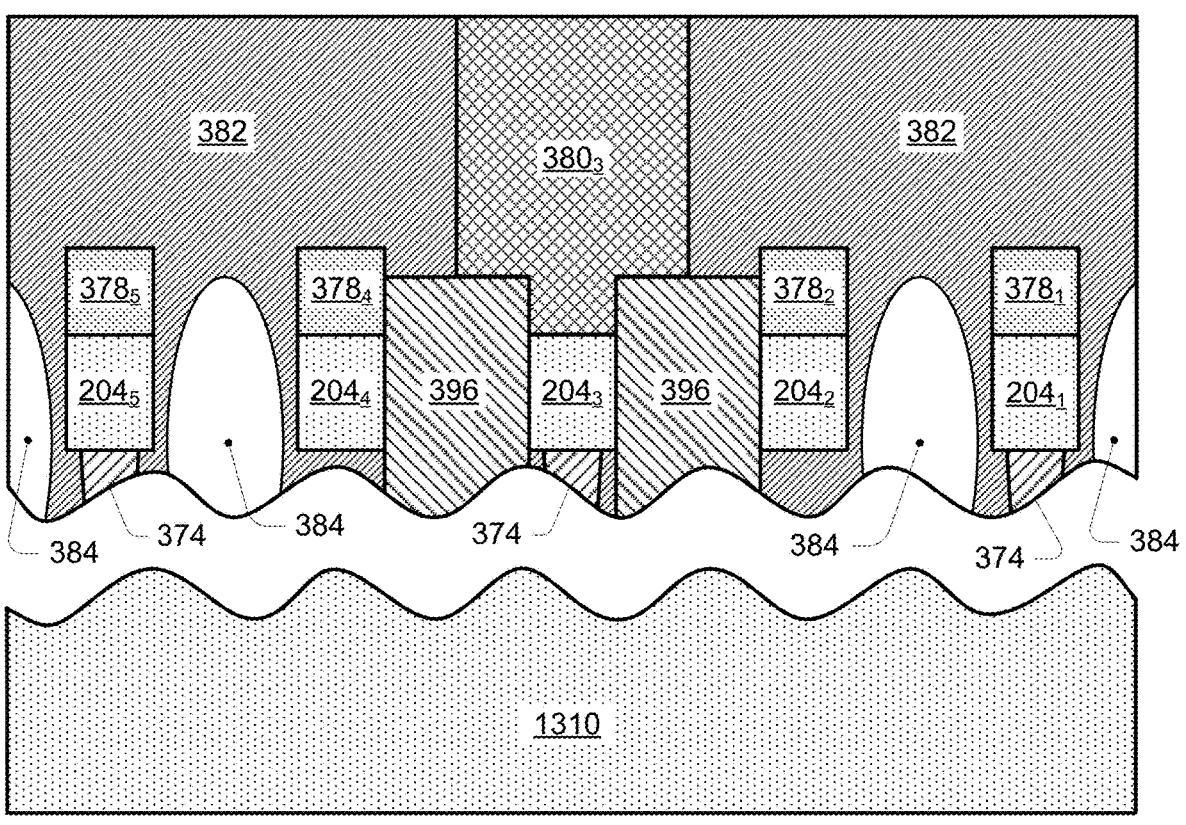

FIGS. 13A and 13B depict a top view and a cross-sectional view, respectively, of a memory array structure in accordance with an embodiment. The view of FIG. 13B might be taken along line 13B-13B of FIG. 13A. The view of FIG. 13A might correspond to the memory array structure of FIG. 6I, while the view of FIG. 13B might generally correspond to the memory array structure of FIG. 7I, but further depicting that the structure of FIG. 7I might be formed overlying a first substrate 1310, and depicting an embodiment without a dielectric liner 377. The details of structures extending between the top contacts 380 and the first substrate 1310, e.g., the portion conceptually depicted as wavy space in FIG. 13B, are not relevant to the present disclosure beyond that which has already been disclosed. Like numbered elements in FIGS. 13A-13B correspond to the description as provided with respect to FIGS. 6A-6I and 7A-7I.

Figure 14A:
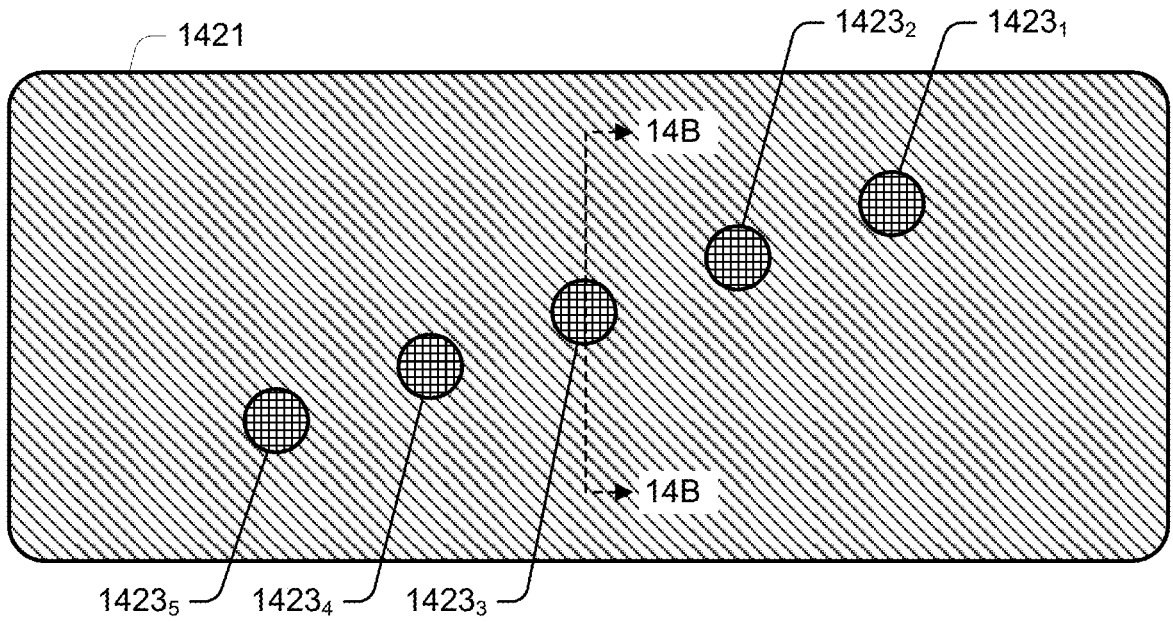
FIGS. 14A and 14B depict a top view and a cross-sectional view, respectively, of an integrated circuit structure in accordance with an embodiment.
Figure 14B:
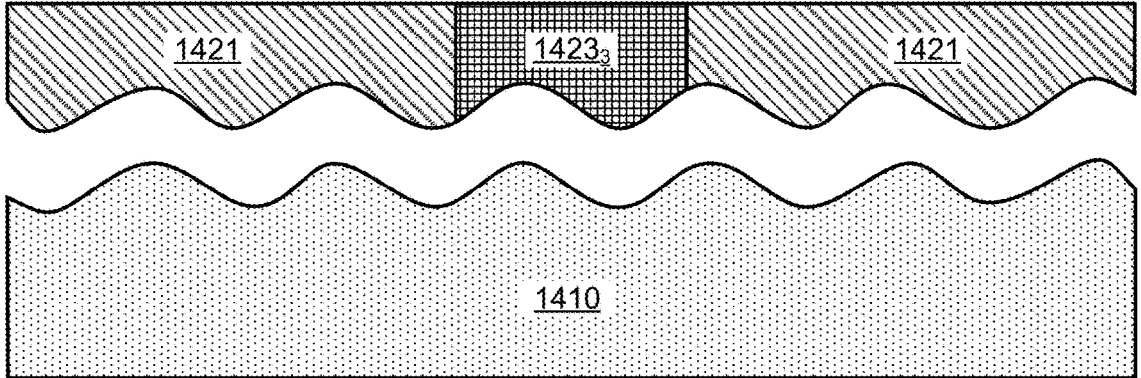

FIGS. 14A and 14B depict a top view and a cross-sectional view, respectively, of an integrated circuit structure in accordance with an embodiment. The view of FIG. 14B might be taken along line 14B-14B of FIG. 14A. In FIGS. 14A-14B, contacts 1423, e.g., contacts 1423₁-1423₅, might be formed in a dielectric 1421. The contacts 1423 and dielectric 1421 might be formed overlying a second substrate 1410. The details of structures extending between the contacts 1423 and the second substrate 1410, e.g., the portion conceptually depicted as wavy space in FIG. 14B, are not relevant to the present disclosure.

The contacts 1423₁-1423₅ might be arranged such that when the structure of FIGS. 13A-13B, e.g., including contacts 380 providing connection to portions of a memory array, is bonded to the structure of Figured 14A-14B, e.g., including contacts 1423 providing connection to access circuitry, each contact 1423₁-1423₅ would be expected to be connected to its corresponding contact 380₁-380₅, respectively. The access circuitry might include a buffer portion 240 of a page buffer, e.g., data register 120/cache register 118, of a memory 100.

Figure 15:
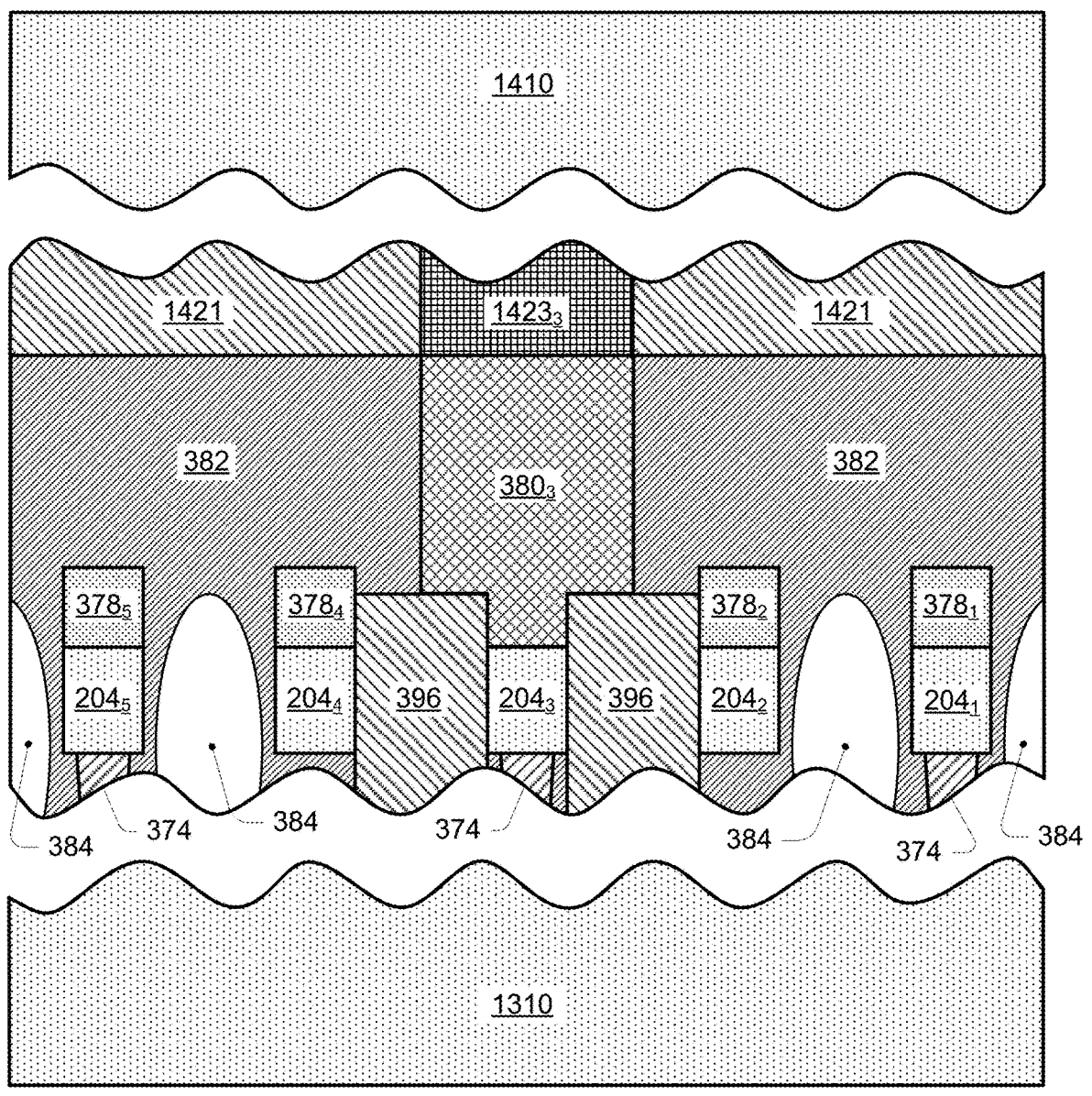
FIG. 15 depicts a cross-sectional view of a combination of the memory array structure of FIGS. 13A-13B and the integrated circuit structure of FIGS. 14A-14B in accordance with an embodiment.

FIG. 15 depicts a cross-sectional view of a combination of the memory array structure of FIGS. 13A-13B and the integrated circuit structure of FIGS. 14A-14B in accordance with an embodiment, e.g., resulting from bonding of the structure of FIGS. 13A-13B to the integrated circuit structure of FIGS. 14A-14B in a WOW configuration. FIG. 15 depicts a bonding of the memory array structure of FIGS. 13A-13B and the integrated circuit structure of FIGS. 14A-14B that might place each contact 1423₁-1423₅ in connection with its corresponding contact 380₁-380₅, respectively. As depicted in FIG. 15, and disclosed with reference to FIGS. 14A-14B, the data line 204₃ might be connected to access circuitry (e.g., a buffer portion 240) through its corresponding top contact 380₃ and its resulting connection to contact 1423₃.

CONCLUSION

Although specific embodiments have been illustrated and described herein, it will be appreciated by those of ordinary skill in the art that any arrangement that is calculated to achieve the same purpose might be substituted for the specific embodiments shown. Many adaptations of the embodiments will be apparent to those of ordinary skill in the art. Accordingly, this application is intended to cover any adaptations or variations of the embodiments.

What is claimed is:

1. A memory array structure, comprising:
a first data line selectively connected to a first plurality of memory cells;
a second data line selectively connected to a second plurality of memory cells;
a solid first dielectric extending between a first portion of the first data line and a first portion of the second data line;
a second dielectric containing a void extending between a second portion of the first data line and a second portion of the second data line; and
a top contact overlying and in electrical contact with the first portion of the first data line;
wherein a plane extending through the first data line along a length of the first data line and extending through the second data line along a length of the second data line would further extend through the solid first dielectric and extend through the void of the second dielectric.

2. The memory array structure of claim 1, wherein the solid first dielectric contains a different dielectric material than the second dielectric.

3. The memory array structure of claim 1, wherein the void is a first void, wherein the solid first dielectric is a first instance of the solid first dielectric, and wherein the memory array structure further comprises:
a third data line selectively connected to a third plurality of memory cells; and
a second instance of the solid first dielectric extending between the first portion of the first data line and a first portion of the third data line;
wherein the second dielectric further contains a second void extending between the second portion of the first data line and a second portion of the third data line;
wherein the plane would further extend through the second instance of the solid first dielectric and extend through the second void of the second dielectric.

4. The memory array structure of claim 3, wherein the second dielectric further contains a third void extending between a third portion of the first data line and a third portion of the second data line, and a fourth void extending between the third portion of the first data line and a third portion of the third data line, wherein the first portion of the first data line is between the second portion of the first data line and the third portion of the first data line, and wherein the plane would further extend through the third void of the second dielectric and extend through the fourth void of the second dielectric.

5. The memory array structure of claim 1, wherein the top contact overlies less than all of the first portion of the first data line.

6. The memory array structure of claim 5, wherein no portion of the top contact overlies the second data line.

7. The memory array structure of claim 1, wherein the solid first dielectric extends a full width of a spacing between the first portion of the first data line and the first portion of the second data line.

8. The memory array structure of claim 1, wherein the solid first dielectric extends above uppermost surfaces of the first portion of the first data line and the first portion of the second data line, and extends below bottommost surfaces of the first portion of the first data line and the first portion of the second data line.

9. The memory array structure of claim 1, wherein the void is a first void, wherein the second dielectric further contains a second void extending between a third portion of the first data line and a third portion of the second data line, wherein the first portion of the first data line is between the second portion of the first data line and the third portion of the first data line, wherein the first portion of the second data line is between the second portion of the second data line and the third portion of the second data line, and wherein the plane would further extend through the second void of the second dielectric.

10. A memory array structure, comprising:
a first data line overlying and connected to a plurality of first contacts, wherein each first contact of the plurality of first contacts is overlying and selectively connected to a respective string of series-connected memory cells of an array of memory cells;
a second data line overlying and connected to a plurality of second contacts, wherein each second contact of the plurality of second contacts is overlying and selectively connected to a respective string of series-connected memory cells of the array of memory cells;
a third data line overlying and connected to a plurality of third contacts, wherein each third contact of the plurality of third contacts is overlying and selectively connected to a respective string of series-connected memory cells of the array of memory cells;
a first instance of a solid first dielectric extending between a first portion of the first data line and a first portion of the second data line;
a second instance of the solid first dielectric extending between a second portion of the first data line and a second portion of the second data line;
a third instance of the solid first dielectric extending between the second portion of the second data line and a first portion of the third data line;
a second dielectric containing a first void extending between a third portion of the first data line and a third portion of the second data line, and containing a second void extending between a fourth portion of the second data line and a second portion of the third data line;
a fourth contact overlying and in electrical contact with the first portion of the first data line; and
a fifth contact overlying and in electrical contact with the second portion of the second data line;
wherein the first instance of the solid first dielectric, the second instance of the solid first dielectric, and the third instance of the solid first dielectric each further extend from a first level underlying bottommost surfaces of the first data line, the second data line, and the third data line to a second level overlying the bottommost surfaces of the first data line, the second data line, and the third data line; and
wherein the first void and the second void of the second dielectric each further extend from the first level to the second level.

11. The memory array structure of claim 10, further comprising:
a fourth data line overlying and connected to a plurality of sixth contacts, wherein each sixth contact of the plurality of sixth contacts is selectively connected to a respective string of series-connected memory cells of the array of memory cells;
a fourth instance of the solid first dielectric extending between the first portion of the first data line and a first portion of the fourth data line;

wherein the second dielectric further contains a third void extending between the third portion of the first data line and a second portion of the fourth data line;

wherein the fourth instance of the solid first dielectric further extends from the first level to the second level, and wherein the third void of the second dielectric further extends from the first level to the second level.

12. The memory array structure of claim 10, further comprising:

a fourth instance of the solid first dielectric extending between a fifth portion of the second data line and a third portion of the third data line;

wherein the fourth instance of the solid first dielectric further extends from the first level to the second level.

13. The memory array structure of claim 12, wherein the second void is between the third instance of the solid first dielectric and the fourth instance of the solid first dielectric.

14. The memory array structure of claim 12, wherein the third instance of the solid first dielectric and the fourth instance of the solid first dielectric are a same instance of the solid first dielectric.

15. A memory, comprising:

an array of memory cells;

a first data line selectively connected to a first plurality of memory cells of the array of memory cells;

a second data line selectively connected to a second plurality of memory cells of the array of memory cells;

a third data line selectively connected to a third plurality of memory cells of the array of memory cells;

a first instance of a solid first dielectric extending between a first portion of the first data line and a first portion of the second data line, wherein the first instance of the solid first dielectric is in contact with a first sidewall of the first portion of the first data line from a level of a bottommost surface of the first data line to a level above the bottommost surface of the first data line and is in contact with a first sidewall of the first portion of the second data line from a level of a bottommost surface of the second data line to the level above the bottommost surface of the first data line;

a second instance of the solid first dielectric extending between the first portion of the first data line and a first portion of the third data line, wherein the second instance of the solid first dielectric is in contact with a second sidewall of the first portion of the first data line from the level of the bottommost surface of the first data line to the level above the bottommost surface of the first data line and is in contact with a first sidewall of the first portion of the third data line from a level of a bottommost surface of the third data line to the level above the bottommost surface of the first data line;

a second dielectric containing a first void extending between a second portion of the first data line and a second portion of the second data line, a second void extending between the second portion of the first data line and a second portion of the third data line, a third void extending between a third portion of the first data line and a third portion of the second data line, and a fourth void extending between the third portion of the first data line and a third portion of the third data line, wherein the first void, the second void, the third void, and the fourth void each extend from the level of the bottommost surface of the first data line to the level above the bottommost surface of the first data line;

a top contact overlying and in electrical contact with the first portion of the first data line; and a controller for access of the array of memory cells.

16. The memory of claim 15, wherein the top contact is a first top contact, and wherein the memory further comprises:

a fourth data line selectively connected to a fourth plurality of memory cells of the array of memory cells;

a third instance of the solid first dielectric extending between a fourth portion of the first data line and a fourth portion of the third data line, wherein the third instance of the solid first dielectric is in contact with a first sidewall of the fourth portion of the first data line from the level of the bottommost surface of the first data line to the level above the bottommost surface of the first data line and is in contact with a first sidewall of the fourth portion of the third data line from the level of the bottommost surface of the third data line to the level above the bottommost surface of the first data line;

a fourth instance of the solid first dielectric extending between the fourth portion of the third data line and a first portion of the fourth data line; and a second top contact overlying and in electrical contact with the fourth portion of the third data line;

wherein the second dielectric further contains a fifth void extending between a fifth portion of the first data line and a fifth portion of the third data line, a sixth void extending between the fifth portion of the third data line and a second portion of the fourth data line, and a seventh void extending between a sixth portion of the third data line and a third portion of the fourth data line.

17. The memory of claim 15, wherein the top contact is a first top contact, and wherein the memory further comprises:

a fourth data line selectively connected to a fourth plurality of memory cells of the array of memory cells;

a third instance of the solid first dielectric extending between a fourth portion of the third data line and a first portion of the fourth data line; and a second top contact overlying and in electrical contact with the fourth portion of the third data line;

wherein the second dielectric further contains a fifth void extending between a fifth portion of the third data line and a second portion of the fourth data line, and a sixth void extending between a sixth portion of the third data line and a third portion of the fourth data line.

18. The memory of claim 15, further comprising an additional contact bonded to the top contact in a wafer-on-wafer configuration.

19. The memory of claim 18, wherein the additional contact is configured to provide connection of the top contact to access circuitry of the memory.

20. The memory of claim 19, wherein the access circuitry comprises a buffer portion of the memory.

21. The memory of claim 10, wherein the second level is further overlying uppermost surfaces of the first data line, the second data line, and the third data line.

22. The memory of claim 15, wherein the first instance of the solid first dielectric is in contact with the first sidewall of the first portion of the first data line from the level of the bottommost surface of the first data line to a level of an uppermost surface of the first data line and is in contact with the first sidewall of the first portion of the second data line from the level of the bottommost surface of the second data line to a level of an uppermost surface of the second data line, wherein the second instance of the solid first dielectric is in contact with the second sidewall of the first portion of the first data line from the level of the bottommost surface of the first data line to the level of the uppermost surface of the first data line and is in contact with the first sidewall of the first portion of the third data line from the level of the bottommost surface of the third data line to a level of an uppermost surface of the third data line, and wherein the first void, the second void, the third void, and the fourth void each extend from a level below the bottommost surface of the first data line to a level above the uppermost surface of the first data line.

* * * * *